(12) United States Patent
Yamazaki et al.

(10) Patent No.: US 9,489,988 B2
(45) Date of Patent: Nov. 8, 2016

(54) MEMORY DEVICE

(71) Applicant: Semiconductor Energy Laboratory Co., Ltd., Atsugi-shi, Kanagawa-ken (JP)

(72) Inventors: Shunpei Yamazaki, Tokyo (JP); Kiyoshi Kato, Kanagawa (JP); Takanori Matsuzaki, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/041,435

(22) Filed: Feb. 11, 2016

(65) Prior Publication Data

US 2016/0247548 A1 Aug. 25, 2016

(30) Foreign Application Priority Data

Feb. 20, 2015 (JP) .................................. 2015-031747

(51) Int. Cl.
*G11C 5/10* (2006.01)
(52) U.S. Cl.
CPC ...................................... *G11C 5/10* (2013.01)
(58) Field of Classification Search
USPC .................................................. 365/72, 149
See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Coates.D et al., "Optical Studies of the Amorphous Liquid-Cholesteric Liquid Crystal Transition: The "Blue Phase"", Physics Letters, Sep. 10, 1973, vol. 45A, No. 2, pp. 115-116.

(Continued)

*Primary Examiner* — Hoai V Ho
*Assistant Examiner* — Minh Dinh
(74) *Attorney, Agent, or Firm* — Fish & Richardson P.C.

(57) ABSTRACT

To provide a memory device where multiple pieces of multilevel data can be written and read. The memory device includes first to fifth transistors, first to fourth capacitors, first to fourth nodes, and first and second wirings. The first node is connected to the first capacitor and a gate of the first transistor, the second node is connected to the second capacitor and a gate of the second transistor, the third node is connected to the third capacitor and a gate of the third transistor, and the fourth node is connected to the fourth capacitor and a gate of the fourth transistor. Multiple pieces of multilevel data is written to the first to fourth nodes through the second to fifth transistors. The second to fifth transistors each preferably include an oxide semiconductor in a channel formation region.

21 Claims, 39 Drawing Sheets

(56) References Cited

U.S. PATENT DOCUMENTS

| | | |
|---|---|---|
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,614,916 B2 | 12/2013 | Nagatsuka et al. |
| 8,737,109 B2 * | 5/2014 | Yamazaki ............ G11C 16/02 365/149 |
| 8,913,419 B2 * | 12/2014 | Takemura ............ G11C 7/02 365/149 |
| 9,172,370 B2 * | 10/2015 | Ikeda ............ H03K 19/0016 |
| 9,240,244 B2 | 1/2016 | Nagatsuka et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2015/0263008 A1 | 9/2015 | Atsumi et al. |
| 2015/0263047 A1 | 9/2015 | Kimura et al. |
| 2015/0310906 A1 | 10/2015 | Matsuzaki et al. |
| 2015/0348601 A1 | 12/2015 | Onuki |
| 2015/0348608 A1 | 12/2015 | Matsuzaki |
| 2015/0348610 A1 | 12/2015 | Ishizu |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2012-256400 | 12/2012 |
| JP | 2014-199707 | 10/2014 |
| WO | WO-2004/114391 | 12/2004 |

OTHER PUBLICATIONS

Meiboom.S et al., "Theory of the Blue Phase of Cholesteric Liquid Crystals", Phys. Rev.Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N et al., "Spinel,YbFe2O4, and Yb2Fe3O7 Types of Structures for Compounds in the In2O3 and Sc2O3—A2O3—Bo Systems [A; Fe, Ga, or Al; B: Mg, Mn, Fe, Ni, Cu, or Zn] at Temperatures over 1000° C.", Journal of Solid State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N et al., "Syntheses and Single-Crystal Data of Homologous Compounds, In2O3(ZnO)m (m= 3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Trans-

(56) References Cited

OTHER PUBLICATIONS actions on Electron Devices, Jul. 1, 1995, vol. 42, No. 7, pp. 1240-1246.
Prins.M et al., "A Ferroelectric Transparent Thin-Film Transistor", Appl. Phys. Lett. (Applied Physics Letters), Jun. 17, 1996, vol. 68, No. 25, pp. 3650-3652.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Kikuchi.H et al., "Polymer-Stabilized Liquid Crystal Blue Phases", Nature Materials, Sep. 2, 2002, vol. 1, pp. 64-68.
Tsuda.K et al., "Ultra Low Power Consumption Technologies for Mobile TFT-LCDs", IDW '02 : Proceedings of the 9th International Display Workshops, Dec. 4, 2002, pp. 295-298.
Nomura.K et al., "Thin-Film Transistor Fabricated in Single-Crystalline Transparent Oxide Semiconductor", Science, May 23, 2003, vol. 300, No. 5623, pp. 1269-1272.
Ikeda.T et al., "Full-Functional System Liquid Crystal Display Using CG-Silicon Technology", SID Digest '04 : SID International Symposium Digest of Technical Papers, 2004, vol. 35, pp. 860-863.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.
Lee.H et al., "Current Status of, Challenges to, and Perspective View of AM-OLED ", IDW '06 : Proceedings of the 13th International Display Workshops, Dec. 7, 2006, pp. 663-666.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.
Park.S et al., "Challenge to Future Displays: Transparent AM-OLED Driven by Peald Grown ZnO TFT", IMID '07 Digest, 2007, pp. 1249-1252.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Miyasaka.M, "SUFTLA Flexible Microelectronics on Their Way to Business", SID Digest '07 : SID International Symposium Digest of Technical Papers, 2007, vol. 38, pp. 1673-1676.
Kurokawa.Y et al., "UHF RFCPUS on Flexible and Glass Substrates for Secure RFID Systems", Journal of Soild-State Circuits , 2008, vol. 43, No. 1, pp. 292-299.
Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Park.J et al., "Amorphous Indium—Gallium—Zinc Oxide TFTs and Their Application for Large Size AMOLED", AM-FPD '08 Digest of Technical Papers, Jul. 2, 2008, pp. 275-278.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.
Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.
Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.
Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.
Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.
Osada.T et al., "Development of Driver-Integrated Panel Using Amorphous In—Ga—Zn—Oxide TFT", AM-FPD '09 Digest of Technical Papers, Jul. 1, 2009, pp. 33-36.
Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.
Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Park.J et al., "High performance amorphous oxide thin film transistors with self-aligned top-gate structure", IEDM 09: Technical Digest of International Electron Devices Meeting, Dec. 7, 2009, pp. 191-194.
Nakamura.M, "Synthesis of Homologous Compound with New Long-Period Structure", NIRIM Newsletter, Mar. 1, 1995, vol. 150, pp. 1-4.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Orita.M et al., "Amorphous transparent conductive oxide InGaO3(ZnO)m (m<4):a Zn4s conductor", Philosophical Magazine, 2001, vol. 81, No. 5, pp. 501-515.
Janotti.A et al., "Oxygen Vacancies in ZnO", Appl. Phys. Lett. (Applied Physics Letters), 2005, vol. 87, pp. 122102-1-122102-3.

(56) References Cited

OTHER PUBLICATIONS

Clark.S et al., "First Principles Methods Using CASTEP", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amophous GIZO (Ga2O3—In2O3—ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

\* cited by examiner

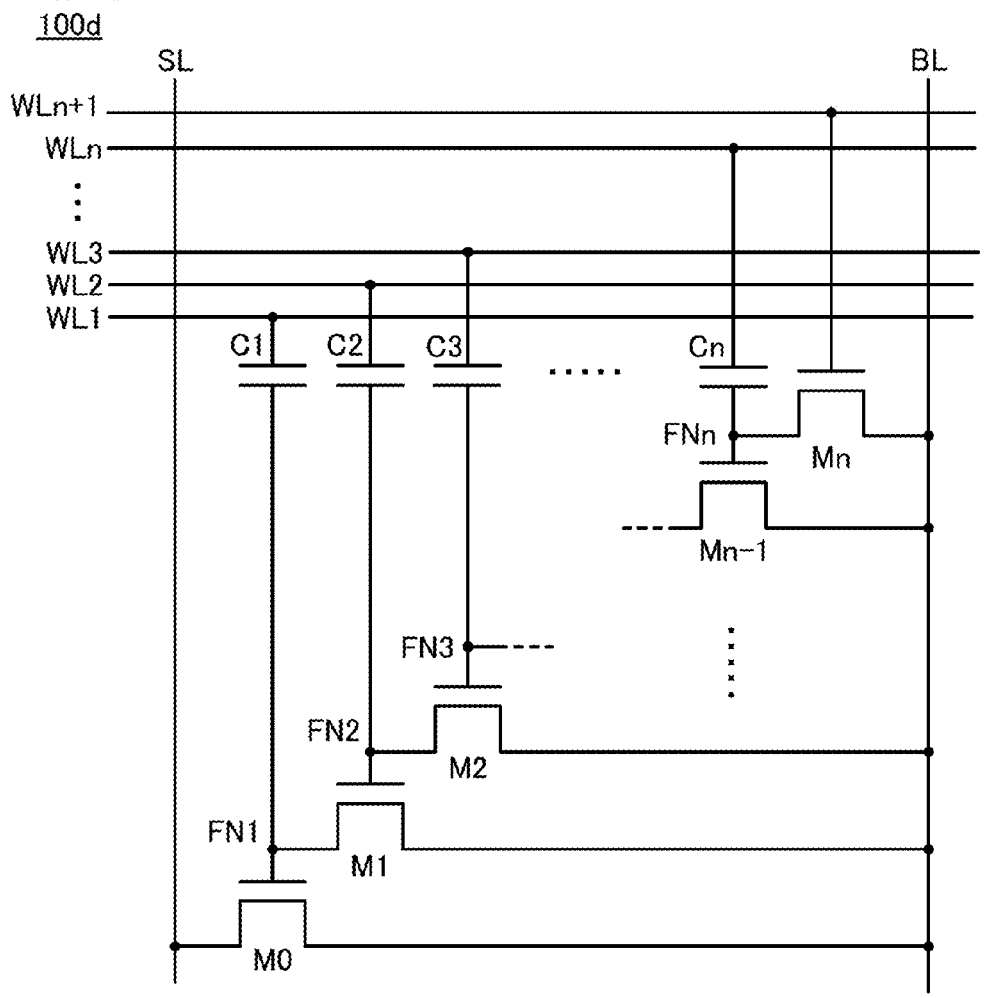

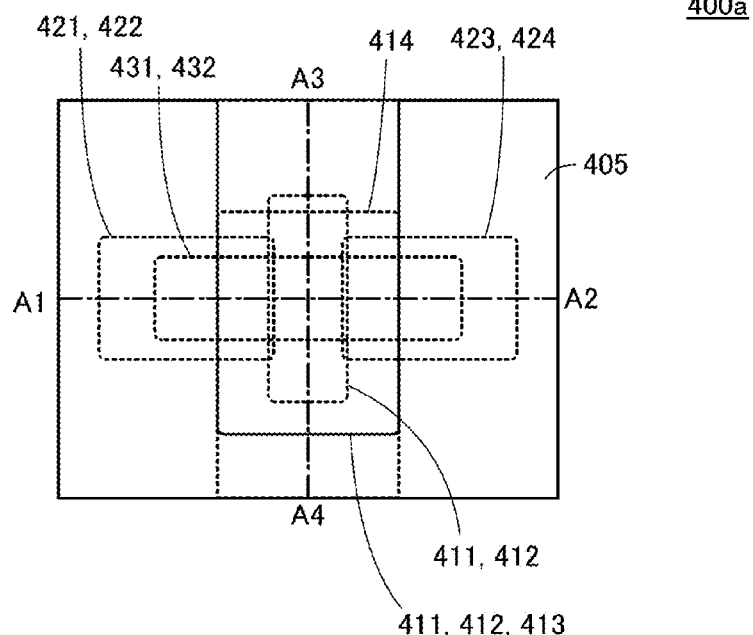
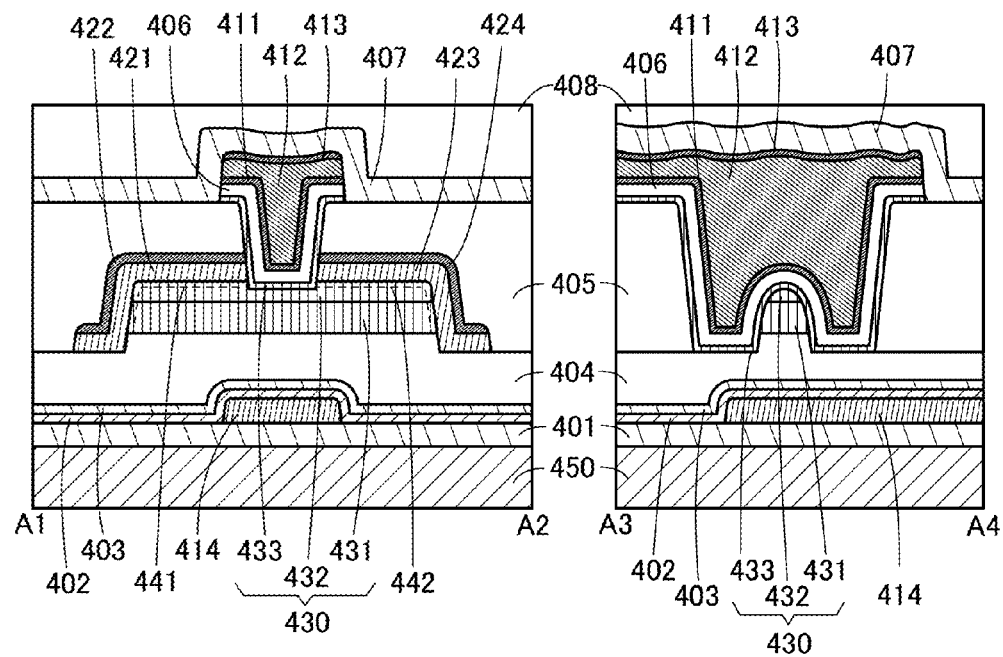

680

680

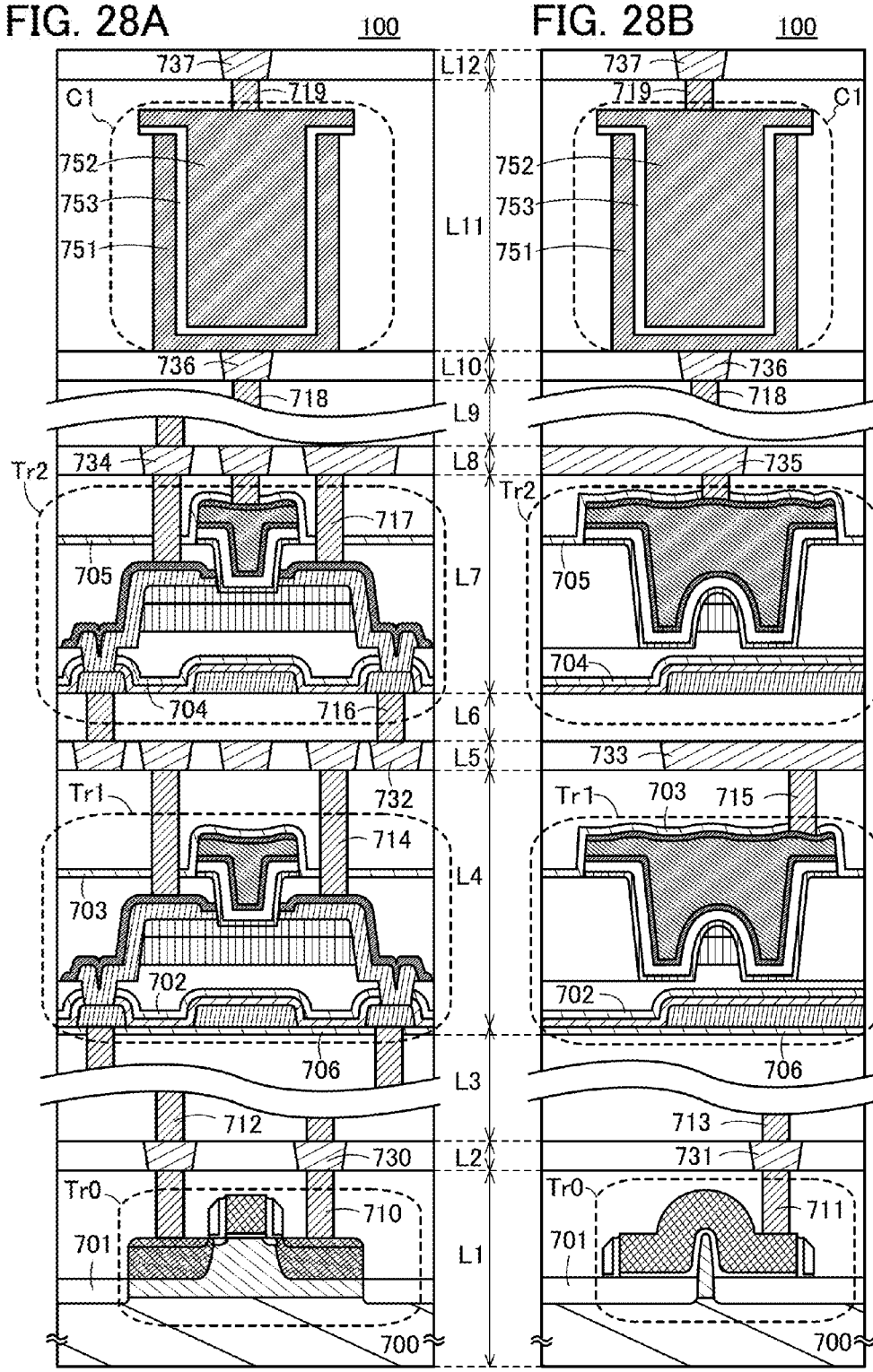

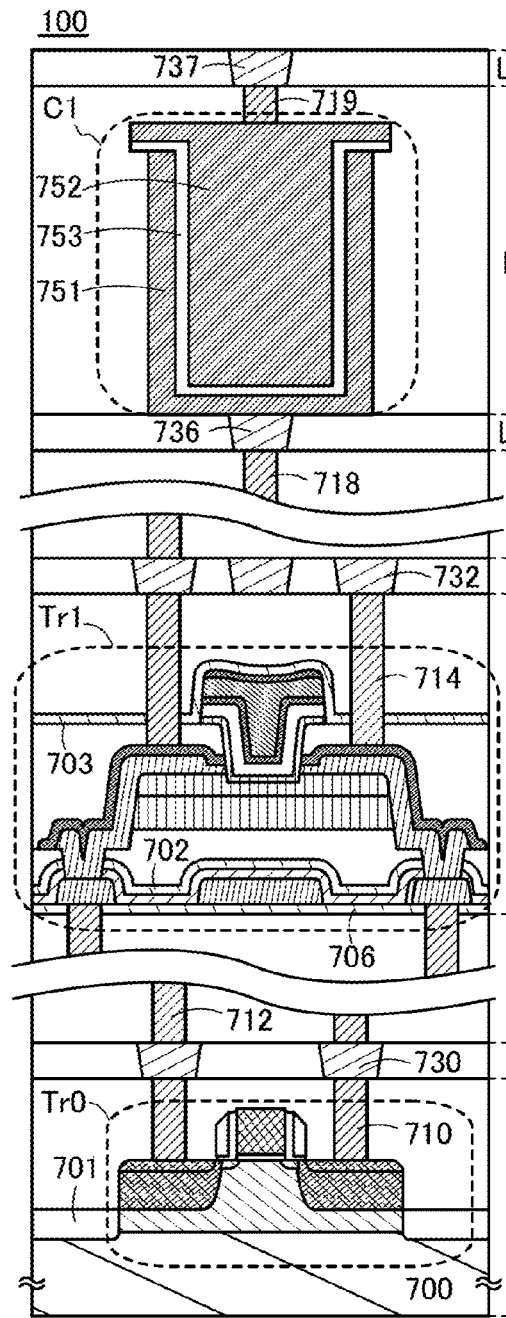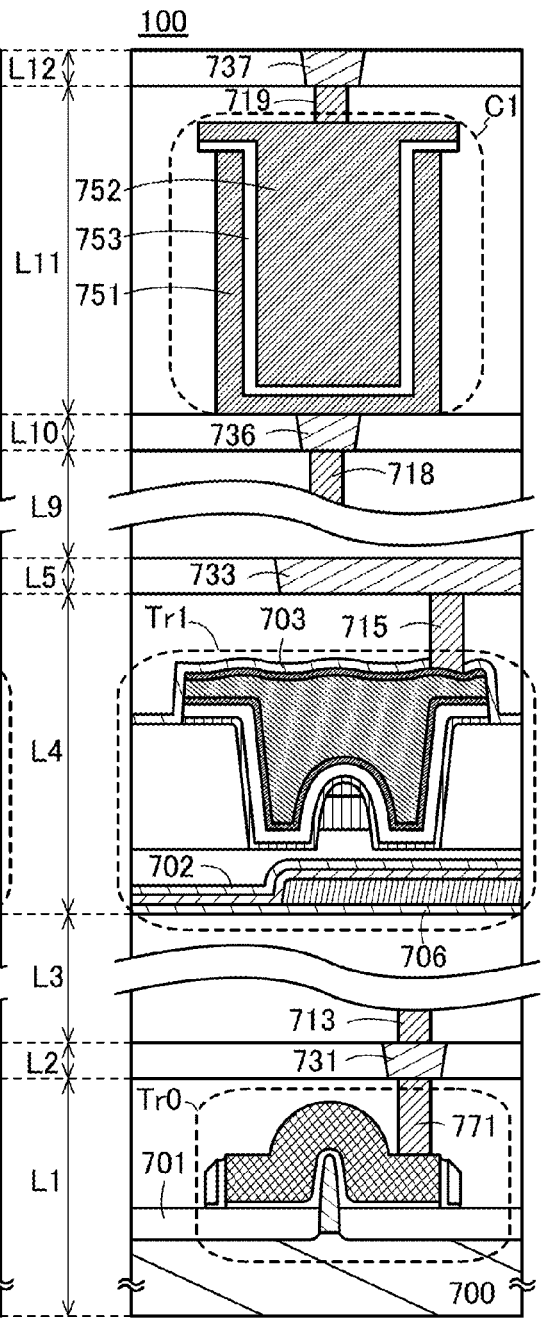

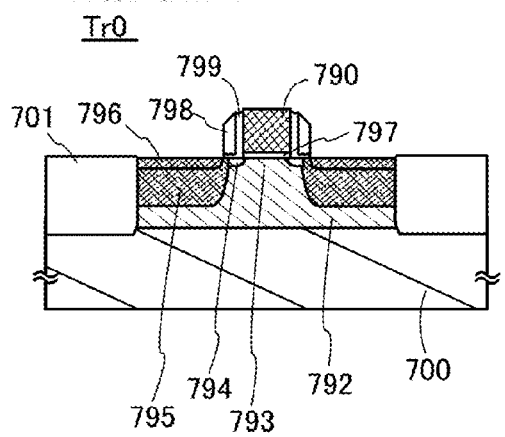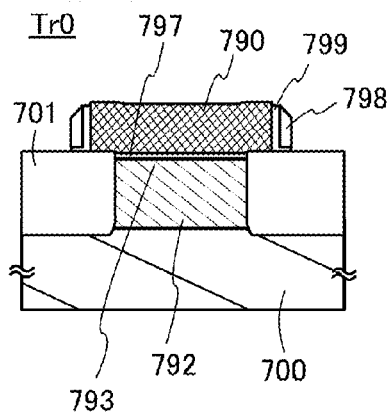

FIG. 36A
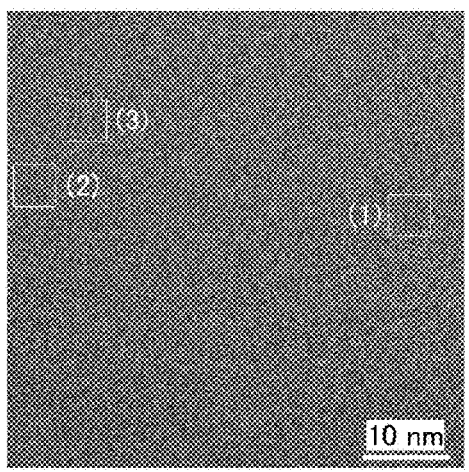
FIG. 36B  FIG. 36C  FIG. 36D
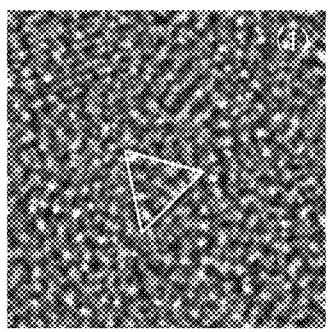 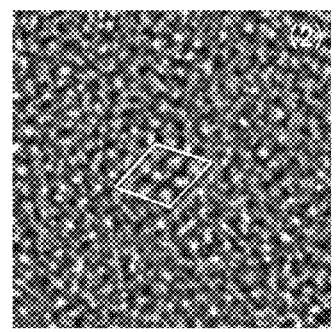 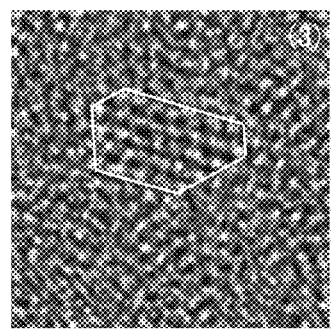

Electron beam incident in direction parallel to sample surface

Electron beam incident in direction perpendicular to sample surface

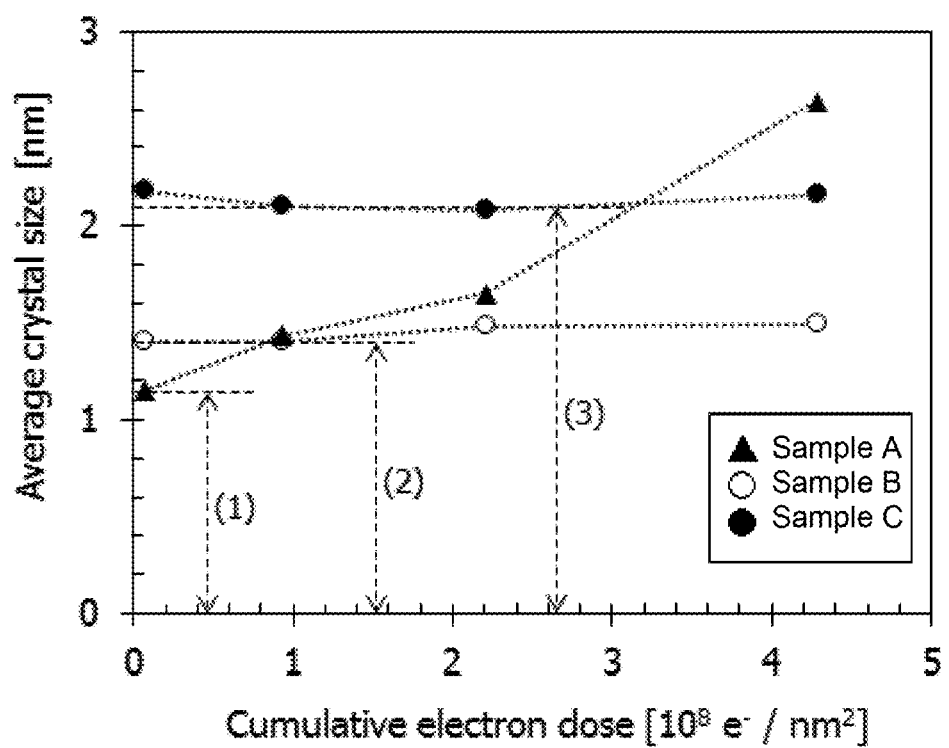

MEMORY DEVICE

BACKGROUND OF THE INVENTION

1. Field of the Invention

The present invention relates to a memory device.

The present invention relates to an object, a method, or a manufacturing method. In addition, the present invention relates to a process, a machine, manufacture, or a composition of matter. One embodiment of the present invention relates to a semiconductor device, a display device, a light-emitting device, a power storage device, a memory device, a driving method thereof, or a manufacturing method thereof. In particular, one embodiment of the present invention relates to a semiconductor device, a display device, or a light-emitting device each including an oxide semiconductor.

In this specification and the like, a semiconductor device generally means a device that can function by utilizing semiconductor characteristics. A display device, an electro-optical device, a semiconductor circuit, and an electronic device include a semiconductor device in some cases.

2. Description of the Related Art

A memory device capable of retaining data that has attracted attention includes a combination of a transistor using silicon (Si) for a semiconductor layer and a transistor using an oxide semiconductor (OS) for a semiconductor layer (hereinafter referred to as an OS transistor) (see Patent Documents 1 and 2).

A recent increase in the amount of data manipulated requires a memory device having high storage capacity. In this situation, Patent Documents 1 and 2 disclose memory devices where multilevel data is stored and read.

Note that in this specification, multilevel data means 2-bit ($2^2=4$ levels) or more data.

REFERENCES

Patent Documents

[Patent Document 1] Japanese Published Patent Application No. 2012-256400
[Patent Document 2] Japanese Published Patent Application No. 2014-199707

SUMMARY OF THE INVENTION

For example, in the memory devices disclosed in Patent Documents 1 and 2, multilevel data is written to one retention node. In these memory devices, the difference between potentials corresponding to different levels of data becomes small as the number of bits of multilevel data increases, which makes it difficult to determine a potential in reading data; as a result, an incorrect value might be read. In addition, multiple pieces of multilevel data cannot be written simultaneously because there is only one retention node.

An object of one embodiment of the present invention is to provide a memory device where multiple pieces of multilevel data can be written and read. Another object of one embodiment of the present invention is to provide a novel memory device. Still another object of one embodiment of the present invention is to provide a novel semiconductor device.

Note that the description of a plurality of objects does not mutually preclude the existence. One embodiment of the present invention does not necessarily achieve all the objects listed above. Objects other than those listed above are apparent from the description of the specification, drawings, and claims, and also such objects could be an object of one embodiment of the present invention.

One embodiment of the present invention is a memory device including first to fifth transistors, first to fourth capacitors, first to fourth nodes, and first and second wirings. The first node is electrically connected to a first terminal of the first capacitor and a gate of the first transistor. The second node is electrically connected to a first terminal of the second capacitor and a gate of the second transistor. The third node is electrically connected to a first terminal of the third capacitor and a gate of the third transistor. The fourth node is electrically connected to a first terminal of the fourth capacitor and a gate of the fourth transistor. The first transistor is configured to control conduction or non-conduction between the first wiring and the second wiring. The second transistor is configured to control conduction or non-conduction between the first node and the second wiring. The third transistor is configured to control conduction or non-conduction between the second node and the second wiring. The fourth transistor is configured to control conduction or non-conduction between the third node and the second wiring. The fifth transistor is configured to control conduction or non-conduction between the fourth node and the second wiring. The first node is configured to retain J-bit (J is an integer of 1 or more) data. The second node is configured to retain K-bit (K is an integer of 1 or more) data. The third node is configured to retain L-bit (L is an integer of 1 or more) data. The fourth node is configured to retain M-bit (M is an integer of 1 or more) data. The second to fifth transistors each preferably include an oxide semiconductor in a channel formation region.

One embodiment of the present invention is a memory device including a memory cell, first to fourth memory circuits, and first and second wirings. The memory cell includes first to fifth transistors, first to fourth capacitors, and first to fourth nodes. The first node is electrically connected to a first terminal of the first capacitor and a gate of the first transistor. The second node is electrically connected to a first terminal of the second capacitor and a gate of the second transistor. The third node is electrically connected to a first terminal of the third capacitor and a gate of the third transistor. The fourth node is electrically connected to a first terminal of the fourth capacitor and a gate of the fourth transistor. The first transistor is configured to control conduction or non-conduction between the first wiring and the second wiring. The second transistor is configured to control conduction or non-conduction between the first node and the second wiring. The third transistor is configured to control conduction or non-conduction between the second node and the second wiring. The fourth transistor is configured to control conduction or non-conduction between the third node and the second wiring. The fifth transistor is configured to control conduction or non-conduction between the fourth node and the second wiring. The first node is configured to retain J-bit is an integer of 1 or more) first data. The second node is configured to retain K-bit (K is an integer of 1 or more) second data. The third node is configured to retain L-bit (L is an integer of 1 or more) third data. The fourth node is configured to retain M-bit (M is an integer of 1 or more) fourth data. The second to fifth transistors each preferably include an oxide semiconductor in a channel formation region. The first to fourth memory circuits are electrically connected to the first wiring. The first to fourth memory circuits are electrically connected to the second wiring. The first memory circuit is configured to store the first data. The second memory circuit is configured to store the second data. The third memory circuit is configured to store the third data. The fourth memory circuit is configured to store the fourth data.

In the above embodiment, any one of the first to fourth memory circuits preferably includes sixth and seventh transistors, a fifth capacitor, and a fifth node. The fifth node is electrically connected to a first terminal of the fifth capacitor and a gate of the sixth transistor. The sixth transistor is configured to control conduction or non-conduction between the first wiring and the second wiring. The seventh transistor is configured to control conduction or non-conduction between the fifth node and the second wiring. The fifth node is configured to retain any of the first to fourth data. The seventh transistor preferably includes an oxide semiconductor in a channel formation region.

In the above embodiments, a first layer, a second layer over the first layer, a third layer over the second layer, and a fourth layer over the third layer are preferably provided. The first transistor is provided in the first layer. The second to fifth transistors are provided in the second or third layer. The first to fourth capacitors are provided in the fourth layer. The first transistor preferably includes silicon in a channel formation region.

One embodiment of the present invention is a memory device including first to fourth transistors, first to third capacitors, first to third nodes, and first and second wirings. The first node is electrically connected to a first terminal of the first capacitor and a gate of the first transistor. The second node is electrically connected to a first terminal of the second capacitor and a gate of the second transistor. The third node is electrically connected to a first terminal of the third capacitor and a gate of the third transistor. The first transistor is configured to control conduction or non-conduction between the first wiring and the second wiring. The second transistor is configured to control conduction or non-conduction between the first node and the second wiring. The third transistor is configured to control conduction or non-conduction between the second node and the second wiring. The fourth transistor is configured to control conduction or non-conduction between the third node and the second wiring. The first node is configured to retain J-bit is an integer of 1 or more) data. The second node is configured to retain K-bit (K is an integer of 1 or more) data. The third node is configured to retain L-bit (L is an integer of 1 or more) data. The second to fourth transistors each preferably include an oxide semiconductor in a channel formation region.

One embodiment of the present invention is a memory device including a memory cell, first to third memory circuits, and first and second wirings. The memory cell includes first to fourth transistors, first to third capacitors, and first to third nodes. The first node is electrically connected to a first terminal of the first capacitor and a gate of the first transistor. The second node is electrically connected to a first terminal of the second capacitor and a gate of the second transistor. The third node is electrically connected to a first terminal of the third capacitor and a gate of the third transistor. The first transistor is configured to control conduction or non-conduction between the first wiring and the second wiring. The second transistor is configured to control conduction or non-conduction between the first node and the second wiring. The third transistor is configured to control conduction or non-conduction between the second node and the second wiring. The fourth transistor is configured to control conduction or non-conduction between the third node and the second wiring. The first node is configured to retain J-bit is an integer of 1 or more) first data. The second node is configured to retain K-bit (K is an integer of 1 or more) second data. The third node is configured to retain L-bit (L is an integer of 1 or more) third data. The second to fourth transistors each preferably include an oxide semiconductor in a channel formation region. The first to third memory circuits are electrically connected to the first wiring. The first to third memory circuits are electrically connected to the second wiring. The first memory circuit is configured to store the first data. The second memory circuit is configured to store the second data. The third memory circuit is configured to store the third data.

In the above embodiment, any one of the first to third memory circuits preferably includes fifth and sixth transistors, a fourth capacitor, and a fourth node. The fourth node is electrically connected to a first terminal of the fourth capacitor and a gate of the fifth transistor. The fifth transistor is configured to control conduction or non-conduction between the first wiring and the second wiring. The sixth transistor is configured to control conduction or non-conduction between the fourth node and the second wiring. The fourth node is configured to retain any of the first to third data. The fifth transistor preferably includes an oxide semiconductor in a channel formation region.

In the above embodiments, a first layer, a second layer over the first layer, a third layer over the second layer, and a fourth layer over the third layer are preferably provided. The first transistor is provided in the first layer. The second to fourth transistors are provided in the second or third layer. The first to third capacitors are provided in the fourth layer. The first transistor preferably includes silicon in a channel formation region.

One embodiment of the present invention is a memory device including first to third transistors, first and second capacitors, first and second nodes, and first and second wirings. The first node is electrically connected to a first terminal of the first capacitor and a gate of the first transistor. The second node is electrically connected to a first terminal of the second capacitor and a gate of the second transistor. The first transistor is configured to control conduction or non-conduction between the first wiring and the second wiring. The second transistor is configured to control conduction or non-conduction between the first node and the second wiring. The third transistor is configured to control conduction or non-conduction between the second node and the second wiring. The first node is configured to retain J-bit is an integer of 1 or more) data. The second node is configured to retain K-bit (K is an integer of 1 or more) data. The second and third transistors each preferably include an oxide semiconductor in a channel formation region.

One embodiment of the present invention is a memory device including a memory cell, first and second memory circuits, and first and second wirings. The memory cell includes first to third transistors, first and second capacitors, and first and second nodes. The first node is electrically connected to a first terminal of the first capacitor and a gate of the first transistor. The second node is electrically connected to a first terminal of the second capacitor and a gate of the second transistor. The first transistor is configured to control conduction or non-conduction between the first wiring and the second wiring. The second transistor is configured to control conduction or non-conduction between the first node and the second wiring. The third transistor is configured to control conduction or non-conduction between the second node and the second wiring. The first node is configured to retain J-bit is an integer of 1 or more) first data. The second node is configured to retain K-bit (K is an integer of 1 or more) second data. The second and third transistors each preferably include an oxide semiconductor in a channel formation region. The first and second memory circuits are electrically connected to the first wiring. The first and second memory circuits are electrically connected to the second wiring. The first memory circuit is configured to store the first data. The second memory circuit is configured to store the second data.

In the above embodiment, any one of the first and second memory circuits preferably includes fourth and fifth transistors, a third capacitor, and a third node. The third node is electrically connected to a first terminal of the third capacitor and a gate of the fourth transistor. The fourth transistor is configured to control conduction or non-conduction between the first wiring and the second wiring. The fifth transistor is configured to control conduction or non-conduction between the third node and the second wiring. The third node is configured to retain any of the first and second data. The fifth transistor preferably includes an oxide semiconductor in a channel formation region.

In the above embodiments, a first layer, a second layer over the first layer, a third layer over the second layer, and a fourth layer over the third layer are preferably provided. The first transistor is provided in the first layer. One of the second and third transistors is provided in the second layer. The other of the second and third transistors is provided in the third layer. The first and second capacitors are provided in the fourth layer. The first transistor preferably includes silicon in a channel formation region.

One embodiment of the present invention is an electronic device including the memory device according to any one of the above embodiments, and at least one of a microphone, a speaker, a display portion, and an operation key.

According to one embodiment of the present invention, a memory device where multiple pieces of multilevel data can be written and read can be provided. According to another embodiment of the present invention, a novel memory device can be provided. According to still another embodiment of the present invention, a novel semiconductor device can be provided.

Note that the description of these effects does not exclude the existence of other effects. One embodiment of the present invention does not necessarily achieve all the effects listed above. Effects other than those listed above will be apparent from and can be derived from the description of the specification, the drawings, the claims, and the like.

BRIEF DESCRIPTION OF THE DRAWINGS

In the accompanying drawings:

FIG. 3 is a circuit diagram showing a configuration example of a memory cell;

FIGS. 20A to 20C are a top view and cross-sectional views showing a structure example of a transistor;

FIGS. 28A and 28B are cross-sectional views showing a configuration example of a memory cell;

FIGS. 29A and 29B are cross-sectional views showing a configuration example of a memory cell;

FIGS. 31A and 31B are cross-sectional views showing a structure example of a transistor;

FIGS. 36A to 36D are Cs-corrected high-resolution TEM images of a plane of a CAAC-OS;

FIG. 39 shows a change in crystal part of an In—Ga—Zn oxide induced by electron irradiation.

DETAILED DESCRIPTION OF THE INVENTION

Figure 1:
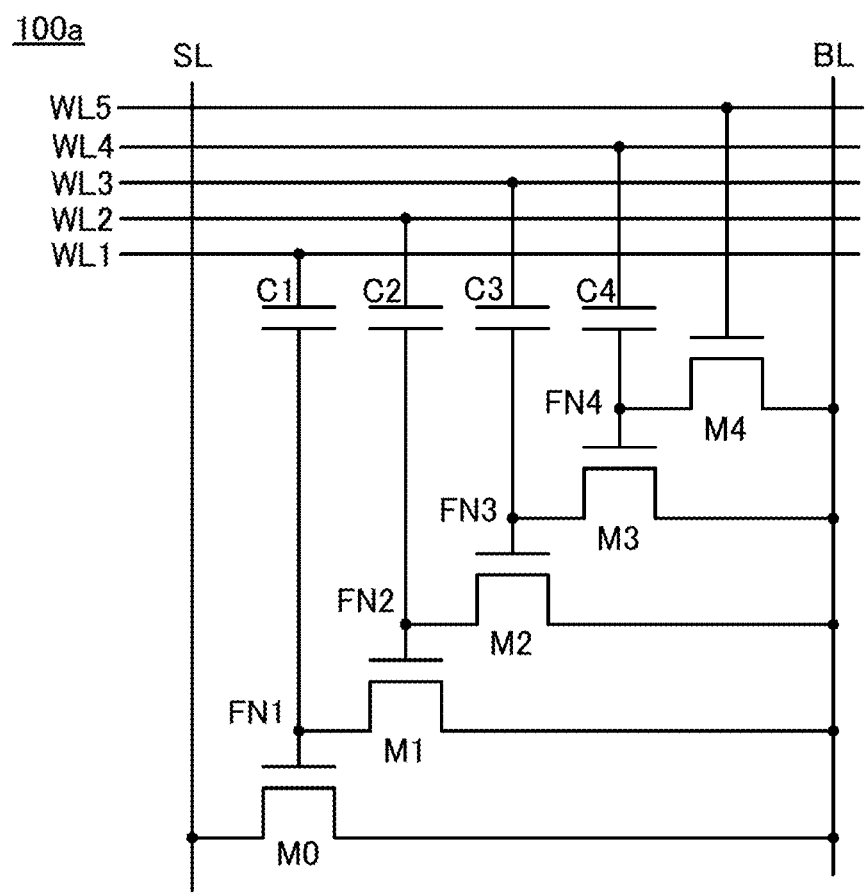
FIG. 1 is a circuit diagram showing a configuration example of a memory cell.

Embodiments will be described below with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments.

Furthermore, in the present specification, any of the embodiments below can be combined as appropriate. In addition, in the case where a plurality of structure examples are given in one embodiment, any of the structure examples can be combined as appropriate.

In the drawings, the size, the layer thickness, or the region is exaggerated for clarity in some cases. Therefore, embodiments of the present invention are not limited to such a scale. Note that the drawings are schematic views showing ideal examples, and embodiments of the present invention are not limited to the shapes or values shown in the drawings.

Unless otherwise specified, on-state current in this specification refers to drain current of a transistor in an on state. Unless otherwise specified, the on state of an n-channel transistor means that a voltage difference (Vgs) between its gate and source is larger than or equal to the threshold voltage (Vth), and the on state of a p-channel transistor means that Vgs is smaller than or equal to Vth. For example, the on-state current of an n-channel transistor sometimes refers to a drain current that flows when Vgs is larger than or equal to Vth. The on-state current of a transistor depends on a drain-source voltage (Vds) in some cases.

Unless otherwise specified, off-state current in this specification refers to drain current of a transistor in an off state. Unless otherwise specified, the off state of an n-channel transistor means that Vgs is smaller than Vth, and the off state of a p-channel transistor means that Vgs is larger than Vth. For example, the off-state current of an n-channel transistor sometimes refers to a drain current that flows when Vgs is smaller than Vth. The off-state current of a transistor depends on Vgs in some cases. Thus, "the off-state current of a transistor is lower than $10^{-21}$ A" sometimes means that there is Vgs at which the off-state current of a transistor is lower than $10^{-21}$ A.

The off-state current of a transistor depends on Vds in some cases. Unless otherwise specified, the off-state current in this specification sometimes refers to an off-state current at Vds with an absolute value of 0.1 V, 0.8 V, 1 V, 1.2 V, 1.8 V, 2.5 V, 3 V, 3.3 V, 10 V, 12 V, 16 V, or 20 V. In other cases, the off-state current of a transistor refers to an off-state current at Vds used in the semiconductor device or the like including the transistor.

Note that in this specification, a high power source voltage and a low power source voltage are sometimes referred to as an H level (or VDD) and an L level (or GND), respectively.

Embodiment 1

In this embodiment, configuration examples of a memory cell of one embodiment of the present invention will be described with reference to FIG. 1 to FIG. 11.

<<Configuration Example 1 of Memory Cell>>

FIG. 1 is a circuit diagram showing a configuration example of a memory cell 100a where multiple pieces of two-level or multilevel data can be written and read.

The memory cell 100a includes a transistor M0, a transistor M1, a transistor M2, a transistor M3, a transistor M4, a capacitor C1, a capacitor C2, a capacitor C3, a capacitor C4, a wiring WL1, a wiring WL2, a wiring WL3, a wiring WL4, a wiring WL5, a node FN1, a node FN2, a node FN3, a node FN4, a wiring SL, and a wiring BL.

The node FN1 is electrically connected to a first terminal of the capacitor C1 and a gate of the transistor M0. The node FN2 is electrically connected to a first terminal of the capacitor C2 and a gate of the transistor M1. The node FN3 is electrically connected to a first terminal of the capacitor C3 and a gate of the transistor M2. The node FN4 is electrically connected to a first terminal of the capacitor C4 and a gate of the transistor M3.

A second terminal of the capacitor C1 is electrically connected to the wiring WL1. A second terminal of the capacitor C2 is electrically connected to the wiring WL2. A second terminal of the capacitor C3 is electrically connected to the wiring WL3. A second terminal of the capacitor C4 is electrically connected to the wiring WL4. A gate of the transistor M4 is electrically connected to the wiring WL5.

The transistor M0 is configured to control conduction or non-conduction between the wiring SL and the wiring BL. The transistor M1 is configured to control conduction or non-conduction between the node FN1 and the wiring BL. The transistor M2 is configured to control conduction or non-conduction between the node FN2 and the wiring BL. The transistor M3 is configured to control conduction or non-conduction between the node FN3 and the wiring BL. The transistor M4 is configured to control conduction or non-conduction between the node FN4 and the wiring BL.

The node FN1 is configured to retain J-bit ($2^J$ levels, J is an integer of 1 or more) first data. The first data includes two-level or multilevel data. The first data is written from the wiring BL to the node FN1 through the transistor M1.

The node FN2 is configured to retain K-bit ($2^K$ levels, K is an integer of 1 or more) second data. The second data includes two-level or multilevel data. The second data is written from the wiring BL to the node FN2 through the transistor M2.

The node FN3 is configured to retain L-bit ($2^L$ levels, L is an integer of 1 or more) third data. The third data includes two-level or multilevel data. The third data is written from the wiring BL to the node FN3 through the transistor M3.

The node FN4 is configured to retain M-bit ($2^M$ levels, M is an integer of 1 or more) fourth data. The fourth data includes two-level or multilevel data. The fourth data is written from the wiring BL to the node FN4 through the transistor M4.

In the memory cell 100a, the data retained at the nodes FN1 to FN4, i.e., (J+K+L+M)-bit ($2^{J+K+L+M}$ levels) data can be retained in total. For example, if 4-bit data is retained at each of the nodes FN1 to FN4, 16-bit data can be retained in the memory cell 100a.

Including the nodes FN1 to FN4, the memory cell 100a is capable of retaining multiple pieces of two-level or multilevel data.

When the transistors M1 to M4 are turned on or off, they are used as a switch for controlling data writing. When the transistors M1 to M4 are maintained off, they are used to hold charges that have been written to the corresponding nodes.

The transistors M1 to M4 preferably have a low current (off-state current) flowing between a source and a drain in the non-conduction state. Here, the low off-state current means a normalized off-state current per micrometer of channel width of lower than or equal to $10 \times 10^{-21}$ A at a source-drain voltage of 3 V and room temperature. Examples of the transistor with a low off-state current include an OS transistor including an oxide semiconductor in a channel formation region and a transistor using a wide band gap semiconductor (with a band gap of 2.2 eV or more) in a channel formation region. The OS transistor is particularly preferably used.

The wiring SL receives a high power source potential or a low power source potential.

The channel resistance of the transistor M0 varies with a potential applied to the node FN1 (the gate of the transistor M0). When a potential difference is produced between the wiring SL and the wiring BL and the current flowing between the wirings SL and BL or the potential of the wiring BL is detected, the potential applied to the node FN1 can be read indirectly.

The transistor M0 may be a transistor including silicon in a channel formation region (hereinafter referred to as a Si transistor). The Si transistor has a high mobility and a high on-state current. The use of the Si transistor as the transistor M0 leads to an increased reading speed of the memory cell 100a.

The transistor M0 may be an OS transistor including an oxide semiconductor in a channel formation region like the transistors M1 to M4. Having a low-off state current, the OS transistor achieves a lower power consumption of the memory cell 100a. In addition, the OS transistor is unlikely to undergo the short-channel effect; therefore, a thick gate insulating film can be formed even in a miniaturized transistor. From this reason, the transistor M0 can have a thick gate insulating film and thus have a low gate leakage, whereby the charge written to the node FN1 can be held for a long time.

<<Configuration Example 2 of Memory Cell>>

Figure 2A:
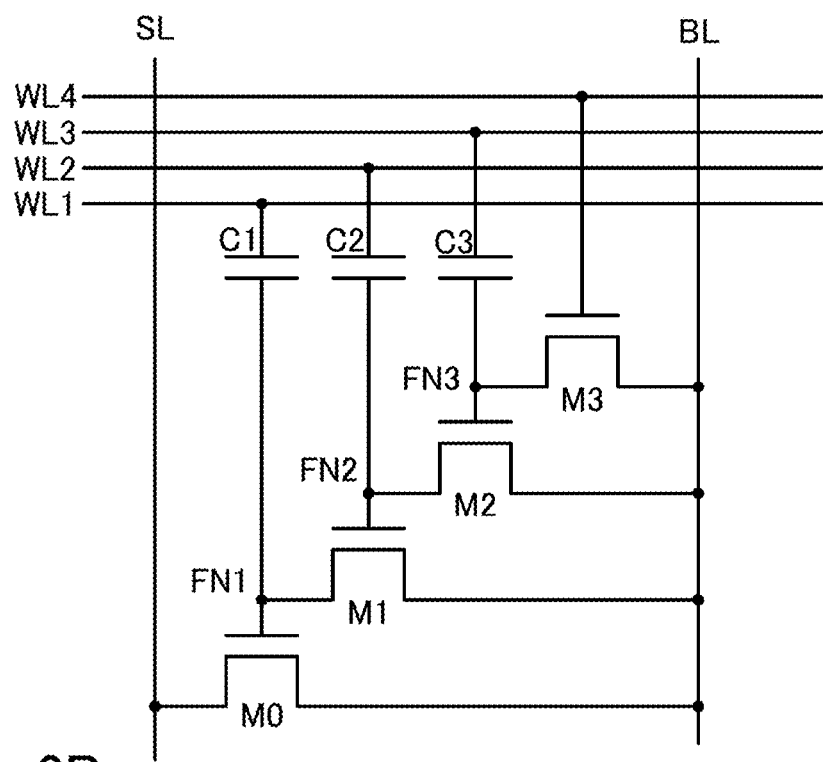
FIGS. 2A and 2B are circuit diagrams each showing a configuration example of a memory cell.

A memory cell 100b shown in FIG. 2A is different from the memory cell 100a in FIG. 1 in that the node FN4, the transistor M4, the capacitor C4, and the wiring WL5 are removed and the gate of the transistor M3 is electrically connected to the wiring WL4.

The description of the memory cell 100a can be referred to for the details of the components.

The memory cell 100b includes the three nodes FN1 to FN3, that is, is configured to retain the first to third data in the memory cell 100a.

In the memory cell 100b, a transistor with a low off-state current is preferably used as the transistors M1 to M3. Examples of the transistor with a low off-state current include an OS transistor including an oxide semiconductor in a channel formation region and a transistor using a wide band gap semiconductor in a channel formation region. The OS transistor is particularly preferably used.

The transistor M0 may be a Si transistor. The use of the Si transistor as the transistor M0 leads to an increased reading speed of the memory cell 100b. Alternatively, an OS transistor may be used as the transistor M0. The use of the OS transistor as the transistor M0 leads to a lower power consumption of the memory cell 100b. In addition, since the transistor M0 can have a thick gate insulating film, the charge written to the node FN1 can be held for a long time.

<<Configuration Example 3 of Memory Cell>>

Figure 2B:
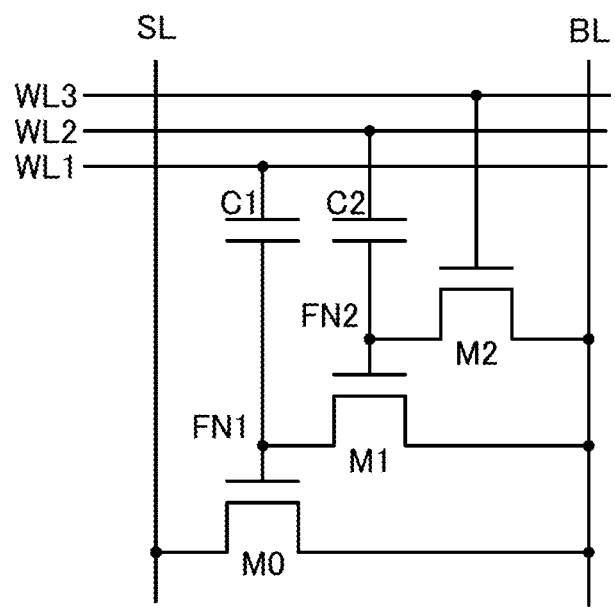

A memory cell 100c shown in FIG. 2B is different from the memory cell 100b in FIG. 2A in that the node FN3, the transistor M3, the capacitor C3, and the wiring WL4 are removed and the gate of the transistor M2 is electrically connected to the wiring WL3.

The description of the memory cell 100a can be referred to for the details of the components.

The memory cell 100c includes the two nodes FN1 and FN2, that is, is configured to retain the first and second data in the memory cell 100a.

In the memory cell 100c, a transistor with a low off-state current is preferably used as the transistors M1 and M2. Examples of the transistor with a low off-state current include an OS transistor including an oxide semiconductor in a channel formation region and a transistor using a wide band gap semiconductor in a channel formation region. The OS transistor is particularly preferably used.

The transistor M0 may be a Si transistor. The use of the Si transistor as the transistor M0 leads to an increased reading speed of the memory cell 100c. Alternatively, an OS transistor may be used as the transistor M0. The use of the OS transistor as the transistor M0 leads to a lower power consumption of the memory cell 100c. In addition, since the transistor M0 can have a thick gate insulating film, the charge written to the node FN1 can be held for a long time.

<<Configuration Example 4 of Memory Cell>>

A memory cell 100d in FIG. 3 shows a generalized configuration example in which the aforementioned memory cells 100a to 100c have n (n is an integer of 2 or more) retention nodes. The memory cell 100d includes the memory cell 100a in FIG. 1, the memory cell 100b in FIG. 2A, and the memory cell 100c in FIG. 2B. FIG. 3 corresponds to the memory cell 100a when n=4; the memory cell 100b when n=3; and the memory cell 100c when n=2.

The description of the memory cell 100a can be referred to for the details of the components.

The memory cell 100d includes n nodes (FN1 to FNn), that is, is configured to retain first to n-th data each of which is two-level or multilevel data.

In the memory cell 100d, a transistor with a low off-state current is preferably used as the transistors M1 to Mn. Examples of the transistor with a low off-state current include an OS transistor including an oxide semiconductor in a channel formation region and a transistor using a wide band gap semiconductor in a channel formation region. The OS transistor is particularly preferably used.

The transistor M0 may be a Si transistor. The use of the Si transistor as the transistor M0 leads to an increased reading speed of the memory cell 100d. Alternatively, an OS transistor may be used as the transistor M0. The use of the OS transistor as the transistor M0 leads to a lower power consumption of the memory cell 100d. In addition, since the transistor M0 can have a thick gate insulating film, the charge written to the node FN1 can be held for a long time.

<<Operation Example of Memory Cell>>

Next, an operation example of the memory cell 100b in FIG. 2A will be described with reference to FIG. 4 and FIG. 5. Note that the following description can be applied to understand the operation of the memory cells 100a, 100c, and 100d.

Note that in the following explanation, the transistors M0 to M3 are described as n-channel transistors.

<Writing Operation>

First, a writing operation example of the memory cell 100b will be described with reference to FIG. 4.

Figure 4:
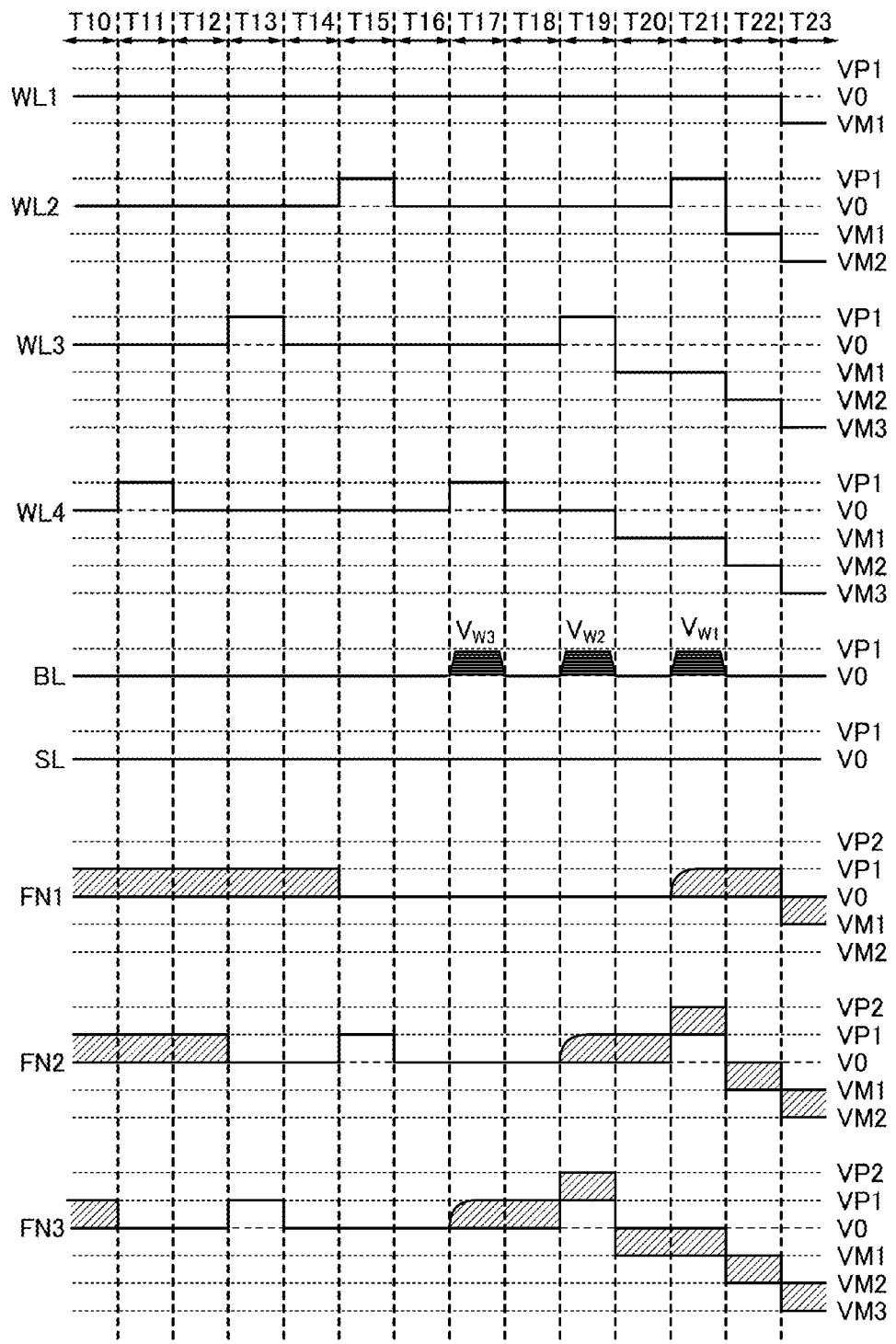
FIG. 4 is a timing chart showing an operation example of a memory cell.

FIG. 4 is a timing chart showing a writing operation of the memory cell 100b; specifically, shows the potentials of the wirings WL1 to WL4, the wiring BL, the wiring SL, and the nodes FN1 to FN3 sequentially. The timing chart is divided into periods T10 to T23 to show the operation timing.

In the drawing, VP1, VP2, V0, VM1, VM2, and VM3 denote the potentials of wirings or nodes. The potential V0 is GND. In the case where the transistors M0 to M3 each have a threshold voltage Vth, the potential VP1 is larger than the sum of the Vth and the maximum value (Vmax) of input data. The potentials VP1 and VP2 are positive potentials and the potential VP2 is twice as large as the potential VP1. The potentials VM1, VM2, and VM3 are negative potentials and the absolute value of the potential VM1 is equal to the potential VP1. The potential VM2 is twice as large as the potential VM1 and the potential VM3 is three times as large as the potential VM1.

Figure 5:
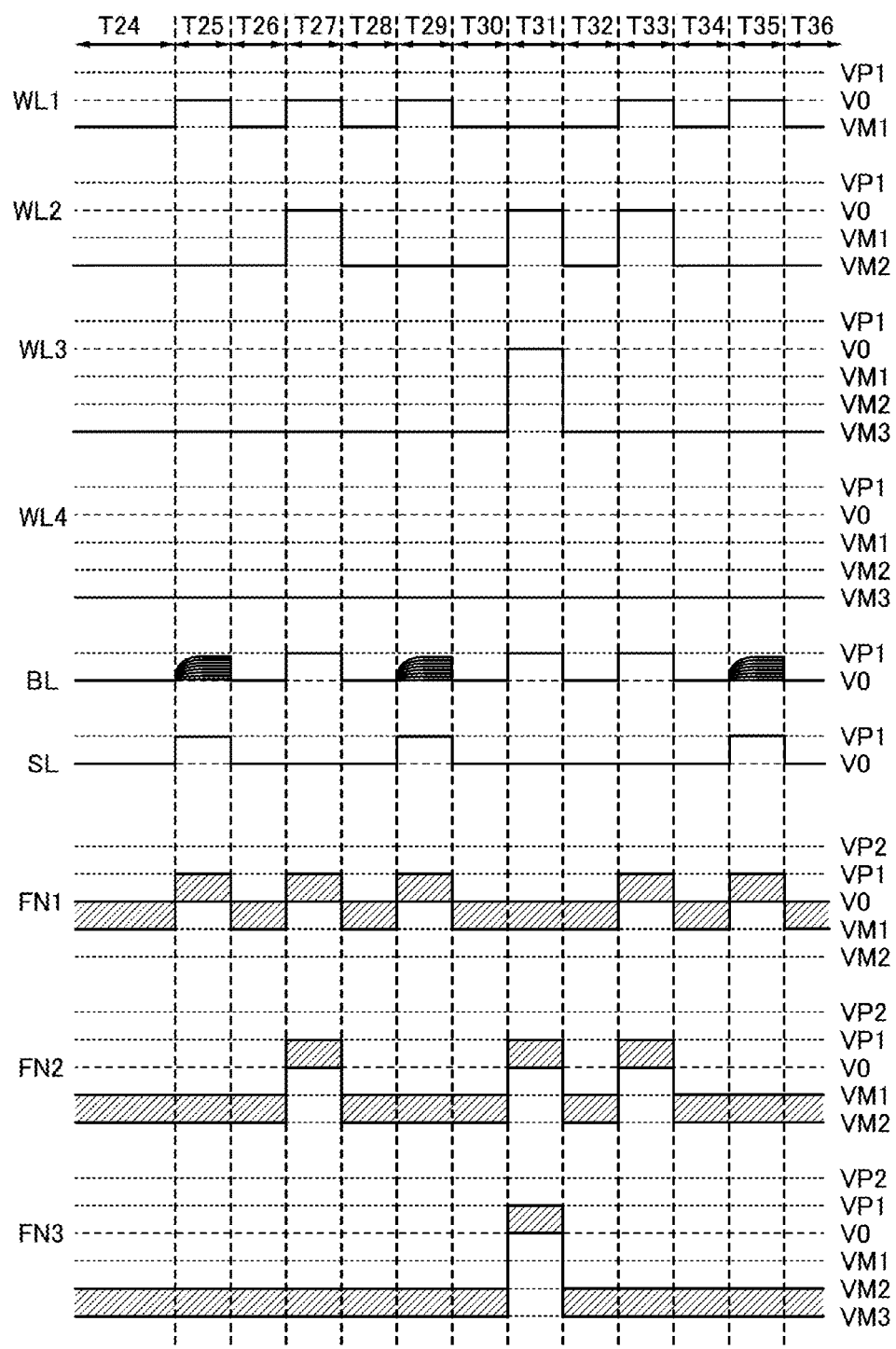
FIG. 5 is a timing chart showing an operation example of a memory cell.

In FIG. 4 and FIG. 5, the nodes FN1 to FN3 receive two-level or multilevel data and can have a potential in the range indicated by hatching.

First, the period T10 is a preparation period during which all the wirings WL1 to WL4, BL, and SL are at V0. The nodes FN1 to FN3 each have a certain potential.

Next, in the periods T11 to T16, the nodes FN1 to FN3 are reset in the order of FN3, FN2, and FN1.

In the period T11, the potential VP1 is applied to the wiring WL4, so that the transistor M3 is turned on. Then, the node FN3 receives the potential V0 from the wiring BL and is reset.

In the period T12, the potential V0 is applied to the wiring WL4, so that the transistor M3 is turned off. At this time, the potential V0 is maintained at the node FN3.

In the period T13, the potential VP1 is applied to the wiring WL3. The potential of the node FN3 is raised from V0 to VP1 through the capacitor C3. Then, the transistor M2 is turned on and the node FN2 receives the potential V0 and is reset.

In the period T14, the potential V0 is applied to the wiring WL3, so that the transistor M2 is turned off. The potential V0 is maintained at the node FN2.

In the period T15, the potential VP1 is applied to the wiring WL2. The potential of the node FN2 is raised from V0 to VP1 through the capacitor C2. Then, the transistor M1 is turned on and the node FN1 receives the potential V0 and is reset.

In the period T16, the potential V0 is applied to the wiring WL2, so that the transistor M1 is turned off. The potential V0 is maintained at the node FN1.

In the above manner, the nodes FN1, FN2, and FN3 are reset in the operation of the periods T11 to T16.

Next, in the periods T17 to T23, data is written to the nodes FN1 to FN3 in the order of FN3, FN2, and FN1.

In the period T17, the potential VP1 is applied to the wiring WL4, so that the transistor M3 is turned on. At this time, a potential $V_{W3}$ is written to the node FN3. The potential $V_{W3}$ can be, for example, any of potentials $V_{F0}$ to $V_{F15}$ (16 levels) in accordance with the data value.

In the period T18, the potential V0 is applied to the wiring WL4, so that the transistor M3 is turned off and the potential $V_{W3}$ is maintained at the node FN3.

In the period T19, the potential VP1 is applied to the wiring WL3. Then, the potential of the node FN3 is raised by the potential VP1 through the capacitor C3, thereby having a value equal to the sum of the potential $V_{W3}$ and the potential VP1. At this time, the transistor M2 is turned on and the a potential $V_{W2}$ is written to the node FN2. The potential $V_{W2}$ can be, for example, any of potentials $V_{F0}$ to $V_{F15}$ (16 levels) in accordance with the data value.

In the period T20, the potential VM1 is applied to the wiring WL3. The node FN3 has a negative potential through the capacitor C3, so that the transistor M2 is turned off. The potential $V_{W2}$ is maintained at the node FN2.

In the period T21, the potential VP1 is applied to the wiring WL2. Then, the potential of the node FN2 is raised by VP1 through the capacitor C2. At this time, the transistor M1 is turned on and a potential $V_{W1}$ is written to the node FN1. The potential $V_{W1}$ of the node FN1 can be, for example, any of potentials $V_{F0}$ to $V_{F15}$ (16 levels) in accordance with the data value.

In the period T22, the potential VM1 is applied to the wiring WL2. The transistor M1 is turned off and the potential $V_{W1}$ is maintained at the node FN1. At this time, the potential VM2 is applied to the wirings WL3 and WL4 so that the transistors M2 and M3 are turned off. As a result, the potential $V_{W3}$ is maintained at the node FN3.

In the period T23, the potential VM1 is applied to the wiring WL1, the potential VM2 is applied to the wiring WL2, and the potential VM3 is applied to the wirings WL3 and WL4. Then, the transistor M0 is turned off and the wirings SL and BL are brought out of conduction.

Through the above operations, multiple pieces of two-level or multilevel data can be written to the memory cell 100b.

<Reading Operation>

Next, an operation example for reading the data written in FIG. 4 will be described with reference to FIG. 5.

FIG. 5 is a timing chart showing a reading operation of the memory cell 100b. As in FIG. 4, FIG. 5 shows the potentials of the wirings WL1 to WL4, the wiring BL, the wiring SL, and the nodes FN1 to FN3 sequentially. The timing chart is divided into periods T24 to T36 to show the operation timing.

Data reading is performed in the order of the potential $V_{W1}$ at the node FN1, the potential $V_{W2}$ at the node FN2, and the potential $V_{W3}$ at the node FN3. After the potential $V_{W1}$ at the node FN1 is read, the potential $V_{W2}$ at the node FN2 is transferred to the node FN1 and then read by the transistor M0. After the potential $V_{W2}$ transferred to the node FN1 is read, the potential $V_{W3}$ at the node FN3 is transferred to the node FN2 and then to the node FN1, and is read by the transistor M0.

The period T24 in FIG. 5 is a holding period after the writing operation, during which the wirings and the nodes maintain the states in the period T23 in FIG. 4.

In the period T25, the potential VP1 is applied to the wiring SL and the potential V0 is applied to the wiring WL1. The wiring BL is brought into an electrically floating state. Then, a current corresponding to the gate potential of the transistor M0 (the potential of the node FN1) flows therethrough to charge the wiring BL. The charging of the wiring BL is completed when the potential difference between the node FN1 and the wiring BL falls below the Vth of the transistor M0.

The voltage charged in the wiring BL is read by a sensor circuit electrically connected to the wiring BL, whereby the potential of the node FN1 can be read, that is, the two-level or multilevel data written to the node FN1 can be read.

In the period T26, the potential V0 is applied to the wiring SL and the potential VM1 is applied to the wiring WL1. Then, the transistor M0 is turned off.

In the period T27, the data at the node FN2 is transferred to the node FN1. The potential V0 is applied to the wiring WL2 and the potential VP1 is applied to the wiring BL. The transistor M1 charges the node FN1 in accordance with the charge written to the node FN2. As a result, the potential $V_{W2}$ at the node FN2 is transferred to the node FN1 as a potential $V_{W2}'$.

In the period T28, the potential V0 is applied to the wiring BL, the potential VM1 is applied to the wiring WL1, and the potential VM2 is applied to the wiring WL2. Then, the transistors M0 and M1 are turned off.

In the period T29, the potential VP1 is applied to the wiring SL and the potential V0 is applied to the wiring WL1. The wiring BL is brought into an electrically floating state.

Then, a current corresponding to the potential of the node FN1 flows through the transistor M0 to charge the wiring BL.

The voltage charged in the wiring BL is read by a sensor circuit electrically connected to the wiring BL, whereby the two-level or multilevel data written to the node FN2 can be read.

In the period T30, the potential V0 is applied to the wiring SL and the wiring BL, and the potential VM1 is applied to the wiring WL1. Then, the transistor M0 is turned off.

In the period T31, the data at the node FN3 is transferred to the node FN2. The potential V0 is applied to the wirings WL2 and WL3 and the potential VP1 is applied to the wiring BL. The transistor M2 is turned on in accordance with the potential of the node FN3, thereby charging the node FN2. As a result, the potential $V_{W3}$ at the node FN3 is transferred to the node FN2 as a potential $V_{W3}'$.

In the period T32, the potential V0 is applied to the wiring BL, the potential VM2 is applied to the wiring WL2, and the potential VM3 is applied to the wiring WL3. Then, the transistor M2 is turned off.

In the period T33, the data at the node FN3 that has been transferred to the node FN2 in the period T31 is further transferred to the node FN1. The potential V0 is applied to the wirings WL1 and WL2 and the potential VP1 is applied to the wiring BL. The transistor M0 is turned on in accordance with the potential of the node FN2, thereby charging the node FN1. As a result, the potential $V_{W3}'$ at the node FN2 is transferred to the node FN1 as a potential $V_{W3}''$.

In the period T34, the potential V0 is applied to the wiring BL, the potential VM1 is applied to the wiring WL1, and the potential VM2 is applied to the wiring WL2. Then, the transistors M0 and M1 are turned off.

In the period T35, the potential VP1 is applied to the wiring SL and the potential V0 is applied to the wiring WL1. The wiring BL is brought into an electrically floating state. Then, a current corresponding to the potential of the node FN1 flows through the transistor M0 to charge the wiring BL.

The voltage charged in the wiring BL is read by a sensor circuit electrically connected to the wiring BL, whereby the two-level or multilevel data maintained at the node FN3 can be read.

Through the above operations, multiple pieces of two-level or multilevel data can be read from the memory cell 100b.

<<Configuration Example 5 of Memory Cell>>

Figure 6:
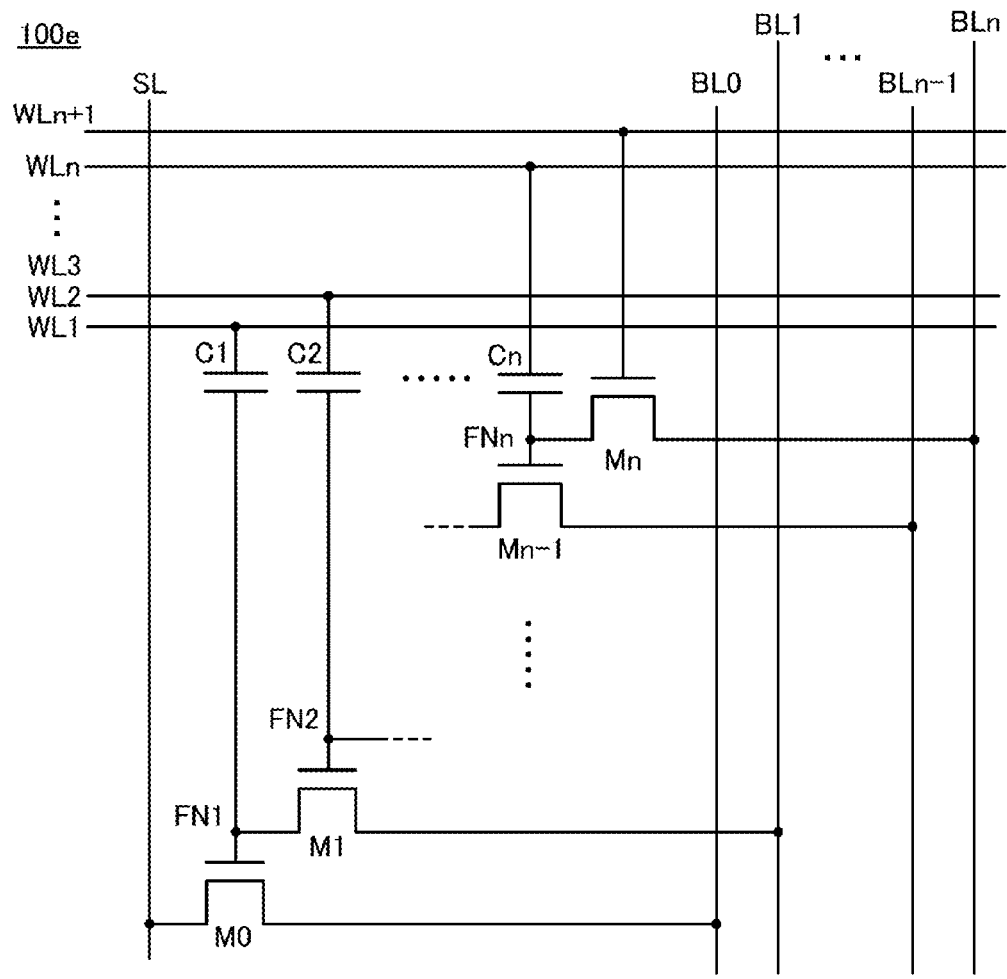
FIG. 6 is a circuit diagram showing a configuration example of a memory cell.

The memory cell 100d shown in FIG. 3 may have a configuration in which the wiring BL is divided into wirings BL0 to BLn, one of the source and the drain of the transistor M0 is connected to the wiring BL0, one of the source and the drain of the transistor M1 is connected to the wiring BL1, and one of the source and the drain of the transistor Mn is connected to the wiring BLn (see a memory cell 100e in FIG. 6).

<<Configuration Example 6 of Memory Cell>>

Figure 7:
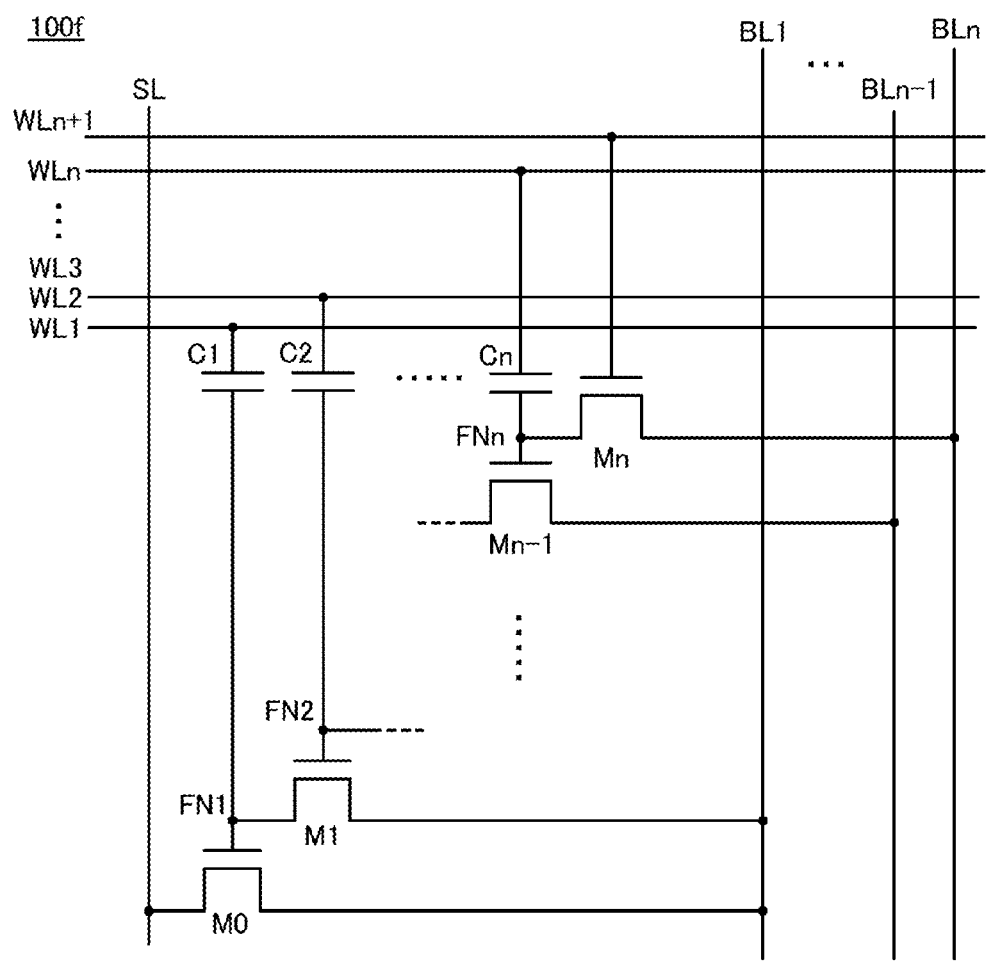
FIG. 7 is a circuit diagram showing a configuration example of a memory cell.

The memory cell 100d shown in FIG. 3 may have a configuration in which the wiring BL is divided into wirings BL1 to BLn, one of the source and the drain of the transistor M0 and one of the source and the drain of the transistor M1 are connected to the wiring BL1, and one of the source and the drain of the transistor Mn is connected to the wiring BLn (see a memory cell 100f in FIG. 7).

<<Configuration Example 7 of Memory Cell>>

Figure 8:
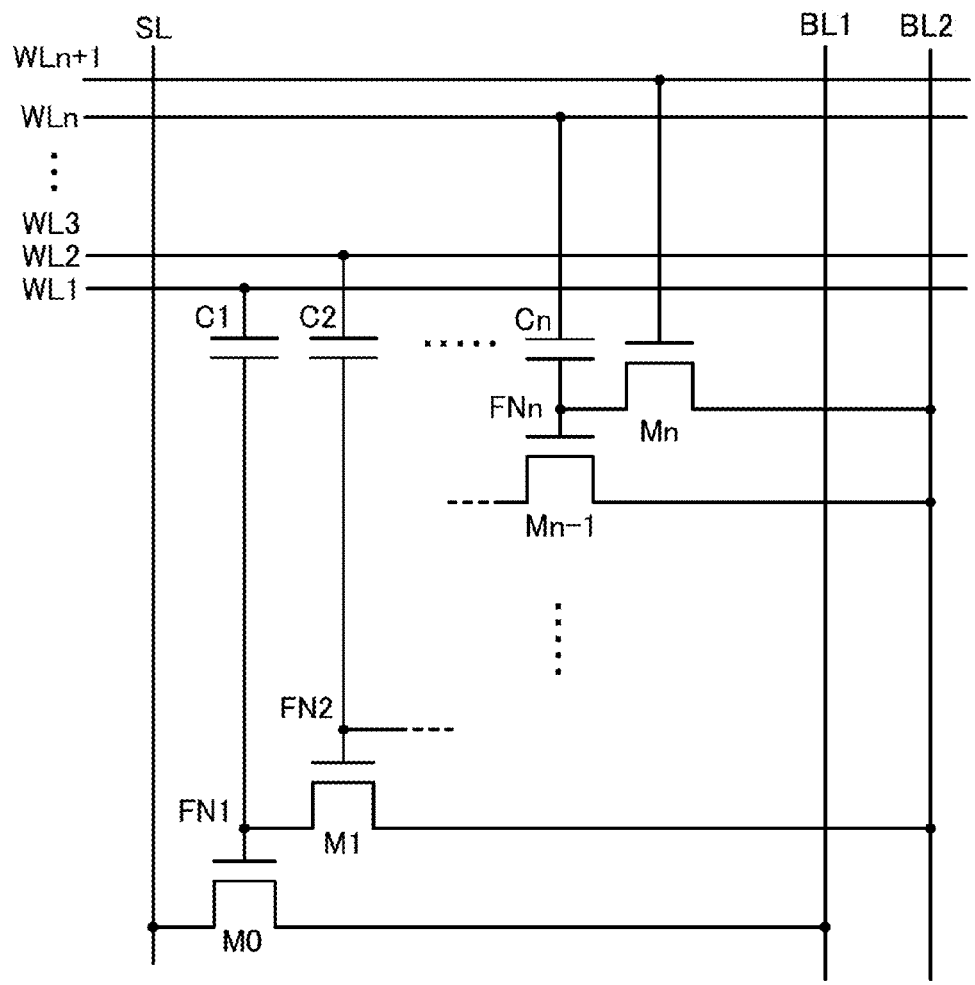
FIG. 8 is a circuit diagram showing a configuration example of a memory cell.

The memory cell 100d shown in FIG. 3 may have a configuration in which the wiring BL is divided into wirings BL1 and BL2, one of the source and the drain of the transistor M0 is connected to the wiring BL1, and one of the source and the drain of each of the transistors M1 to Mn is connected to the wiring BL2 (see a memory cell 100g in FIG. 8).

<<Configuration Example 8 of Memory Cell>>

The memory cell 100d shown in FIG. 3 may have a configuration in which the transistors M1 to Mn each include a second gate electrode. The second gate electrode preferably includes a region that overlaps with a first gate electrode with a semiconductor layer (a channel formation region) positioned therebetween. Note that a common potential VBG may be applied to the second gate electrodes of the transistors M1 to Mn (see a memory cell 100h in FIG. 9). This configuration allows the control of the threshold voltages of the transistors M1 to Mn.

<<Configuration Example 9 of Memory Cell>>

Figure 9:
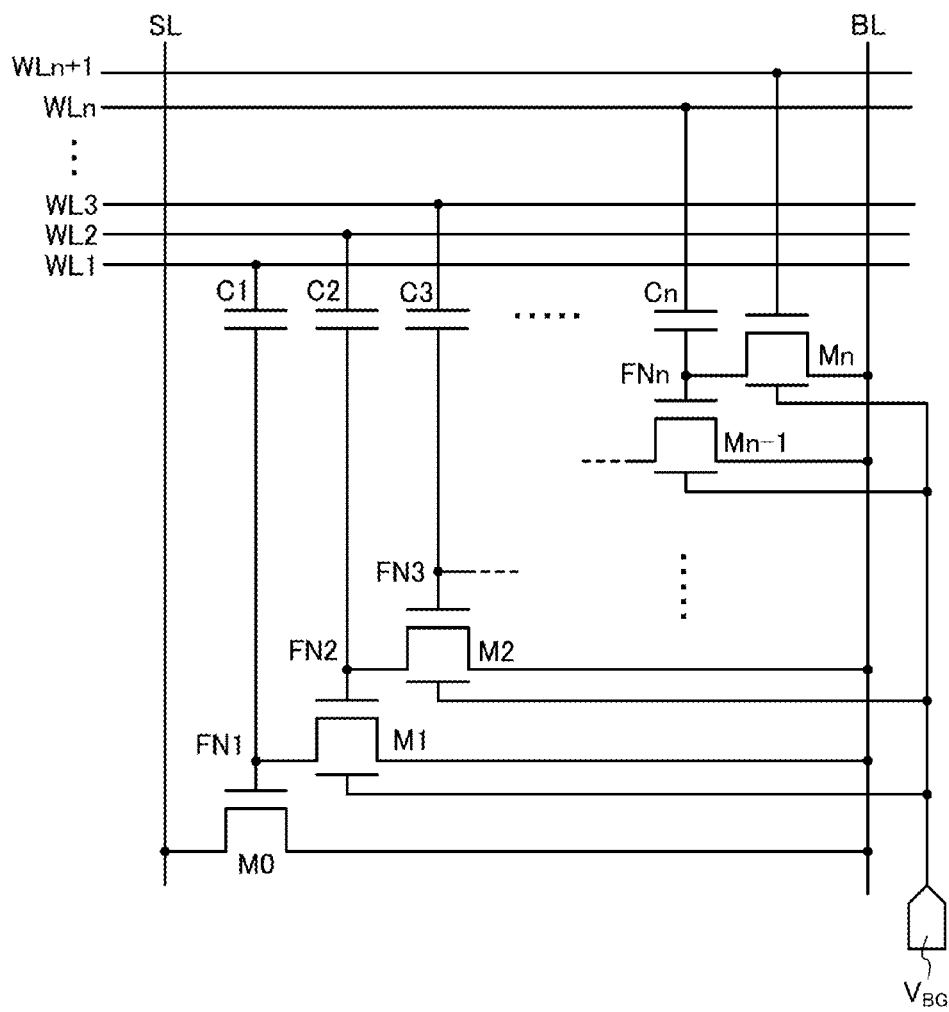
FIG. 9 is a circuit diagram showing a configuration example of a memory cell.
Figure 10:
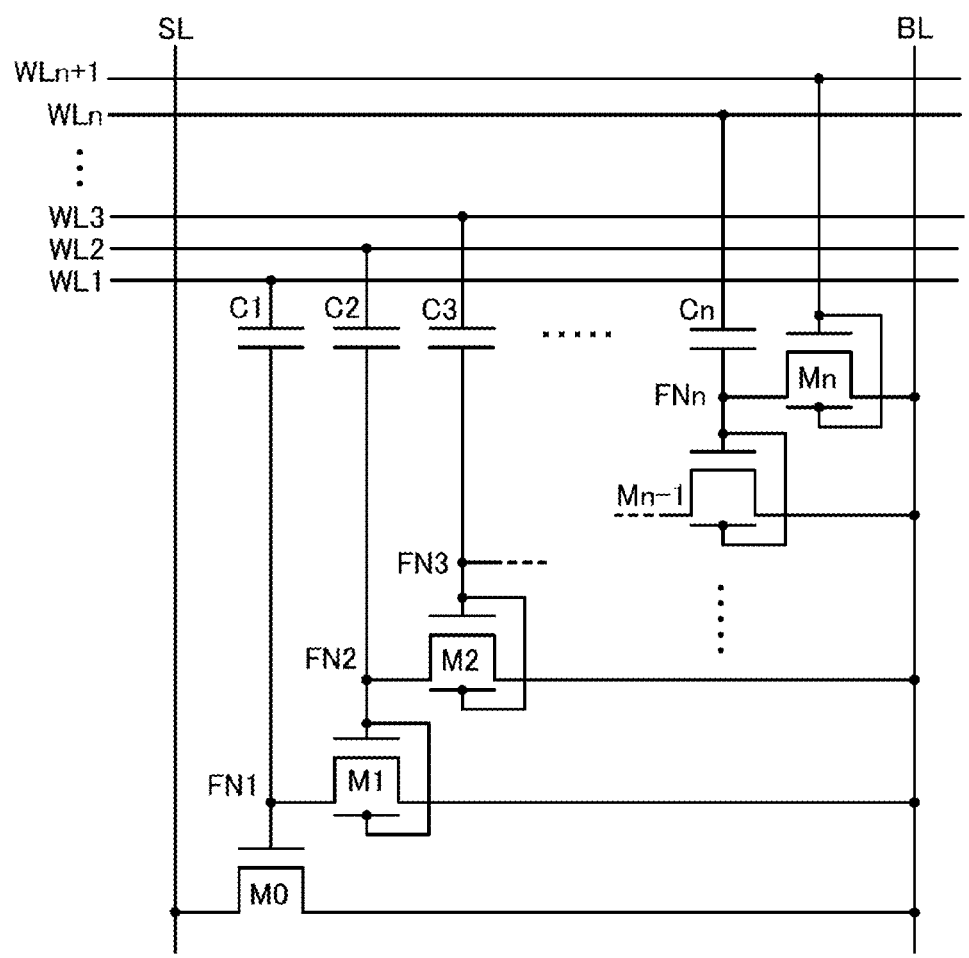
FIG. 10 is a circuit diagram showing a configuration example of a memory cell.

In addition, the second gate electrodes of the transistors M1 to Mn shown in FIG. 9 may be electrically connected to the respective first electrodes thereof (see a memory cell 100i in FIG. 10). This configuration results in an increase in the on-state current of the transistors M1 to Mn.

<<Configuration Example 10 of Memory Cell>>

Figure 11:
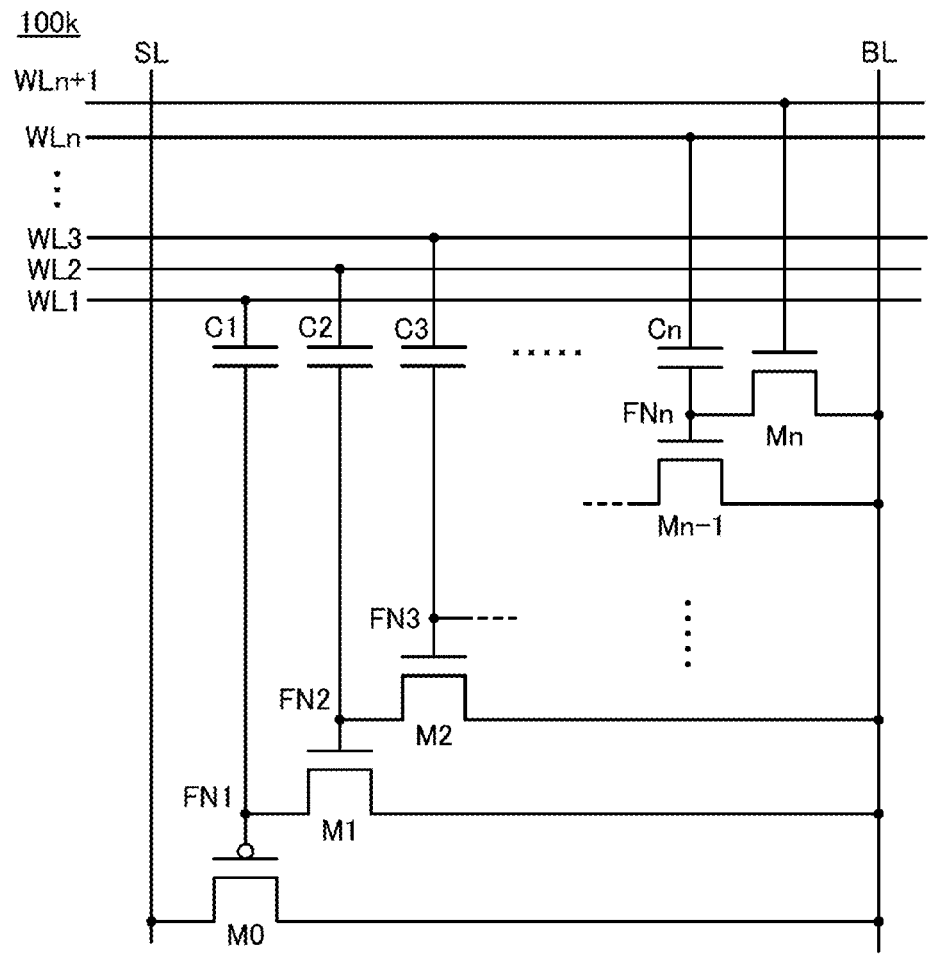
FIG. 11 is a circuit diagram showing a configuration example of a memory cell.

The memory cell 100d shown in FIG. 3 may have a configuration in which a p-channel transistor is used as the transistor M0 (see a memory cell 100k in FIG. 11).

Embodiment 2

In this embodiment, configuration examples of a memory device of one embodiment of the present invention will be described with reference to FIG. 12 to FIG. 18.

In the memory cells 100a to 100k shown in Embodiment 1, data written thereto is lost after being read. For example, in the timing chart of FIG. 5, when data written to the node FN2 is read from the memory cell 100b, the data written to the node FN1 is lost. The memory cell shown in this embodiment includes a memory circuit for temporarily storing data written to each node, thereby preventing the data from being lost.

<<Configuration Example 1 of Memory Device>>

Figure 12:
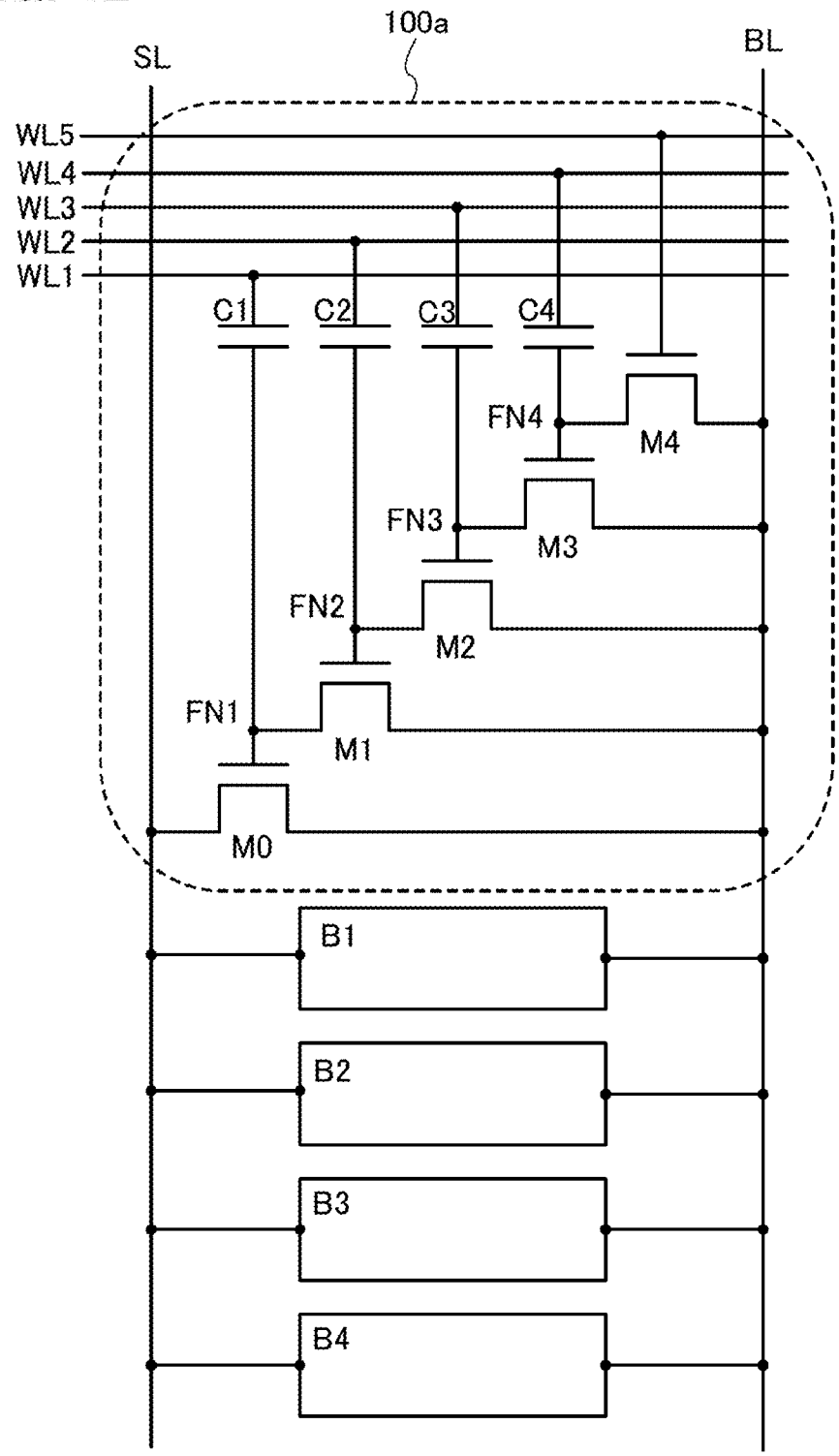
FIG. 12 is a circuit diagram showing a configuration example of a memory device.

FIG. 12 shows an example in which the memory cell 100a is connected to memory circuits B1, B2, B3, and B4. The memory circuits B1 to B4 are connected to the memory cell 100a through the wirings SL and BL.

When data at the node FN1 is read, the data is configured to be temporarily stored in the memory circuit B1. When data at the node FN2 is read, the data is configured to be temporarily stored in the memory circuit B2. When data at the node FN3 is read, the data is configured to be temporarily stored in the memory circuit B3. When data at the node FN4 is read, the data is configured to be temporarily stored in the memory circuit B4. The memory circuits B1 to B4 are configured to return the data to the respective nodes after the data is read from all the nodes.

<<Configuration Example 2 of Memory Device>>

Figure 13:
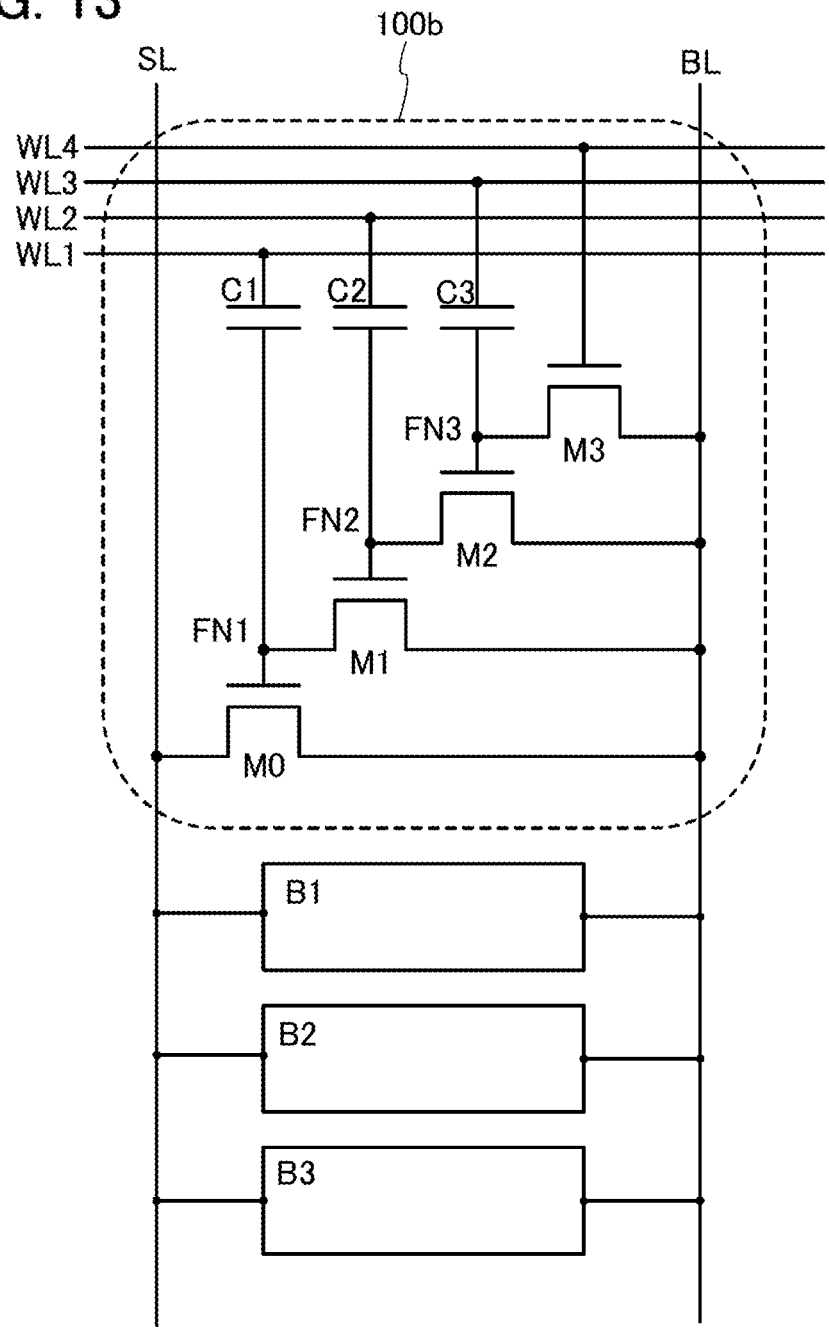
FIG. 13 is a circuit diagram showing a configuration example of a memory device.

FIG. 13 shows an example in which the memory cell 100b is connected to the memory circuits B1 to B3. The memory circuits B1 to B3 are connected to the memory cell 100b through the wirings SL and BL.

When data at the node FN1 is read, the data is configured to be temporarily stored in the memory circuit B1. When data at the node FN2 is read, the data is configured to be temporarily stored in the memory circuit B2. When data at the node FN3 is read, the data is configured to be temporarily stored in the memory circuit B3. The memory circuits B1 to B3 are configured to return the data to the respective nodes after the data is read from all the nodes.

<<Configuration Example 3 of Memory Device>>

Figure 14:
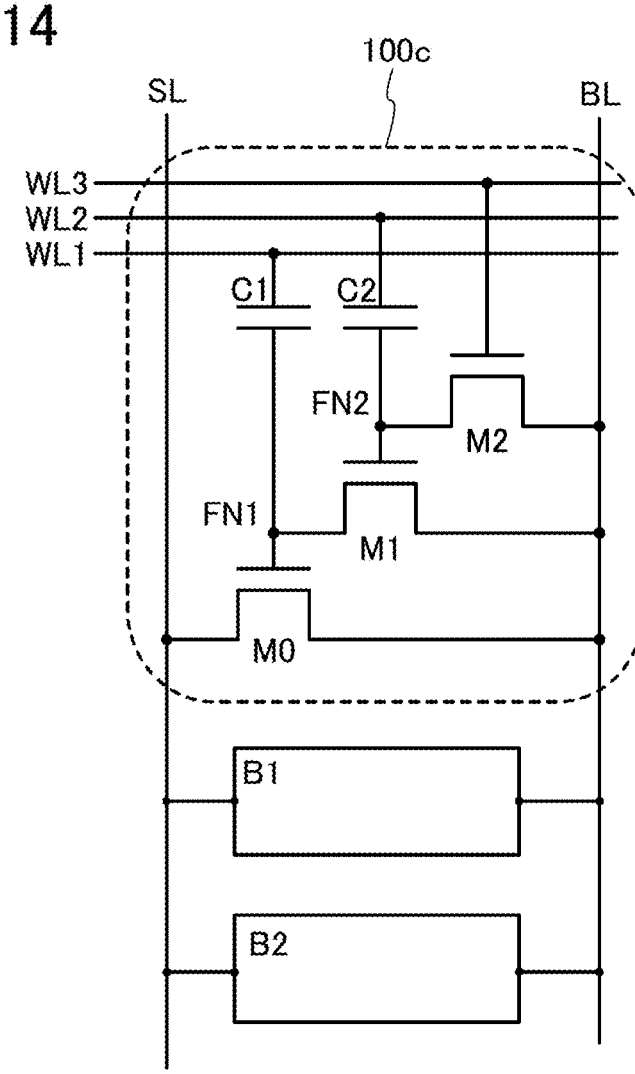
FIG. 14 is a circuit diagram showing a configuration example of a memory device.

FIG. 14 shows an example in which the memory cell 100c is connected to the memory circuits B1 and B2. The memory circuits B1 and B2 are connected to the memory cell 100c through the wirings SL and BL.

When data at the node FN1 is read, the data is configured to be temporarily stored in the memory circuit B1. When data at the node FN2 is read, the data is configured to be temporarily stored in the memory circuit B2. The memory circuits B1 and B2 are configured to return the data to the respective nodes after the data is read from all the nodes.

<<Configuration Example 4 of Memory Device>>

Figure 15:
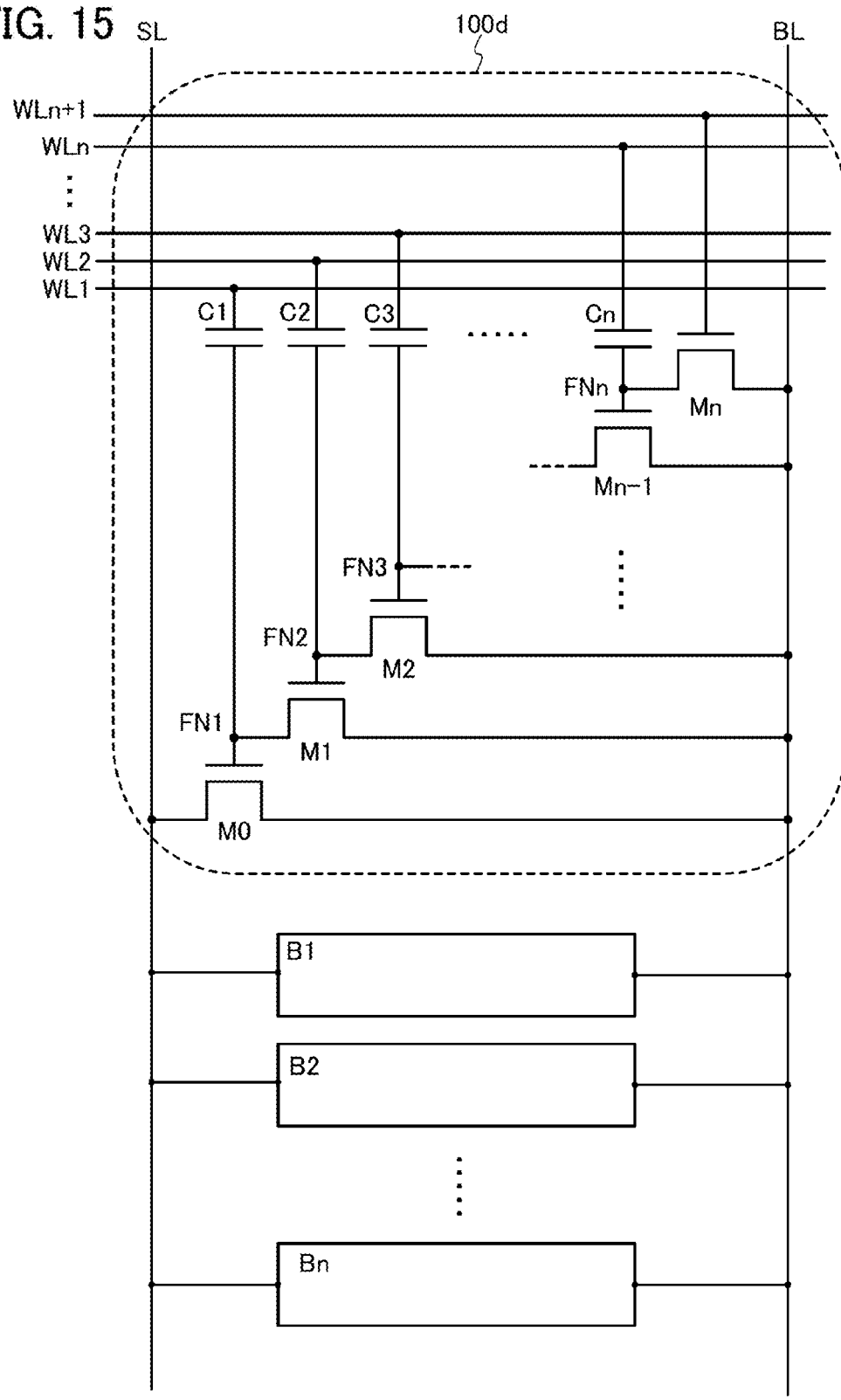
FIG. 15 is a circuit diagram showing a configuration example of a memory device.

FIG. 15 shows an example in which the memory cell 100d is connected to the memory circuits B1 to Bn. The memory circuits B1 to Bn are connected to the memory cell 100d through the wirings SL and BL.

When data at the node FN1 is read, the data is configured to be temporarily stored in the memory circuit B1. When data at the node FNn is read, the data is configured to be temporarily stored in the memory circuit Bn. The memory circuits B1 to Bn are configured to return the data to the respective nodes after the data is read from all the nodes.

<<Configuration Example of Memory Circuit>>

Figure 16:
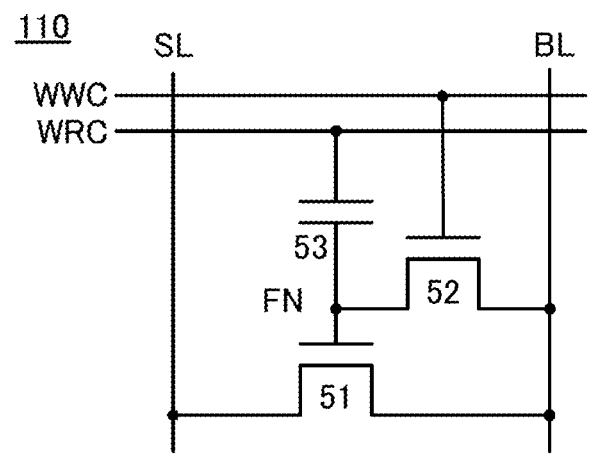
FIG. 16 is a circuit diagram showing a configuration example of a memory cell.

FIG. 16 is a circuit diagram showing a configuration example of a memory cell 110 that can be applied to the memory circuits B1 to Bn. The memory cell 110 includes a transistor 51, a transistor 52, a capacitor 53, and a node FN.

The node FN is electrically connected to a gate of the transistor 51 and a first terminal of the capacitor 53. A second terminal of the capacitor 53 is electrically connected to a wiring WRC. The transistor 52 is configured to control conduction or non-conduction between the node FN and the wiring BL. A gate of the transistor 52 is electrically connected to a wiring WWC. The transistor 51 is configured to control conduction or non-conduction between the wiring SL and the wiring BL.

The node FN is configured to retain data that has been written to any one of the nodes FN1 to FNn. The data is written to the node FN through the wiring BL and the transistor 52.

A transistor with a low off-state current is preferably used as the transistor 52. Examples of the transistor with a low off-state current include an OS transistor including an oxide semiconductor in a channel formation region and a transistor using a wide band gap semiconductor in a channel formation region. The OS transistor is particularly preferably used.

The channel resistance of the transistor 51 varies with a potential applied to the node FN (the gate of the transistor 51). When a potential difference is produced between the wiring SL and the wiring BL and the current flowing between the wirings SL and BL or the potential of the wiring BL is detected, the potential applied to the node FN can be read indirectly.

The transistor 51 may be a Si transistor. The use of the Si transistor as the transistor 51 leads to an increased reading speed of the memory cell 110.

Alternatively, an OS transistor may be used as the transistor 51. The use of the OS transistor as the transistor 51 leads to a lower power consumption of the memory cell 110. In addition, since the transistor 51 can have a thick gate insulating film, the charge written to the node FN can be held for a long time.

<<Configuration Example of Memory Cell Array>>

Figure 17:
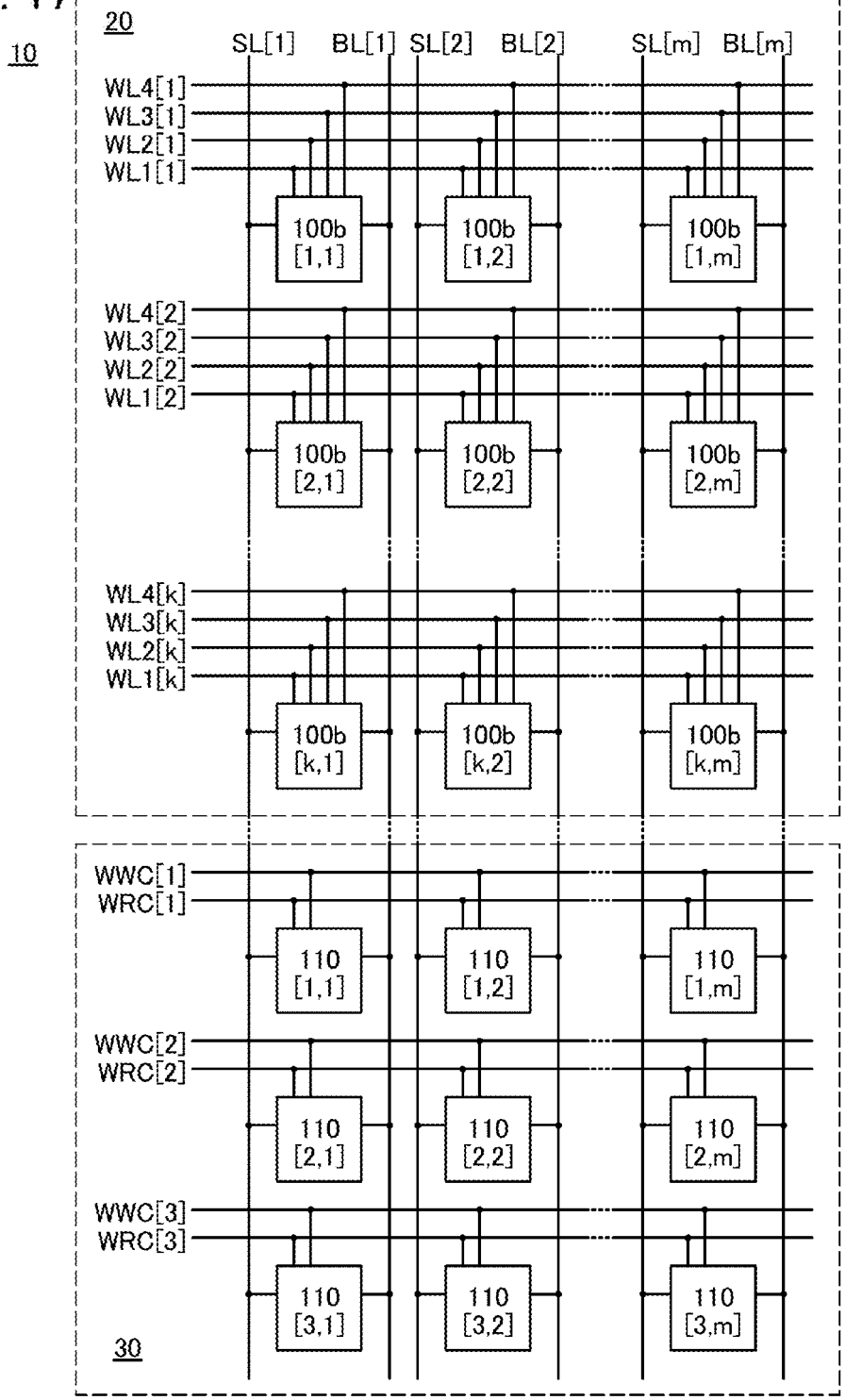
FIG. 17 is a circuit diagram showing a configuration example of a memory cell array.

FIG. 17 shows a configuration example of a memory cell array 10. The memory cell array 10 includes a main memory cell array 20 and a sub memory cell array 30 for temporary storage. In the main memory cell array 20, the memory cells shown in Embodiment 1 are provided in a matrix. In FIG. 17, as an example, the memory cells 100b in FIG. 2A are arranged in a matrix of k rows and m columns (k and m are each an integer of 2 or more). In the sub memory cell array 30, as an example, the memory cells 110 shown in FIG. 16 are arranged in a matrix of 3 rows and m columns.

The number of lines in the longitudinal direction of the sub memory cell array 30 (the number of rows) is the same as the number of storage nodes of the memory cell 100b (in the case of the memory cell 100b, the three nodes FN1 to FN3). The number of lines in the horizontal direction of the sub memory cell array 30 (the number of columns) is the same as that of the main memory cell array 20.

<<Operation Example of Sub Memory Cell Array>>

Figure 18:
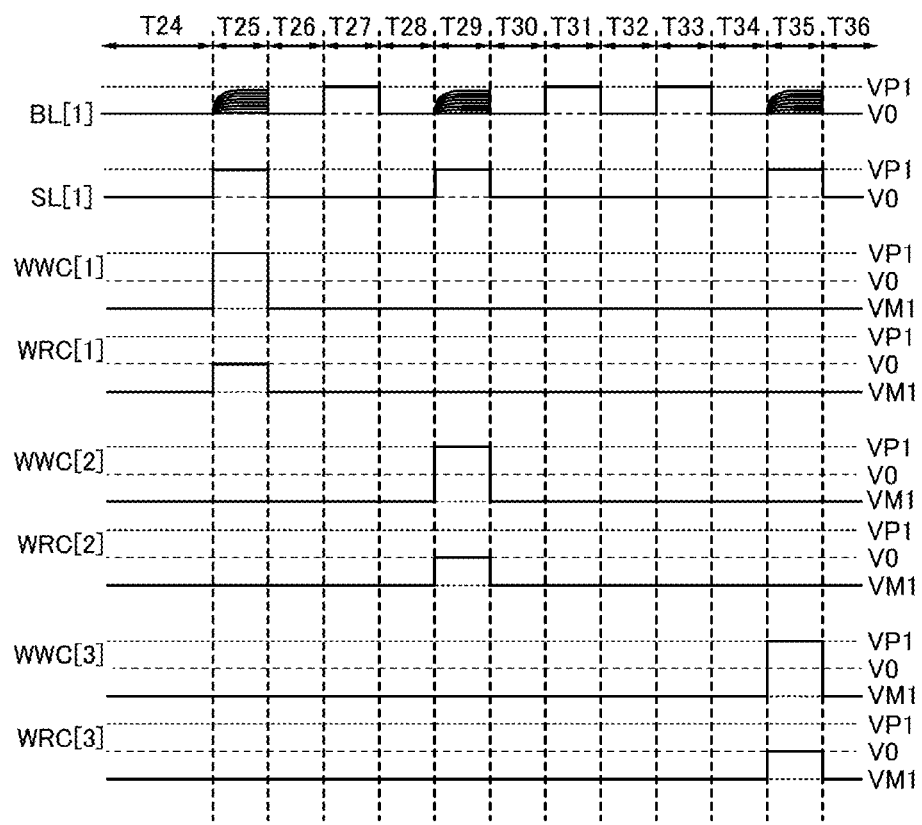
FIG. 18 is a timing chart showing an operation example of a memory cell array.

Next, an operation example of the sub memory cell array 30 will be described with reference to FIG. 18. FIG. 18 focuses on, as an example, the operation of a memory cell 100b[1,1] in the main memory cell array 20 and memory cells 110[1,1], 110[2,1], and 110[3,1] in the sub memory cell array 30.

The timing chart of FIG. 5 can be referred to for the reading operation of the memory cell 100b[1,1]. The timing chart of FIG. 18 only shows a wiring BL1[1], a wiring SL[1], a wiring WWC[1], a wiring WRC[1], a wiring WWC[2], a wiring WRC[2], a wiring WWC[3], and a wiring WRC[3]. Note that the timing in periods T24 to T36 in FIG. 18 is the same as that in the periods T24 to T36 in FIG. 5.

In the period T24, a preparation period, the potential V0 is applied to the wirings BL[1] and SL[1], and the potential VM1 is applied to the wirings WWC[1], WRC[1], WWC[2], WRC[2], WWC[3], and WRC[3].

When the data at the node FN1 is read from the memory cell 100b[1,1] in the period T25, the potential VP1 is applied to the wiring WWC[1] and the potential V0 is applied to the wiring WRC[1]. Then, the transistor 52 in the corresponding memory cell 110[1,1] is turned on. Since the potential $V_{W1}$, which is the data at the node FN1, is output to the wiring BL, the potential $V_{W1}$ is written to the node FN in the memory cell 110[1,1].

In the period T26, the potential VM1 is applied to the wirings WWC[1] and WRC[1]. Then, the transistor 52 in the memory cell 110[1,1] is turned off, so that the data at the node FN1 in the memory cell 100b[1,1] is temporarily stored.

When the data at the node FN2 is read from the memory cell 100b[1,1] in the period T29, the potential VP1 is applied to the wiring WWC[2] and the potential V0 is applied to the wiring WRC[2]. Then, the transistor 52 in the memory cell 110[2,1] is turned on. Since the potential $V_{W2}'$, which is the data at the node FN2, is output to the wiring BL, the potential $V_{W2}'$ is written to the node FN in the memory cell 110[2,1].

In the subsequent period T30, the potential VM1 is applied to the wirings WWC[2] and WRC[2]. Then, the transistor 52 in the memory cell 110[2,1] is turned off, so that the data at the node FN2 in the memory cell 100b[1,1] is temporarily stored.

When the data at the node FN3 is read from the memory cell 100b[1,1] in the period T35, the potential VP1 is applied to the wiring WWC[3] and the potential V0 is applied to the wiring WRC[3]. Then, the transistor 52 in the memory cell 110[3,1] is turned on. Since the potential $V_{W3}''$, which is the data at the node FN2, is output to the wiring BL, the potential $V_{W3}''$ is written to the node FN in the memory cell 110[3,1].

In the subsequent period T36, the potential VM1 is applied to the wirings WWC[3] and WRC[3]. Then, the transistor 52 in the memory cell 110[3,1] is turned off, so that the data at the node FN3 in the memory cell 100b[1,1] is temporarily stored.

When the data reading from the memory cell 100b[1,1] is completed, the data stored in the sub memory cell array 30 is returned to the memory cell 100b[1,1]. The data is preferably returned from the memory cells 110[3,1], 110[2,1], and 110[1,1] in this order. For example, the data can be returned from the memory cell 110[3,1] in such a manner that the wiring BL is brought into an electrically floating state and the potential VP1 is applied to the wirings SL, WRC[3], and WL4[1]. The wiring BL has a potential corresponding to that of the node FN in the memory cell 110[3,1], whereby the data is returned to the node FN3 in the memory cell 100b[1,1]. The same applies to the memory cells 110[2,1] and 110[1,1].

Through the above operations, data can be read from the memory cell array 10 without being lost.

<Configuration Example of Memory Device>

Figure 19:
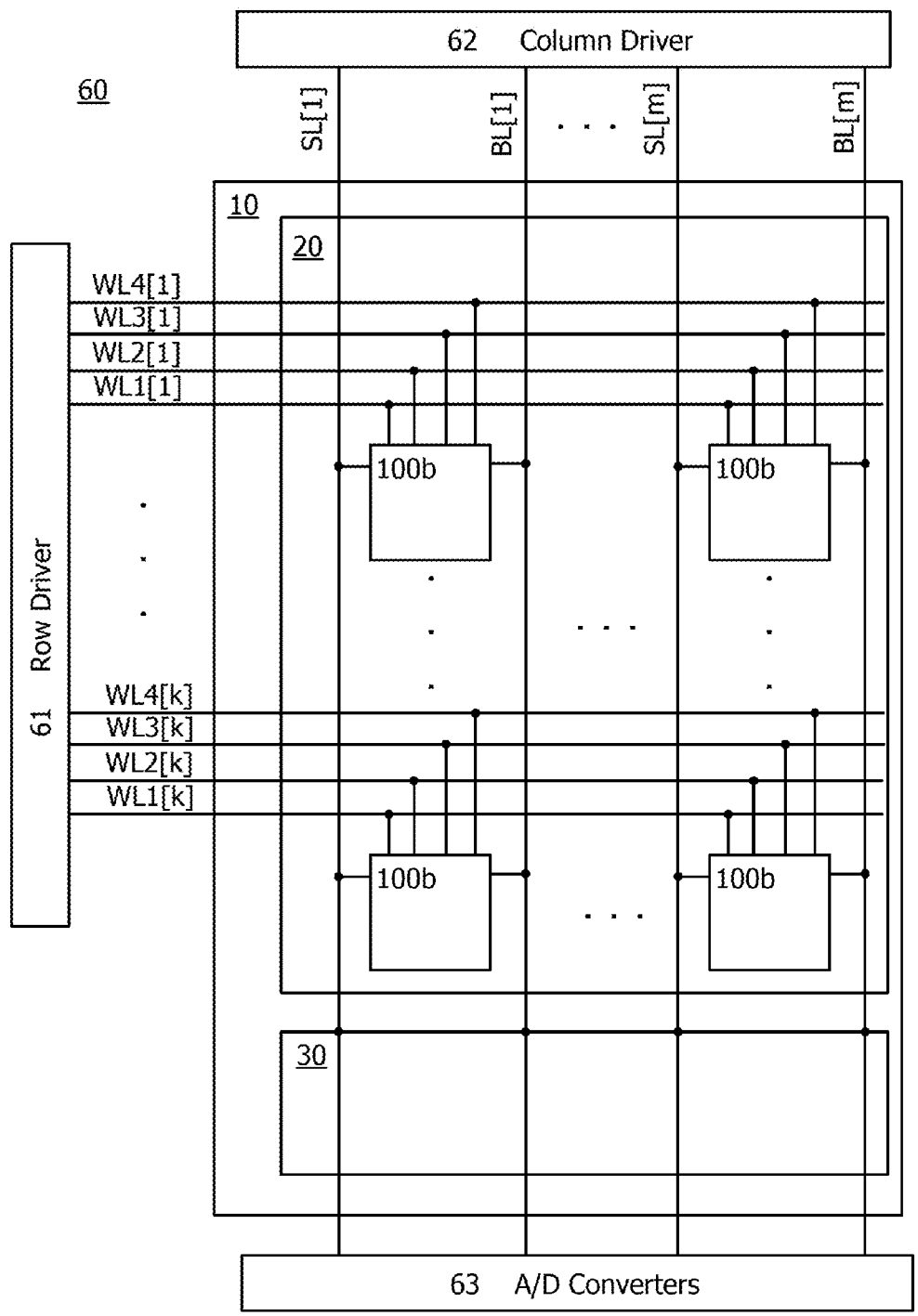
FIG. 19 is a circuit block diagram showing a configuration example of a memory device.

FIG. 19 is a block diagram showing a configuration example of a memory device. A memory device 60 in FIG. 19 includes the memory cell array 10 shown in FIG. 17, a row selection driver 61, a column selection driver 62, and an A/D converter 63.

The row selection driver 61 is a circuit configured to selectively turn on the transistors M3 in the memory cells 100b in each row and to selectively change the potentials of the nodes FN1 to FN3 in the memory cells 100b in each row. The row selection driver 61 in the memory device 60 allows the memory cells 100b to be selected row by row and data to be written and read to/from the selected memory cells 100b.

The column selection driver 62 is a circuit configured to selectively write data to the nodes FN1 to FN3 in the memory cells 100b in each column, to initialize the potential of the wirings BL and SL, and to bring the wiring BL into an electrically floating state. The column selection driver 62 in the memory device 60 allows the memory cells 100b to be selected column by column and data to be written and read to/from the selected memory cells 100b.

The A/D converter 63 is a circuit configured to convert the potential of the wiring BL, which is an analog value, into a digital value and output the converted digital value. Specifically, the A/D converter 63 includes a flash AD/converter. With the A/D converter 63, the memory device 60 can output the potential of the wiring BL, which corresponds to data read from the memory cell 100b.

Note that the A/D converter 63 is described as a flash A/D converter. However, the A/D converter 63 may be a successive approximation A/D converter, a multi-slope A/D converter, or a delta-sigma A/D converter.

Embodiment 3

Described in this embodiment are structures of an OS transistor that can be used as the transistors M0 to Mn shown in the above embodiments.

<<Structure Example 1 of Transistor>>

FIGS. 20A to 20C are a top view and cross-sectional views of a transistor 400a. FIG. 20A is a top view. FIG. 20B is a cross-sectional view taken along dashed-dotted line A1-A2 in FIG. 20A and FIG. 20C is a cross-sectional view taken along dashed-dotted line A3-A4 in FIG. 20A. Note that for simplification of the drawing, some components are not illustrated in the top view in FIG. 20A. Note that the dashed-dotted line A1-A2 and the dashed-dotted line A3-A4 are sometimes referred to as a channel length direction of the transistor 400a and a channel width direction of the transistor 400a, respectively.

The transistor 400a includes a substrate 450, an insulating film 401 over the substrate 450, a conductive film 414 over the insulating film 401, an insulating film 402 covering the conductive film 414, an insulating film 403 over the insulating film 402, an insulating film 404 over the insulating film 403, a metal oxide 431 and a metal oxide 432 which are stacked in this order over the insulating film 404, a conductive film 421 touching top and side surfaces of the metal oxide 432, a conductive film 423 also touching the top and side surfaces of the metal oxide 432, a conductive film 422 over the conductive film 421, a conductive film 424 over the conductive film 423, an insulating film 405 over the conductive films 422 and 424, a metal oxide 433 touching the metal oxides 431 and 432, the conductive films 421 to 424, and the insulating film 405, an insulating film 406 over the metal oxide 433, a conductive film 411 over the insulating film 406, a conductive film 412 over the conductive film 411, a conductive film 413 over the conductive film 412, an insulating film 407 covering the conductive film 413, and an insulating film 408 over the insulating film 407. Note that the metal oxides 431 to 433 are collectively referred to as a metal oxide 430.

The metal oxide 432 is a semiconductor and serves as a channel of the transistor 400a.

Furthermore, the metal oxides 431 and 432 include a region 441 and a region 442. The region 441 is formed in the vicinity of a region where the conductive film 421 is in contact with the metal oxides 431 and 432. The region 442 is formed in the vicinity of a region where the conductive film 423 is in contact with the metal oxides 431 and 432.

The regions 441 and 442 serve as low-resistance regions. The region 441 contributes to a decrease in the contact resistance between the conductive film 421 and the metal oxides 431 and 432. The region 442 also contributes to a decrease in the contact resistance between the conductive film 423 and the metal oxides 431 and 432.

The conductive films 421 and 422 serve as one of source and drain electrodes of the transistor 400a. The conductive films 423 and 424 serve as the other of the source and drain electrodes of the transistor 400a.

The conductive film 422 is configured to allow less oxygen to pass through than the conductive film 421. It is thus possible to prevent a decrease in the conductivity of the conductive film 421 due to oxidation.

The conductive film 424 is also configured to allow less oxygen to pass through than the conductive film 423. It is thus possible to prevent a decrease in the conductivity of the conductive film 423 due to oxidation.

The conductive films 411 to 413 serve as a first gate electrode of the transistor 400a.

The conductive films 411 and 413 are configured to allow less oxygen to pass through than the conductive film 412. It is thus possible to prevent a decrease in the conductivity of the conductive film 412 due to oxidation.

The insulating film 406 serves as a first gate insulating film of the transistor 400a.

The conductive film 414 serves as a second gate electrode of the transistor 400a.

The potential applied to the conductive films 411 to 413 may be the same as or different from that applied to the conductive film 414. The conductive film 414 may be omitted in some cases.

The insulating films 401 to 404 serve as a base insulating film of the transistor 400a. The insulating films 402 to 404 also serve as a second gate insulating film of the transistor 400a.

The insulating films 405, 407, and 408 serve as a protective insulating film or an interlayer insulating film of the transistor 400a.

As shown in FIG. 20C, the side surface of the metal oxide 432 is surrounded by the conductive film 411. With this structure, the metal oxide 432 can be electrically surrounded by an electric field of the conductive film 411. Such a structure of a transistor in which a semiconductor is electrically surrounded by an electric field of a gate electrode is referred to as a surrounded channel (s-channel) structure. Since a channel is formed in the entire metal oxide 432 (bulk) in the s-channel structure, a large amount of current can be flow between a source and a drain of a transistor, increasing the on-state current of the transistor.

The s-channel structure, because of its high on-state current, is suitable for a semiconductor device such as large-scale integration (LSI) which requires a miniaturized transistor. A semiconductor device including the miniaturized transistor can have a high integration degree and high density.

In the transistor 400a, a region serving as a gate electrode is formed so as to fill an opening formed in the insulating film 405 or the like, that is, in a self-aligned manner.

As shown in FIG. 20B, the conductive films 411 and 422 have a region where they overlap with each other with the insulating film positioned therebetween. The conductive films 411 and 423 also have a region where they overlap with each other with the insulating film positioned therebetween. These regions serve as the parasitic capacitance caused between the gate electrode and the source or drain electrode and might decrease the operation speed of the transistor 400a. This parasitic capacitance can be reduced by providing the insulating film 405 in the transistor 400a. The insulating film 405 preferably contains a material with a low relative dielectric constant.

Figure 21A:
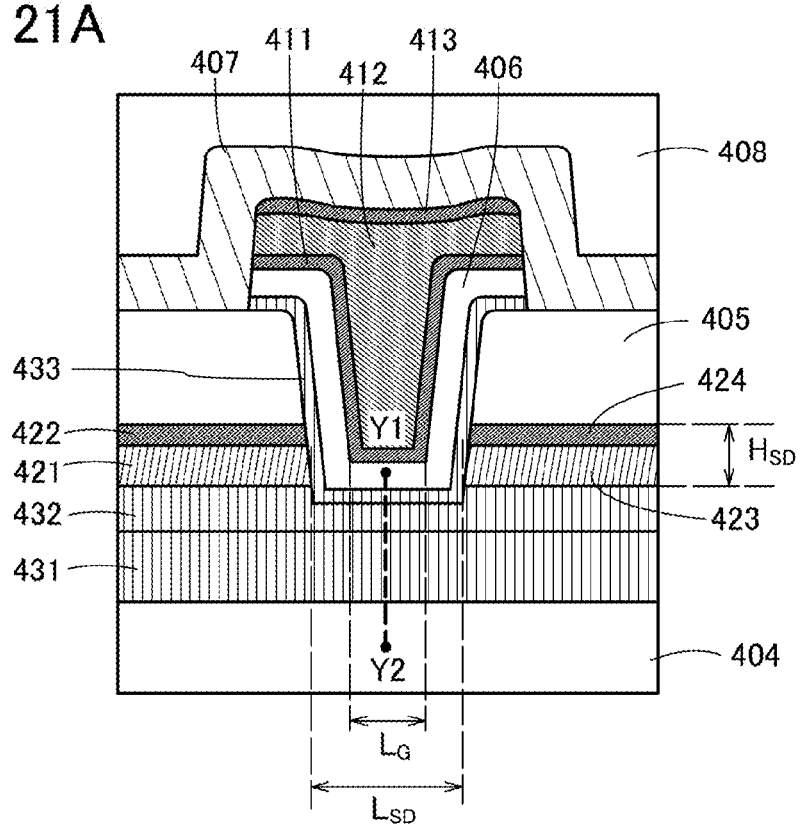
FIGS. 21A and 21B are a cross-sectional view and an energy band diagram showing a structural example of a transistor.

FIG. 21A is an enlarged view of the center of the transistor 400a. In FIG. 21A, a width $L_G$ denotes the length of the bottom surface of the conductive film 411, which faces in parallel with the top surface of the metal oxide 432 with the insulating film 406 and the metal oxide 433 positioned therebetween. The width $L_G$ is the line width of the gate electrode. In FIG. 21A, a width $L_{SD}$ denotes the length between the conductive films 421 and 423, i.e., the length between the source electrode and the drain electrode.

The width $L_{SD}$ is generally determined by the minimum feature size. As shown in FIG. 21A, the width $L_G$ is narrower than the width $L_{SD}$. This means that in the transistor 400a, the line width of the gate electrode can be made narrower than the minimum feature size; specifically, the width $L_G$ can be greater than or equal to 5 nm and less than or equal to 60 nm, preferably greater than or equal to 5 nm and less than or equal to 30 nm.

In FIG. 21A, a height $H_{SD}$ denotes the total thickness of the conductive films 421 and 422, or the total thickness of the conductive films 423 and 424.

The thickness of the insulating film 406 is preferably less than or equal to the height $H_{SD}$, in which case the electric field of the gate electrode can be applied to the entire channel formation region. The thickness of the insulating film 406 is less than or equal to 30 nm, preferably less than or equal to 10 nm.

The parasitic capacitance between the conductive films 422 and 411 and the parasitic capacitance between the conductive films 424 and 411 are inversely proportional to the thickness of the insulating film 405. For example, the thickness of the insulating film 405 is preferably three times or more, and further preferably five times or more the thickness of the insulating film 406, in which case the parasitic capacitance is negligibly small. As a result, the transistor 400a can operate at high frequencies.

Components of the transistor 400a will be described below.

<Metal Oxide Layer>

First, a metal oxide that can be used as the metal oxides 431 to 433 will be described.

The transistor 400a preferably has a low current (off-state current) flowing between a source and a drain in the non-conduction state. Examples of the transistor with a low off-state current include a transistor including an oxide semiconductor in a channel formation region.

The metal oxide 432 is an oxide semiconductor containing indium (In), for example. The metal oxide 432 can have high carrier mobility (electron mobility) by containing indium, for example. The metal oxide 432 preferably contains an element M. The element M is preferably aluminum (Al), gallium (Ga), yttrium (Y), tin (Sn), or the like. Other elements that can be used as the element M are boron (B), silicon (Si), titanium (Ti), iron (Fe), nickel (Ni), germanium (Ge), zirconium (Zr), molybdenum (Mo), lanthanum (La), cerium (Ce), neodymium (Nd), hafnium (Hf), tantalum (Ta), tungsten (W), and the like. Note that two or more of these elements may be used in combination as the element M. The element M is an element having high bonding energy with oxygen, for example. The element M is an element whose bonding energy with oxygen is higher than that of indium, for example. The element M is an element that can increase the energy gap of the metal oxide, for example. Furthermore, the metal oxide 432 preferably contains zinc (Zn). When containing zinc, the metal oxide is easily crystallized in some cases.

Note that the metal oxide 432 is not limited to the oxide semiconductor containing indium. The metal oxide 432 may be an oxide semiconductor that does not contain indium and contains at least one of zinc, gallium, and tin (e.g., a zinc tin oxide or a gallium tin oxide).

For the metal oxide 432, an oxide semiconductor with a wide energy gap is used, for example. The energy gap of the metal oxide 432 is, for example, greater than or equal to 2.5 eV and less than or equal to 4.2 eV, preferably greater than or equal to 2.8 eV and less than or equal to 3.8 eV, more preferably greater than or equal to 3 eV and less than or equal to 3.5 eV.

The metal oxide 432 is preferably a CAAC-OS film which is described later.

The metal oxides 431 and 433 include, for example, one or more, or two or more elements other than oxygen included in the metal oxide 432. Since the metal oxides 431 and 433 include one or more, or two or more elements other than oxygen included in the metal oxide 432, an interface state is less likely to be formed at an interface between the metal oxides 431 and 432 and an interface between the metal oxides 432 and 433.

In the case of using an In-M-Zn oxide as the metal oxide 431, when the total proportion of In and M is assumed to be 100 atomic %, the proportions of In and M are preferably set to be lower than 50 atomic % and higher than 50 atomic %, respectively, more preferably lower than 25 atomic % and higher than 75 atomic %, respectively. When the metal oxide 431 is formed by a sputtering method, a sputtering target with the above composition is preferably used. For example, In:M:Zn is preferably 1:3:2 or 1:3:4.

In the case of using an In-M-Zn oxide as the metal oxide 432, when the total proportion of In and M is assumed to be 100 atomic %, the proportions of In and M are preferably set to be higher than 25 atomic % and lower than 75 atomic %, respectively, more preferably higher than 34 atomic % and lower than 66 atomic %, respectively. When the metal oxide 432 is formed by a sputtering method, a sputtering target with the above composition is preferably used. For example, In:M:Zn is preferably 1:1:1, 1:1:1.2, 2:1:3, 3:1:2, or 4:2:4.1. In particular, when a sputtering target with an atomic ratio of In to Ga and Zn of 4:2:4.1 is used, the atomic ratio of In to Ga and Zn in the metal oxide 432 may be 4:2:3 or in the neighborhood of 4:2:3.

In the case of using an In-M-Zn oxide as the metal oxide 433, when the total proportion of In and M is assumed to be 100 atomic %, the proportions of In and M are preferably set to be lower than 50 atomic % and higher than 50 atomic %, respectively, more preferably lower than 25 atomic % and higher than 75 atomic %, respectively. For example, In:M:Zn is preferably 1:3:2 or 1:3:4. The metal oxide 433 may be a metal oxide that is the same type as that of the metal oxide 431.

The metal oxide 431 or the metal oxide 433 does not necessarily contain indium in some cases. For example, the metal oxide 431 or the metal oxide 433 may be gallium oxide.

Figure 21B:
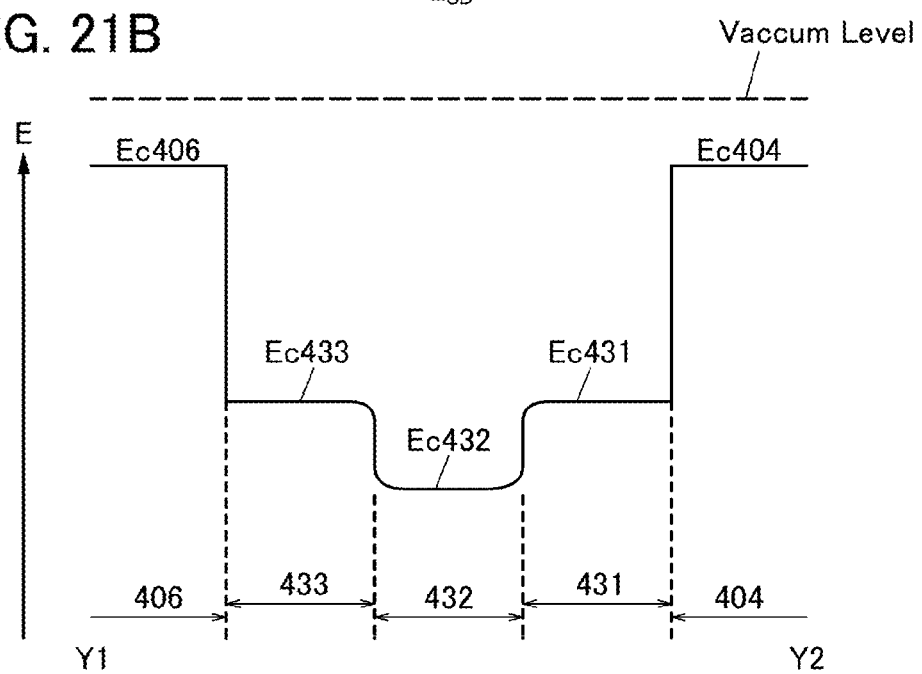

The function and effect of the metal oxide 430, which includes a stack of the metal oxides 431 to 433, are described with reference to the energy band diagram of FIG. 21B. FIG. 21B shows an energy band structure of a portion taken along dashed line Y1-Y2 in FIG. 21A, that is, the energy band structure of a channel formation region of the transistor 400a and the vicinity thereof.

In FIG. 21B, Ec404, Ec431, Ec432, Ec433, and Ec406 indicate the energy at the bottom of the conduction band of the insulating film 404, the metal oxide 431, the metal oxide 432, the metal oxide 433, and the insulating film 406, respectively.

Here, a difference in energy between the vacuum level and the bottom of the conduction band (the difference is also referred to as electron affinity) corresponds to a value obtained by subtracting an energy gap from a difference in energy between the vacuum level and the top of the valence band (the difference is also referred to as an ionization potential). Note that the energy gap can be measured using a spectroscopic ellipsometer. The energy difference between the vacuum level and the top of the valence band can be measured using an ultraviolet photoelectron spectroscopy (UPS) device.

Since the insulating films 404 and 406 are insulators, Ec406 and Ec404 are closer to the vacuum level (i.e., have a lower electron affinity) than Ec431, Ec432, and Ec433.

The metal oxide 432 is a metal oxide having higher electron affinity than those of the metal oxides 431 and 433. For example, as the metal oxide 432, a metal oxide having an electron affinity higher than those of the metal oxides 431 and 433 by greater than or equal to 0.07 eV and less than or equal to 1.3 eV, preferably greater than or equal to 0.1 eV and less than or equal to 0.7 eV, more preferably greater than or equal to 0.15 eV and less than or equal to 0.4 eV is used. Note that the electron affinity is an energy gap between the vacuum level and the bottom of the conduction band.

An indium gallium oxide has low electron affinity and a high oxygen-blocking property. Therefore, the metal oxide 433 preferably includes an indium gallium oxide. The gallium atomic ratio [Ga/(In+Ga)] is, for example, higher than or equal to 70%, preferably higher than or equal to 80%, more preferably higher than or equal to 90%.

At this time, when gate voltage is applied, a channel is formed in the metal oxide 432 having the highest electron affinity among the metal oxides 431 to 433.

At this time, electrons move mainly in the metal oxide 432, not in the metal oxides 431 and 433. Hence, the on-state current hardly varies even when the interface state density, which inhibits electron movement, is high at the interface between the metal oxide 431 and the insulating film 404 or at the interface between the metal oxide 433 and the insulating film 406. The metal oxides 431 and 433 have a function as an insulating film.

In some cases, there is a mixed region of the metal oxides 431 and 432 between the metal oxides 431 and 432. Furthermore, in some cases, there is a mixed region of the metal oxides 432 and 433 between the metal oxides 432 and 433. Because the mixed region has a low interface state density, a stack of the metal oxides 431 to 433 has a band structure where energy at each interface and in the vicinity of the interface is changed continuously (continuous junction).

As described above, the interface between the metal oxides 431 and 432 or the interface between the metal oxides 432 and 433 has a low interface state density. Hence, electron movement in the metal oxide 432 is less likely to be inhibited and the on-sate current of the transistor can be increased.

Electron movement in the transistor is inhibited, for example, in the case where physical unevenness in a channel formation region is large. To increase the on-state current of the transistor, for example, root mean square (RMS) roughness with a measurement area of 1 µm×1 µm of a top surface or a bottom surface of the metal oxide 432 (a formation surface; here, the top surface of the metal oxide 431) is less than 1 nm, preferably less than 0.6 nm, more preferably less than 0.5 nm, still more preferably less than 0.4 nm. The average surface roughness (Ra) with the measurement area of 1 µm×1 µm is less than 1 nm, preferably less than 0.6 nm, more preferably less than 0.5 nm, still more preferably less than 0.4 nm. The maximum difference (P-V) with the measurement area of 1 µm×1 µm is less than 10 nm, preferably less than 9 nm, more preferably less than 8 nm, still more preferably less than 7 nm. The RMS roughness, Ra, and P-V can be measured with, for example, a scanning probe microscope SPA-500 manufactured by SII Nano Technology Inc.

The electron movement is also inhibited in the case where the density of defect states is high in the channel formation region. For example, in the case where the metal oxide 432 contains oxygen vacancies ($V_O$), donor levels are formed by entry of hydrogen into sites of oxygen vacancies in some cases. A state in which hydrogen enters sites of oxygen vacancies is denoted by $V_OH$ in the following description in some cases. $V_OH$ is a factor of decreasing the on-state current of the transistor because $V_OH$ scatters electrons. Note that sites of oxygen vacancies become more stable by entry of oxygen than by entry of hydrogen. Thus, by decreasing oxygen vacancies in the metal oxide 432, the on-state current of the transistor can be increased in some cases.

For example, at a certain depth in the metal oxide 432 or in a certain region of the metal oxide 432, the concentration of hydrogen measured by secondary ion mass spectrometry (SIMS) is set to be higher than or equal to $1 \times 10^{16}$ atoms/cm$^3$ and lower than or equal to $2 \times 10^{20}$ atoms/cm$^3$, preferably higher than or equal to $1 \times 10^{16}$ atoms/cm$^3$ and lower than or equal to $5\times10^{19}$ atoms/cm$^3$, more preferably higher than or equal to $1\times10^{16}$ atoms/cm$^3$ and lower than or equal to $1\times10^{19}$ atoms/cm$^3$, still more preferably higher than or equal to $1\times10^{16}$ atoms/cm$^3$ and lower than or equal to $5\times10^{18}$ atoms/cm$^3$.

To decrease oxygen vacancies in the metal oxide 432, for example, there is a method in which excess oxygen contained in the insulating film 404 is moved to the metal oxide 432 through the metal oxide 431. In that case, the metal oxide 431 is preferably a layer having an oxygen-transmitting property (a layer through which oxygen is transmitted).

Note that in the case where the transistor has an s-channel structure, a channel is formed in the entire metal oxide 432. Therefore, as the metal oxide 432 has larger thickness, a channel region becomes larger. In other words, the thicker the metal oxide 432 is, the larger the on-state current of the transistor is.

Moreover, the thickness of the metal oxide 433 is preferably as small as possible to increase the on-state current of the transistor. For example, the metal oxide 433 has a region with a thickness of less than 10 nm, preferably less than or equal to 5 nm, more preferably less than or equal to 3 nm. Meanwhile, the metal oxide 433 has a function of blocking entry of elements other than oxygen (such as hydrogen and silicon) included in the adjacent insulator into the metal oxide 432 where a channel is formed. Thus, the metal oxide 433 preferably has a certain thickness. For example, the metal oxide 433 may have a region with a thickness of greater than or equal to 0.3 nm, preferably greater than or equal to 1 nm, more preferably greater than or equal to 2 nm. The metal oxide 433 preferably has an oxygen blocking property to inhibit outward diffusion of oxygen released from the insulating film 404 and the like.

To improve reliability, preferably, the thickness of the metal oxide 431 is large and the thickness of the metal oxide 433 is small. For example, the metal oxide 431 has a region with a thickness of greater than or equal to 10 nm, preferably greater than or equal to 20 nm, more preferably greater than or equal to 40 nm, still more preferably greater than or equal to 60 nm. An increase in the thickness of the metal oxide 431 can increase the distance from the interface between the adjacent insulator and the metal oxide 431 to the metal oxide 432 where a channel is formed. Note that the metal oxide 431 has a region with a thickness of, for example, less than or equal to 200 nm, preferably less than or equal to 120 nm, more preferably less than or equal to 80 nm, otherwise the productivity of the semiconductor device might be decreased.

For example, a region in which the concentration of silicon is higher than or equal to $1\times10^{16}$ atoms/cm$^3$ and lower than $1\times10^{19}$ atoms/cm$^3$ is provided between the metal oxides 432 and 431. The concentration of silicon is preferably higher than or equal to $1\times10^{16}$ atoms/cm$^3$ and lower than $5\times10^{18}$ atoms/cm$^3$, more preferably higher than or equal to $1\times10^{16}$ atoms/cm$^3$ and lower than $2\times10^{18}$ atoms/cm$^3$. A region in which the concentration of silicon is higher than or equal to $1\times10^{16}$ atoms/cm$^3$ and lower than $1\times10^{19}$ atoms/cm$^3$ is provided between the metal oxides 432 and 433. The concentration of silicon is preferably higher than or equal to $1\times10^{16}$ atoms/cm$^3$ and lower than or equal to $5\times10^{18}$ atoms/cm$^3$, more preferably higher than or equal to $1\times10^{16}$ atoms/cm$^3$ and lower than $2\times10^{18}$ atoms/cm$^3$. The concentration of silicon can be measured by SIMS.

It is preferable to reduce the concentration of hydrogen in the metal oxides 431 and 433 in order to reduce the concentration of hydrogen in the metal oxide 432. The metal oxides 431 and 433 each have a region in which the concentration of hydrogen is higher than or equal to $1\times10^{16}$ atoms/cm$^3$ and lower than or equal to $2\times10^{20}$ atoms/cm$^3$. The concentration of hydrogen is preferably higher than or equal to $1\times10^{16}$ atoms/cm$^3$ and lower than or equal to $5\times10^{19}$ atoms/cm$^3$, more preferably higher than or equal to $1\times10^{16}$ atoms/cm$^3$ and lower than or equal to $1\times10^{19}$ atoms/cm$^3$, still more preferably higher than or equal to $1\times10^{16}$ atoms/cm$^3$ and lower than or equal to $5\times10^{18}$ atoms/cm$^3$. The concentration of hydrogen can be measured by SIMS. It is also preferable to reduce the concentration of nitrogen in the metal oxides 431 and 433 in order to reduce the concentration of nitrogen in the metal oxide 432. The metal oxides 431 and 433 each have a region in which the concentration of nitrogen is higher than or equal to $1\times10^{16}$ atoms/cm$^3$ and lower than $5\times10^{19}$ atoms/cm$^3$. The concentration of nitrogen is preferably higher than or equal to $1\times10^{16}$ atoms/cm$^3$ and lower than or equal to $5\times10^{18}$ atoms/cm$^3$, more preferably higher than or equal to $1\times10^{16}$ atoms/cm$^3$ and lower than or equal to $1\times10^{18}$ atoms/cm$^3$, still more preferably higher than or equal to $1\times10^{16}$ atoms/cm$^3$ and lower than or equal to $5\times10^{17}$ atoms/cm$^3$. The concentration of nitrogen can be measured by SIMS.

The metal oxides 431 to 433 may be formed by a sputtering method, a chemical vapor deposition (CVD) method, a molecular beam epitaxy (MBE) method, a pulsed laser deposition (PLD) method, an atomic layer deposition (ALD) method, or the like.

After the metal oxides 431 and 432 are formed, first heat treatment is preferably performed. The first heat treatment can be performed at a temperature higher than or equal to 250° C. and lower than or equal to 650° C., preferably higher than or equal to 450° C. and lower than or equal to 600° C., further preferably higher than or equal to 520° C. and lower than or equal to 570° C. The first heat treatment is performed in an inert gas atmosphere or an atmosphere containing an oxidizing gas at 10 ppm or more, 1% or more, or 10% or more. The first heat treatment may be performed under a reduced pressure. Alternatively, the first heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate desorbed oxygen. The crystallinity of the metal oxides 431 and 432 can be increased by the first heat treatment. Furthermore, impurities such as hydrogen and water can be removed by the first heat treatment.

The above three-layer structure is an example. For example, a two-layer structure without the metal oxide 431 or 433 may be employed. Alternatively, any one of the metal oxides 431 to 433 may be provided over or below the metal oxide 431 or over or below the metal oxide 433, i.e., a four-layer structure may be employed. Further alternatively, an n-layer structure (n is an integer of 5 or more) in which any one of the metal oxides 431 to 433 is provided at two or more of the following positions may be employed: over the metal oxide 431, below the metal oxide 431, over the metal oxide 433, and below the metal oxide 433.

<Substrate>

As the substrate 450, for example, an insulator substrate, a semiconductor substrate, or a conductor substrate may be used. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a semiconductor substrate of silicon, germanium, or the like, and a compound semiconductor substrate of silicon carbide, silicon germanium, gallium arsenide, indium phosphide, zinc oxide, or gallium oxide. The semiconductor substrate may be a silicon on insulator (SOI) substrate in which an insulating region is provided in the above semiconductor substrate. Examples of the conductor substrate include a graphite substrate, a metal substrate, an alloy substrate, and a conductive resin substrate. A substrate including a metal nitride, a substrate including a metal oxide, or the like can also be used. An insulator substrate provided with a conductor or a semiconductor, a semiconductor substrate provided with a conductor or an insulator, a conductor substrate provided with a semiconductor or an insulator, or the like can be used. Alternatively, any of these substrates over which an element is provided may be used. Examples of the element provided over the substrate include a capacitor, a resistor, a switching element, a light-emitting element, and a memory element.

A flexible substrate may be used as the substrate 450. As a method for providing a transistor over a flexible substrate, there is a method in which a transistor is formed over a non-flexible substrate, and then the transistor is separated and transferred to the substrate 450 that is a flexible substrate. In that case, a separation layer is preferably provided between the non-flexible substrate and the transistor. As the substrate 450, a sheet, a film, or foil containing a fiber may be used. The substrate 450 may have elasticity. The substrate 450 may have a property of returning to its original shape when bending or pulling is stopped. Alternatively, the substrate 450 may have a property of not returning to its original shape. The thickness of the substrate 450 is, for example, greater than or equal to 5 μm and less than or equal to 700 μm, preferably greater than or equal to 10 μm and less than or equal to 500 μm, more preferably greater than or equal to 15 μm and less than or equal to 300 μm. When the substrate 450 has small thickness, the weight of the semiconductor device can be reduced. When the substrate 450 has small thickness, even in the case of using glass or the like, the substrate 450 may have elasticity or a property of returning to its original shape when bending or pulling is stopped. Therefore, an impact applied to the semiconductor device over the substrate 450, which is caused by dropping or the like, can be reduced. That is, a durable semiconductor device can be provided.

For the flexible substrate 450, metal, an alloy, a resin, glass, or fiber thereof can be used, for example. The flexible substrate 450 preferably has a lower coefficient of linear expansion because deformation due to an environment is suppressed. The flexible substrate 450 is preferably formed using, for example, a material whose coefficient of linear expansion is lower than or equal to $1 \times 10^{-3}$/K, lower than or equal to $5 \times 10^{-5}$/K, or lower than or equal to $1 \times 10^{-5}$/K. Examples of the resin include polyester, polyolefin, polyamide (e.g., nylon or aramid), polyimide, polycarbonate, acrylic, and polytetrafluoroethylene (PTFE). In particular, aramid is preferably used as the material of the flexible substrate 450 because of its low coefficient of linear expansion.

<Base Insulating Film>

The insulating film 401 has a function of electrically isolating the substrate 450 from the conductive film 414.

The insulating film 401 or 402 is formed using an insulating film having a single-layer structure or a layered structure. Examples of the material of an insulating film include aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

The insulating film 402 may be formed using silicon oxide with high step coverage which is formed by reacting tetraethyl orthosilicate (TEOS), silane, or the like with oxygen, nitrous oxide, or the like.

After the insulating film 402 is formed, the insulating film 402 may be subjected to planarization treatment using a CMP method or the like to improve the planarity of the top surface thereof.

The insulating film 404 preferably contains an oxide. In particular, the insulating film 404 preferably contains an oxide material from which part of oxygen is released by heating. The insulating film 404 preferably contains an oxide containing oxygen more than that in the stoichiometric composition. Part of oxygen is released by heating from an oxide film containing oxygen more than that in the stoichiometric composition. Oxygen released from the insulating film 404 is supplied to the metal oxide 430, so that oxygen vacancies in the metal oxide 430 can be reduced. Consequently, changes in the electrical characteristics of the transistor can be reduced and the reliability of the transistor can be improved.

The oxide film containing oxygen more than that in the stoichiometric composition is an oxide film of which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in thermal desorption spectroscopy (TDS) analysis. Note that the temperature of the film surface in the TDS analysis is preferably higher than or equal to 100° C. and lower than or equal to 700° C., or higher than or equal to 100° C. and lower than or equal to 500° C.

The insulating film 404 preferably contains an oxide that can supply oxygen to the metal oxide 430. For example, a material containing silicon oxide or silicon oxynitride is preferably used.

Alternatively, a metal oxide such as aluminum oxide, aluminum oxynitride, gallium oxide, gallium oxynitride, yttrium oxide, yttrium oxynitride, hafnium oxide, or hafnium oxynitride may be used for the insulating film 404.

To make the insulating film 404 contain excess oxygen, the insulating film 404 is formed in an oxygen atmosphere, for example. Alternatively, a region containing excess oxygen may be formed by introducing oxygen into the insulating film 404 that has been formed. Both the methods may be combined.

For example, oxygen (at least including any of oxygen radicals, oxygen atoms, and oxygen ions) may be introduced into the insulating film 404 that has been formed, so that a region containing excess oxygen is formed. Oxygen can be introduced by, for example, an ion implantation method, an ion doping method, a plasma immersion ion implantation method, plasma treatment, or the like.

A gas containing oxygen can be used for oxygen introducing treatment. Examples of the gas containing oxygen include oxygen, nitrous oxide, nitrogen dioxide, carbon dioxide, and carbon monoxide. Furthermore, a rare gas may be included in the gas containing oxygen for the oxygen introducing treatment. Moreover, hydrogen or the like may be included. For example, a mixed gas of carbon dioxide, hydrogen, and argon may be used.

After the insulating film 404 is formed, the insulating film 404 may be subjected to planarization treatment using a CMP method or the like to improve the planarity of the top surface thereof.

The insulating film 403 has a passivation function of preventing oxygen contained in the insulating film 404 from decreasing by bonding to metal contained in the conductive film 414.

The insulating film 403 has a function of blocking oxygen, hydrogen, water, alkali metal, alkaline earth metal, and the like. Providing the insulating film 403 can prevent outward diffusion of oxygen from the metal oxide 430 and entry of hydrogen, water, or the like into the metal oxide 430 from the outside.

The insulating film 403 can be, for example, a nitride insulating film. The nitride insulating film is formed using silicon nitride, silicon nitride oxide, aluminum nitride, aluminum nitride oxide, or the like. Note that instead of the nitride insulating film, an oxide insulating film having a blocking effect against oxygen, hydrogen, water, and the like may be provided. Examples of the oxide insulating film include an aluminum oxide film, an aluminum oxynitride film, a gallium oxide film, a gallium oxynitride film, an yttrium oxide film, an yttrium oxynitride film, a hafnium oxide film, and a hafnium oxynitride film.

The threshold voltage of the transistor 400a can be controlled by injecting electrons into a charge trap layer. The charge trap layer is preferably provided in the insulating film 402 or the insulating film 403. For example, when the insulating film 403 is formed using hafnium oxide, aluminum oxide, tantalum oxide, aluminum silicate, or the like, the insulating film 403 can function as a charge trap layer.

<Gate Electrode>

The conductive films 411 to 414 each preferably have a single-layer structure or a layered structure of a conductive film containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), platinum (Pt), iridium (Ir), and strontium (Sr), an alloy of such a low-resistance material, or a compound containing such a material as its main component. It is particularly preferable to use a high-melting-point material which has both heat resistance and conductivity, such as tungsten or molybdenum. In addition, the conductive film is preferably formed using a low-resistance conductive material such as aluminum or copper. The conductive film is more preferably formed using a Cu—Mn alloy, in which case manganese oxide formed at the interface with an insulator containing oxygen has a function of preventing Cu diffusion.

<Source Electrode and Drain Electrode>

The conductive films 421 to 424 each preferably have a single-layer structure or a layered structure of a conductive film containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), platinum (Pt), iridium (Ir), and strontium (Sr), an alloy of such a low-resistance material, or a compound containing such a material as its main component. It is particularly preferable to use a high-melting-point material which has both heat resistance and conductivity, such as tungsten or molybdenum. In addition, the conductive film is preferably formed using a low-resistance conductive material such as aluminum or copper. The conductive film is more preferably formed using a Cu—Mn alloy, in which case manganese oxide formed at the interface with an insulator containing oxygen has a function of preventing Cu diffusion.

The conductive films 421 to 424 are preferably formed using a conductive oxide including noble metal, such as iridium oxide, ruthenium oxide, or strontium ruthenate. Such a conductive oxide hardly takes oxygen from an oxide semiconductor even when it is in contact with the oxide semiconductor and hardly generates oxygen vacancies in the oxide semiconductor.

<Low-Resistance Region>

The regions 441 and 442 are formed when, for example, the conductive films 421 and 423 take oxygen from the metal oxides 431 and 432. Oxygen is more likely to be extracted at higher temperatures. Oxygen vacancies are formed in the regions 441 and 442 through several heating steps in the manufacturing process of the transistor. In addition, hydrogen enters sites of the oxygen vacancies by heating, increasing the carrier concentration in the regions 441 and 442. As a result, the resistance of the regions 441 and 442 is reduced.

<Gate Insulating Film>

The insulating film 406 preferably contains an insulator with a high relative dielectric constant. For example, the insulating film 406 preferably contains gallium oxide, hafnium oxide, an oxide containing aluminum and hafnium, oxynitride containing aluminum and hafnium, an oxide containing silicon and hafnium, or oxynitride containing silicon and hafnium.

The insulating film 406 preferably has a layered structure containing silicon oxide or silicon oxynitride and an insulator with a high relative dielectric constant. Because silicon oxide and silicon oxynitride have thermal stability, combination of silicon oxide or silicon oxynitride with an insulator with a high relative dielectric constant allows the layered structure to be thermally stable and have a high relative dielectric constant. For example, when aluminum oxide, gallium oxide, or hafnium oxide is closer to the metal oxide 433, entry of silicon from silicon oxide or silicon oxynitride into the metal oxide 432 can be suppressed.

When silicon oxide or silicon oxynitride is closer to the metal oxide 433, for example, trap centers might be formed at the interface between aluminum oxide, gallium oxide, or hafnium oxide and silicon oxide or silicon oxynitride. The trap centers can shift the threshold voltage of the transistor in the positive direction by trapping electrons in some cases.

<Interlayer Insulating Film and Protective Insulating Film>

The insulating film 405 preferably contains an insulator with a low relative dielectric constant. For example, the insulating film 405 preferably contains silicon oxide, silicon oxynitride, silicon nitride oxide, silicon nitride, or a resin. Alternatively, the insulating film 405 preferably has a layered structure containing silicon oxide or silicon oxynitride and a resin. Because silicon oxide and silicon oxynitride have thermal stability, combination of silicon oxide or silicon oxynitride with a resin allows the layered structure to be thermally stable and have a low relative dielectric constant. Examples of the resin include polyester, polyolefin, polyamide (e.g., nylon or aramid), polyimide, polycarbonate, and acrylic.

The insulating film 407 has a function of blocking oxygen, hydrogen, water, alkali metal, alkaline earth metal, and the like. Providing the insulating film 407 can prevent outward diffusion of oxygen from the metal oxide 430 and entry of hydrogen, water, or the like into the metal oxide 430 from the outside.

The insulating film 407 can be, for example, a nitride insulating film. The nitride insulating film is formed using silicon nitride, silicon nitride oxide, aluminum nitride, aluminum nitride oxide, or the like. Note that instead of the nitride insulating film, an oxide insulating film having a blocking effect against oxygen, hydrogen, water, and the like may be provided. Examples of the oxide insulating film include an aluminum oxide film, an aluminum oxynitride film, a gallium oxide film, a gallium oxynitride film, an yttrium oxide film, an yttrium oxynitride film, a hafnium oxide film, and a hafnium oxynitride film.

An aluminum oxide film is preferably used as the insulating film 407 because it is highly effective in preventing transmission of both oxygen and impurities such as hydrogen and moisture.

When the insulating film 407 is formed by a method using plasma containing oxygen, e.g., by a sputtering method or a CVD method, oxygen can be added to side and top surfaces of the insulating films 405 and 406. It is preferable to perform second heat treatment at any time after the formation of the insulating film 407. Through the second heat treatment, oxygen added to the insulating films 405 and 406 is diffused in the insulating films to reach the metal oxide 430, whereby oxygen vacancies in the metal oxide 430 can be reduced.

Figure 22A:
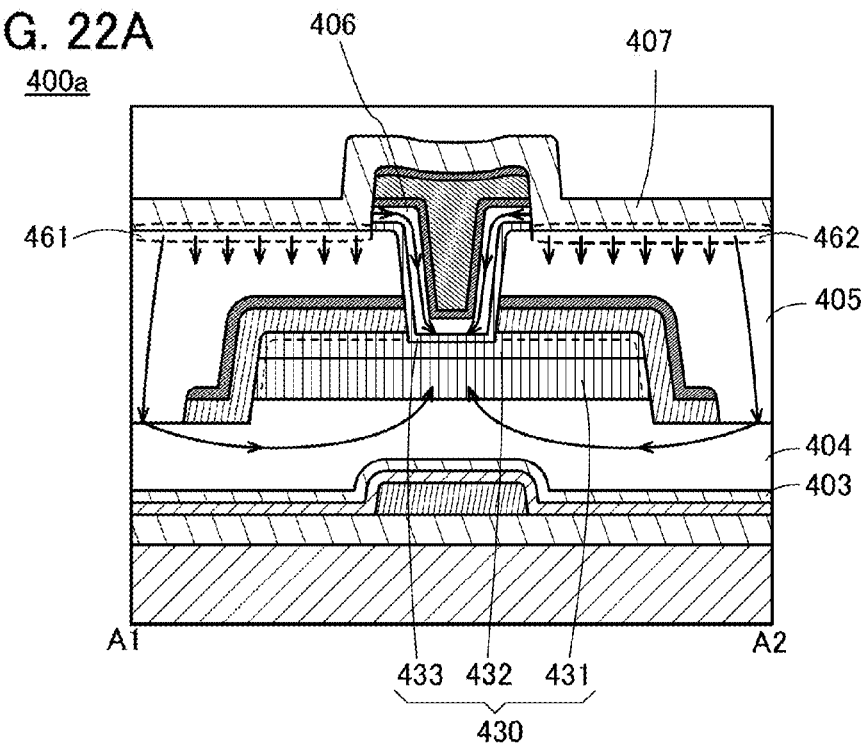
FIGS. 22A and 22B are cross-sectional views showing oxygen diffusion paths.
Figure 22B:
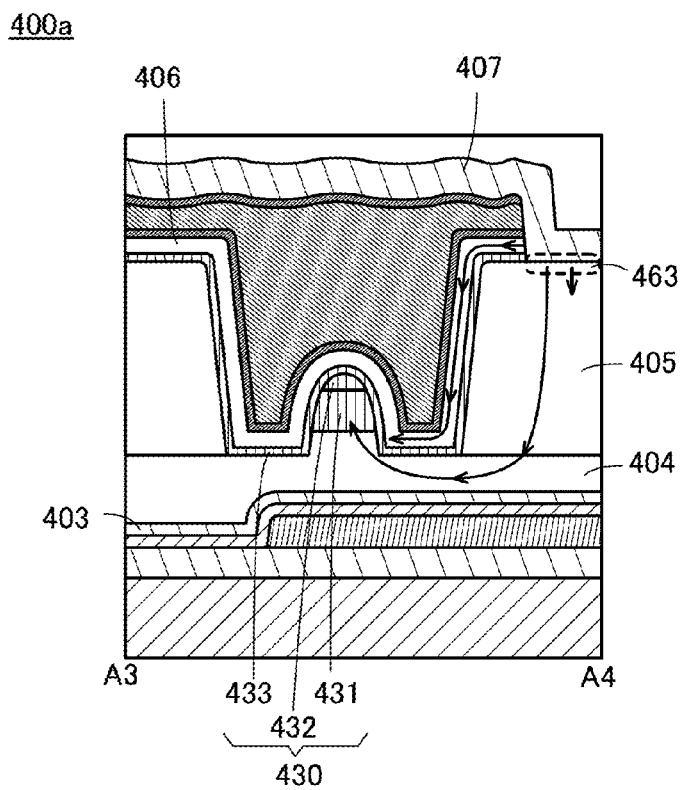

In schematic views of FIGS. 22A and 22B, oxygen added to the insulating films 405 and 406 in the formation of the insulating film 407 is diffused in the insulating films through the second heat treatment and reaches the metal oxide 430. In FIG. 22A, oxygen diffused in the cross-sectional view of FIG. 20B is indicated by arrows. In FIG. 22B, oxygen diffused in the cross-sectional view of FIG. 20C is indicated by arrows.

As shown in FIGS. 22A and 22B, oxygen added to the side surface of the insulating film 406 is diffused in the insulating film 406 and reaches the metal oxide 430. In addition, a region 461, a region 462, and a region 463 each containing excess oxygen are sometimes formed in the vicinity of the interface between the insulating films 407 and 405. Oxygen contained in the regions 461 to 463 reaches the metal oxide 430 through the insulating films 405 and 404. In the case where the insulating film 405 includes silicon oxide and the insulating film 407 includes aluminum oxide, a mixed layer of silicon, aluminum, and oxygen is formed in the regions 461 to 463 in some cases.

The insulating film 407 has a function of blocking oxygen and prevents oxygen from being diffused over the insulating film 407. The insulating film 403 also has a function of blocking oxygen and prevents oxygen from being diffused under the insulating film 403.

Note that the second heat treatment may be performed at a temperature that allows oxygen added to the insulating films 405 and 406 to be diffused to the metal oxide 430. For example, the description of the first heat treatment may be referred to for the second heat treatment. Alternatively, the temperature of the second heat treatment is preferably lower than that of the first heat treatment. The second heat treatment is preferably performed at a temperature lower than that of the first heat treatment by higher than or equal to 20° C. and lower than or equal to 150° C., preferably higher than or equal to 40° C. and lower than or equal to 100° C. Accordingly, superfluous release of oxygen from the insulating film 404 can be inhibited. Note that the second heat treatment is not necessarily performed when heating during formation of the films can work as heat treatment comparable to the second heat treatment.

As described above, oxygen can be supplied to the metal oxide 430 from above and below through the formation of the insulating film 407 and the second heat treatment.

Alternatively, oxygen can be added to the insulating films 405 and 406 by forming a film containing indium oxide, e.g., an In-M-Zn oxide, as the insulating film 407.

The insulating film 408 can be formed using an insulator including one or more kinds of materials selected from aluminum oxide, aluminum nitride oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. Alternatively, for the insulating film 408, a resin such as a polyimide resin, a polyamide resin, an acrylic resin, a siloxane resin, an epoxy resin, or a phenol resin can be used. The insulating film 408 may be a stack including any of the above materials.

<<Structure Example 2 of Transistor>>

The conductive film 414 and the insulating films 402 and 403 can be omitted in the transistor 400a shown in FIGS. 20A to 20C. An example of such a structure is shown in FIGS. 23A to 23C.

Figure 23A:
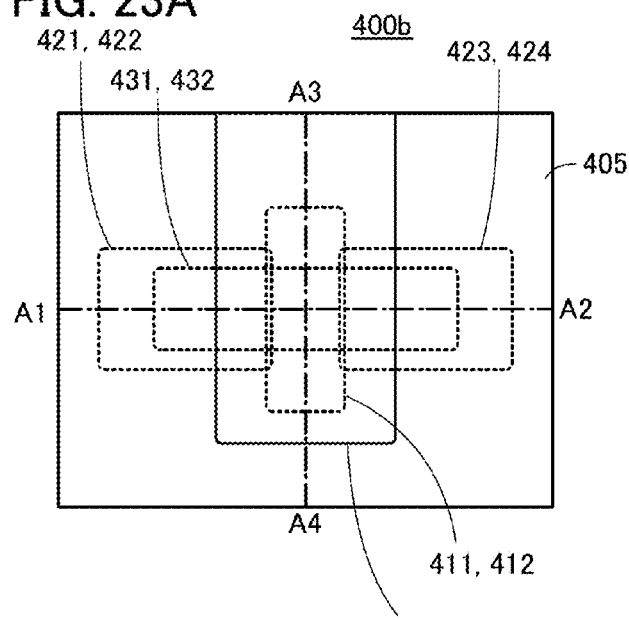
FIGS. 23A to 23C are a top view and cross-sectional views showing a structure example of a transistor.
Figure 23B:
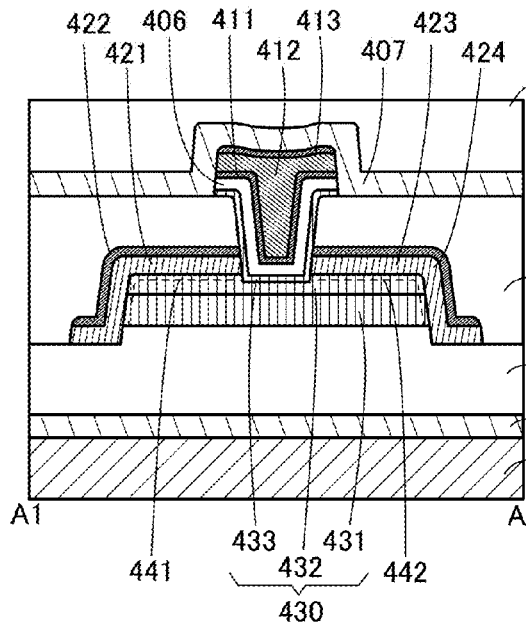
Figure 23C:
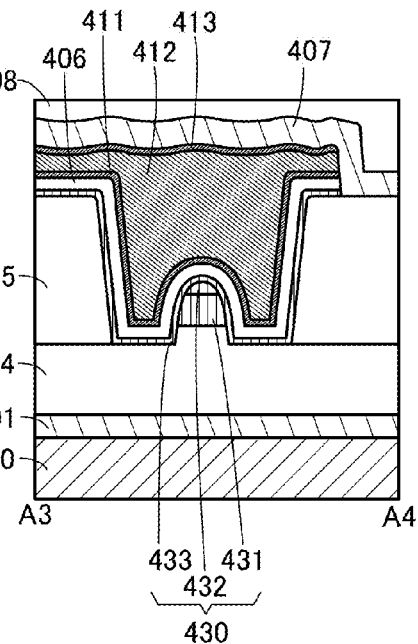

FIGS. 23A to 23C are a top view and cross-sectional views of a transistor 400b. FIG. 23A is a top view. FIG. 23B is a cross-sectional view taken along dashed-dotted line A1-A2 in FIG. 23A and FIG. 23C is a cross-sectional view taken along dashed-dotted line A3-A4 in FIG. 23A. Note that for simplification of the drawing, some components are not illustrated in the top view in FIG. 23A. Note that the dashed-dotted line A1-A2 and the dashed-dotted line A3-A4 are sometimes referred to as a channel length direction of the transistor 400b and a channel width direction of the transistor 400b, respectively.

<<Structure Example 3 of Transistor>>

In the transistor 400a shown in FIGS. 20A to 20C, parts of the conductive films 421 and 423 that overlap with the gate electrode (the conductive films 411 to 413) can be reduced in thickness. An example of such a structure is shown in FIGS. 24A to 24C.

Figure 24A:
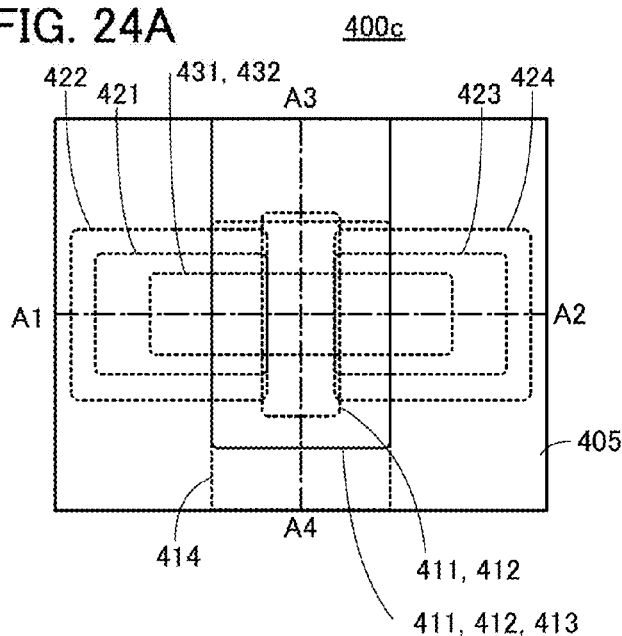
FIGS. 24A to 24C are a top view and cross-sectional views showing a structure example of a transistor.
Figure 24B:
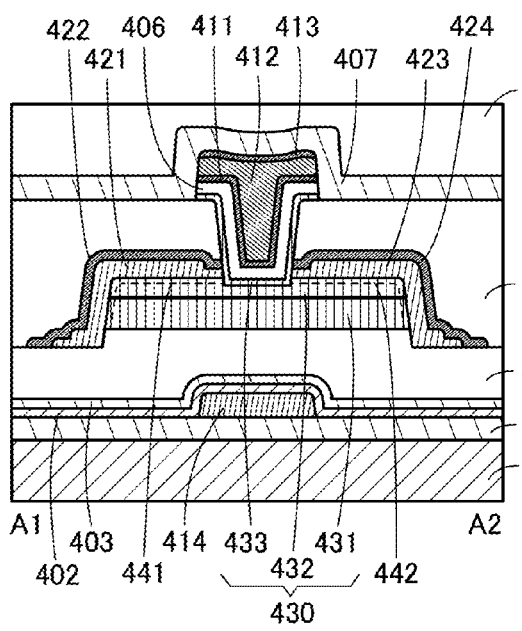
Figure 24C:
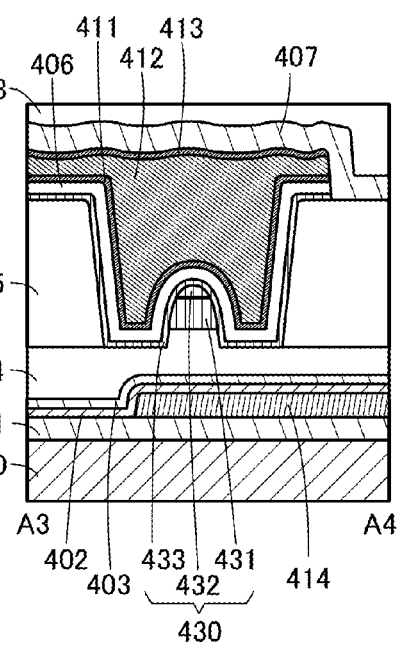

FIGS. 24A to 24C are a top view and cross-sectional views of a transistor 400c. FIG. 24A is a top view. FIG. 24B is a cross-sectional view taken along dashed-dotted line A1-A2 in FIG. 24A and FIG. 24C is a cross-sectional view taken along dashed-dotted line A3-A4 in FIG. 24A. Note that for simplification of the drawing, some components are not illustrated in the top view in FIG. 24A. Note that the dashed-dotted line A1-A2 and the dashed-dotted line A3-A4 are sometimes referred to as a channel length direction of the transistor 400c and a channel width direction of the transistor 400c, respectively.

In the transistor 400c shown in FIG. 24B, part of the conductive film 421 that overlaps with the gate electrode is reduced in thickness, and the conductive film 422 covers the conductive film 421. Part of the conductive film 423 that overlaps with the gate electrode is also reduced in thickness, and the conductive film 424 covers the conductive film 423.

The transistor 400c, which has the structure shown in FIG. 24B, can have an increased distance between the gate and source electrodes or between the gate and drain electrodes. This results in a reduction in the parasitic capacitance formed between the gate electrode and the source and drain electrodes. As a result, a transistor capable of high-speed operation can be obtained.

<<Structure Example 4 of Transistor>>

In the transistor 400c shown in FIGS. 24A to 24C, the width of the metal oxides 431 and 432 can be increased in the A3-A4 direction. An example of such a structure is shown in FIGS. 25A to 25C.

Figure 25A:
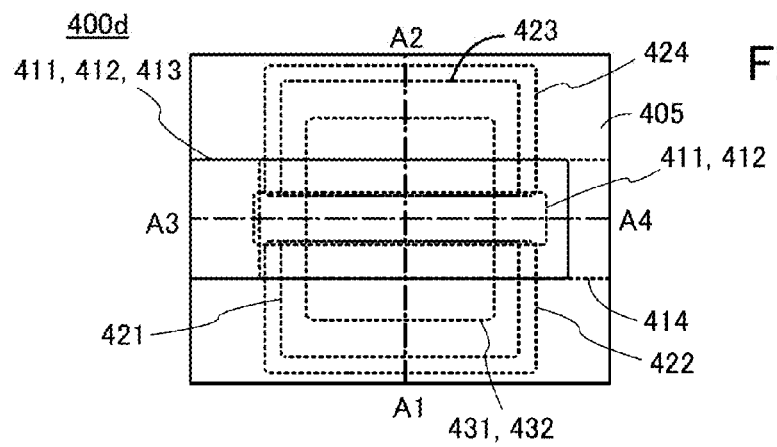
FIGS. 25A to 25C are a top view and cross-sectional views showing a structure example of a transistor.
Figure 25B:
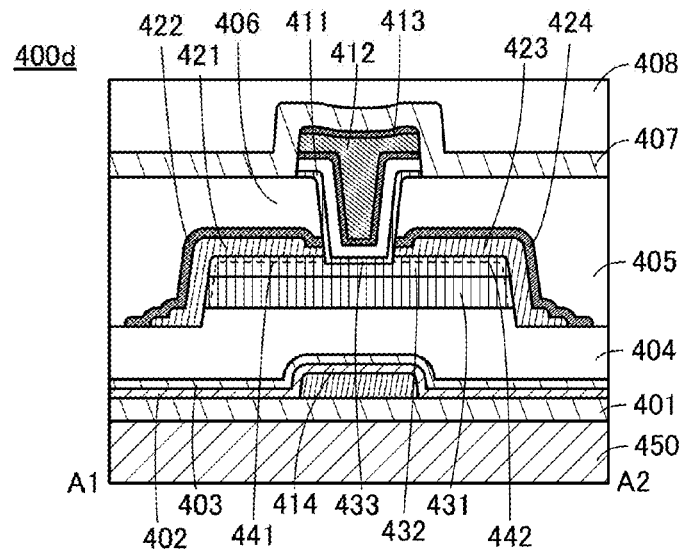
Figure 25C:
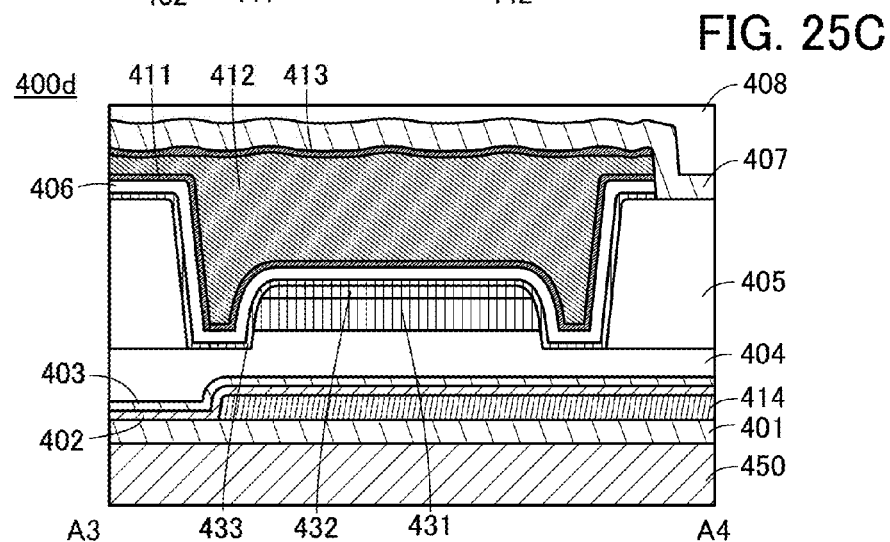

FIGS. 25A to 25C are a top view and cross-sectional views of a transistor 400d. FIG. 25A is a top view. FIG. 25B is a cross-sectional view taken along dashed-dotted line A1-A2 in FIG. 25A and FIG. 25C is a cross-sectional view taken along dashed-dotted line A3-A4 in FIG. 25A. Note that for simplification of the drawing, some components are not illustrated in the top view in FIG. 25A. Note that the dashed-dotted line A1-A2 and the dashed-dotted line A3-A4 are sometimes referred to as a channel length direction of the transistor 400*d* and a channel width direction of the transistor 400*d*, respectively.

The transistor 400*d*, which has the structure shown in FIGS. 25A to 25C, can have an increased on-state current.

<<Structure Example 5 of Transistor>>

In the transistor 400*c* shown in FIGS. 24A to 24C, a plurality of regions (fins) consisting of the metal oxides 431 and 432 may be provided in the A3-A4 direction. An example of such a structure is shown in FIGS. 26A to 26C.

Figure 26A:
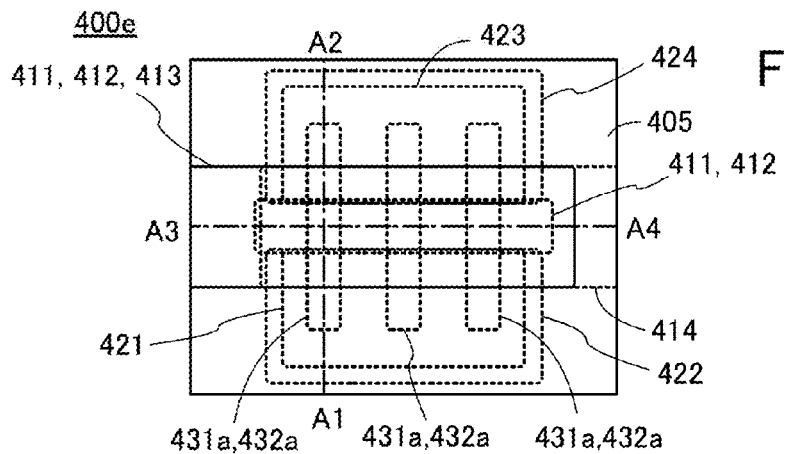
FIGS. 26A to 26C are a top view and cross-sectional views showing a structure example of a transistor.
Figure 26B:
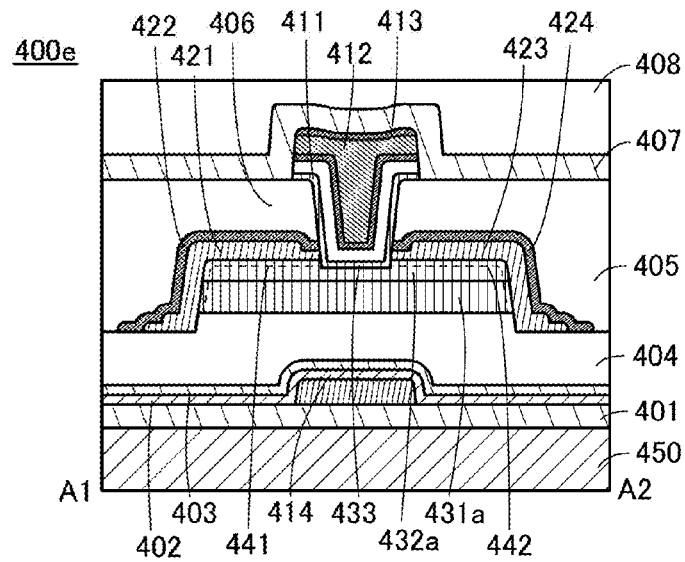
Figure 26C:
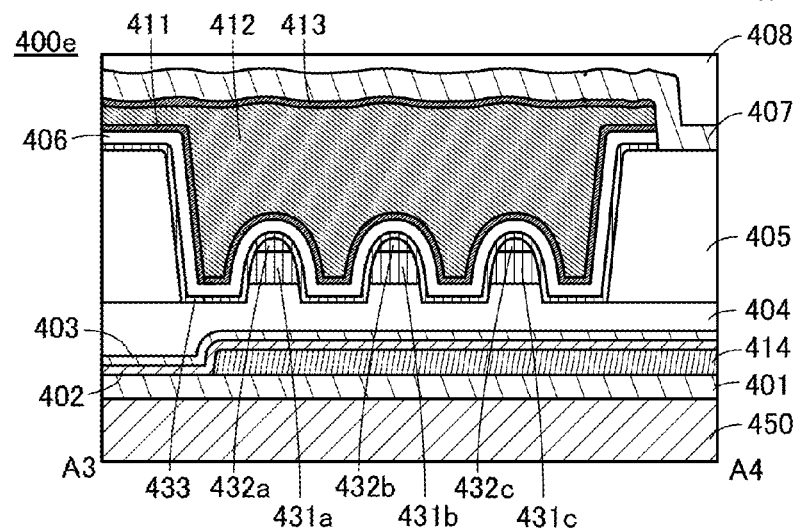

FIGS. 26A to 26C are a top view and cross-sectional views of a transistor 400*e*. FIG. 26A is a top view. FIG. 26B is a cross-sectional view taken along dashed-dotted line A1-A2 in FIG. 26A and FIG. 26C is a cross-sectional view taken along dashed-dotted line A3-A4 in FIG. 26A. Note that for simplification of the drawing, some components are not illustrated in the top view in FIG. 26A. Note that the dashed-dotted line A1-A2 and the dashed-dotted line A3-A4 are sometimes referred to as a channel length direction of the transistor 400*e* and a channel width direction of the transistor 400*e*, respectively.

The transistor 400*e* includes a first fin consisting of metal oxides 431*a* and 432*a*, a second fin consisting of metal oxides 431*b* and 432*b*, and a third fin consisting of metal oxides 431*c* and 432*c*.

In the transistor 400*e*, the metal oxides 432*a* to 432*c* where a channel is formed are surrounded by the gate electrode. Hence, a gate electric field can be applied to the entire channel, so that a transistor with a high on-state current can be obtained.

<<Structure Example 6 of Transistor>>

Figure 27A:
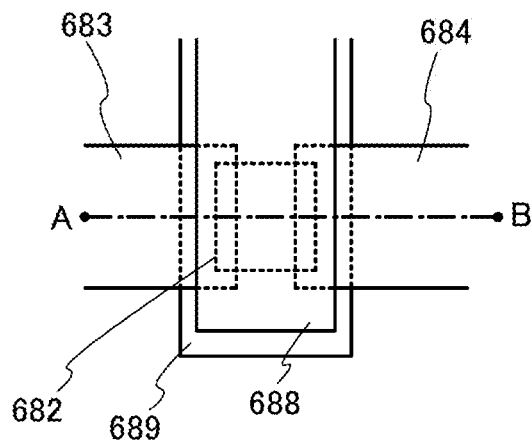
FIGS. 27A and 27B are a top view and a cross-sectional view showing a structure example of a transistor.
Figure 27B:
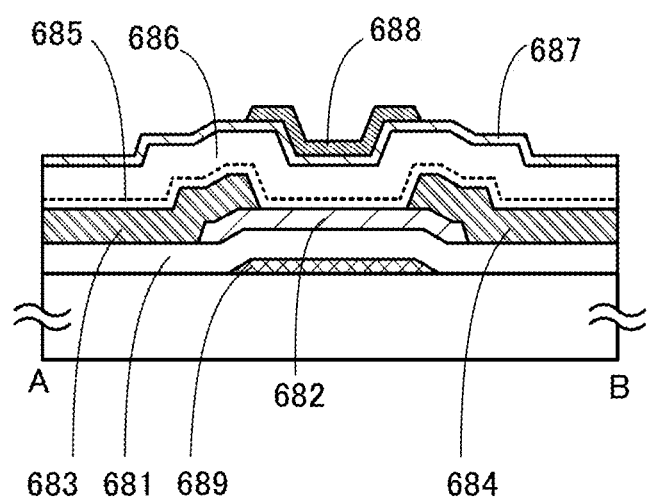

FIGS. 27A and 27B are a top view and a cross-sectional view of a transistor 680. FIG. 27A is a top view, and FIG. 27B is a cross-sectional view taken along dashed-dotted line A-B in FIG. 27A. Note that for simplification of the drawing, some components are increased or reduced in size, or omitted in FIGS. 27A and 27B. Note that the dashed-dotted line A-B is sometimes referred to as a channel length direction.

The transistor 680 shown in FIG. 27B includes a conductive film 689 serving as a first gate, a conductive film 688 serving as a second gate, a semiconductor 682, a conductive film 683 and a conductive film 684 serving as a source and a drain, an insulating film 681, an insulating film 685, an insulating film 686, and an insulating film 687.

The conductive film 689 is on an insulating surface. The conductive film 689 overlaps with the semiconductor 682 with the insulating film 681 provided therebetween. The conductive film 688 overlaps with the semiconductor 682 with the insulating films 685, 686, and 687 provided therebetween. The conductive films 683 and 684 are connected to the semiconductor 682.

The description of the conductive films 411 to 414 in FIGS. 20A to 20C can be referred to for the details of the conductive films 689 and 688.

The conductive films 689 and 688 may be supplied with different potentials, or may be supplied with the same potential at the same time. The conductive film 688 serving as a second gate electrode in the transistor 680 leads to stabilization of threshold voltage. Note that the conductive film 688 is unnecessary in some cases.

The description of the metal oxide 432 in FIGS. 20A to 20C can be referred to for the details of the semiconductor 682. The semiconductor 682 may be a single layer or a stack including a plurality of semiconductor layers.

The description of the conductive films 421 to 424 in FIGS. 20A to 20C can be referred to for the details of the conductive films 683 and 684.

The description of the insulating film 406 in FIGS. 20A to 20C can be referred to for the details of the insulating film 681.

The insulating films 685 to 687 are sequentially stacked over the semiconductor 682 and the conductive films 683 and 684 in FIG. 27B; however, an insulating film provided over the semiconductor 682 and the conductive films 683 and 684 may be a single layer or a stack including a plurality of insulating films.

In the case of using an oxide semiconductor as the semiconductor 682, the insulating film 686 preferably contains oxygen at a proportion higher than or equal to that in the stoichiometric composition and has a function of supplying part of oxygen to the semiconductor 682 by heating. Note that in the case where the provision of the insulating film 686 directly on the semiconductor 682 causes damage to the semiconductor 682 at the time of formation of the insulating film 686, the insulating film 685 is preferably provided between the semiconductor 682 and the insulating film 686, as shown in FIG. 27B. The insulating film 685 preferably allows oxygen to pass therethrough, and causes little damage to the semiconductor 682 when the insulating film 685 is formed compared with the case of the insulating film 686. If damage to the semiconductor 682 can be reduced and the insulating film 686 can be formed directly on the semiconductor 682, the insulating film 685 is not necessarily provided.

For the insulating films 686 and 685, a material containing silicon oxide or silicon oxynitride is preferably used, for example. Alternatively, a metal oxide such as aluminum oxide, aluminum oxynitride, gallium oxide, gallium oxynitride, yttrium oxide, yttrium oxynitride, hafnium oxide, or hafnium oxynitride can be used.

The insulating film 687 preferably has an effect of blocking diffusion of oxygen, hydrogen, and water. Alternatively, the insulating film 687 preferably has an effect of blocking diffusion of hydrogen and water.

As an insulating film has higher density and becomes denser or has a fewer dangling bonds and becomes more chemically stable, the insulating film has a more excellent blocking effect. An insulating film that has an effect of blocking diffusion of oxygen, hydrogen, and water can be formed using, for example, aluminum oxide, aluminum oxynitride, gallium oxide, gallium oxynitride, yttrium oxide, yttrium oxynitride, hafnium oxide, or hafnium oxynitride. An insulating film that has an effect of blocking diffusion of hydrogen and water can be formed using, for example, silicon nitride or silicon nitride oxide.

In the case where the insulating film 687 has an effect of blocking diffusion of water, hydrogen, and the like, impurities such as water and hydrogen that exist in a resin in a panel or exist outside the panel can be prevented from entering the semiconductor 682. In the case where an oxide semiconductor is used as the semiconductor 682, part of water or hydrogen that enters the oxide semiconductor serves as an electron donor (donor). Thus, the use of the insulating film 687 having the blocking effect can prevent a shift in the threshold voltage of the transistor 680 due to generation of donors.

In addition, in the case where an oxide semiconductor is used as the semiconductor 682, the insulating film 687 has an effect of blocking diffusion of oxygen, so that diffusion of oxygen from the oxide semiconductor to the outside can be prevented. Accordingly, oxygen vacancies in the oxide semiconductor that serve as donors are reduced, so that a shift in the threshold voltage of the transistor 680 due to generation of donors can be prevented.

Embodiment 4

In this embodiment, configuration examples of a device that can be applied to the memory cells 100a to 100k (hereinafter collectively referred to as the memory cell 100) shown in the above embodiments will be described with reference to FIG. 28A to FIG. 31B.

<<Chip Configuration Example 1>>

FIGS. 28A and 28B are cross-sectional views showing an example in which the memory cell 100 is formed in one chip. FIG. 28A shows a cross section in a channel length direction of a transistor included in the memory cell 100, and FIG. 28B shows a cross section in a channel width direction of the transistor included in the memory cell 100.

The memory cell 100 shown in FIGS. 28A and 28B includes layers L1, L2, L3, L4, L5, L6, L7, L8, L9, L10, L11, and L12 in order from the bottom.

The layer L1 includes a substrate 700, a transistor Tr0 formed using the substrate 700, an element isolation layer 701, and a plurality of plugs such as a plug 710 and a plug 711.

The layer L2 includes a plurality of wirings such as a wiring 730 and a wiring 731.

The layer L3 includes a plurality of plugs such as a plug 712 and a plug 713 and a plurality of wirings (not shown).

The layer L4 includes an insulating film 706, a transistor Tr1, an insulating film 702, an insulating film 703, and a plurality of plugs such as a plug 714 and a plug 715.

The layer L5 includes a plurality of wirings such as a wiring 732 and a wiring 733.

The layer L6 includes a plurality of plugs such as a plug 716.

The layer L7 includes a transistor Tr2, an insulating film 704, an insulating film 705, and a plurality of plugs such as a plug 717.

The layer L8 includes a plurality of wirings such as a wiring 734 and a wiring 735.

The layer L9 includes a plurality of plugs such as a plug 718 and a plurality of wirings (not shown).

The layer L10 includes a plurality of wirings such as a wiring 736.

The layer L11 includes a capacitor C1, capacitors C2 to Cn (not shown), and a plurality of plugs such as a plug 719. The capacitor C1 includes a first electrode 751, a second electrode 752, and an insulating film 753.

The layer L12 includes a plurality of wirings such as a wiring 737.

The OS transistor shown in Embodiment 3 is preferably used as the transistors Tr1 and Tr2. In FIGS. 28A and 28B, the transistor 400c shown in FIGS. 24A and 24B is used as the transistors Tr1 and Tr2.

The transistor Tr0 is preferably formed using a semiconductor material different from that for the transistors Tr1 and Tr2. In FIGS. 28A and 28B, a Si transistor is used as the transistor Tr0.

As the substrate 700, a single crystal semiconductor substrate or a polycrystalline semiconductor substrate of silicon or silicon carbide, a compound semiconductor substrate of silicon germanium, an SOI substrate, or the like can be used.

For example, a glass substrate, a quartz substrate, a plastic substrate, a metal substrate, a flexible substrate, an attachment film, paper including a fibrous material, or a base film may be used as the substrate 700. Alternatively, a semiconductor element may be formed using one substrate, and then transferred to another substrate. In FIGS. 28A and 28B, as an example, a single crystal silicon wafer is used as the substrate 700.

Figure 30A:
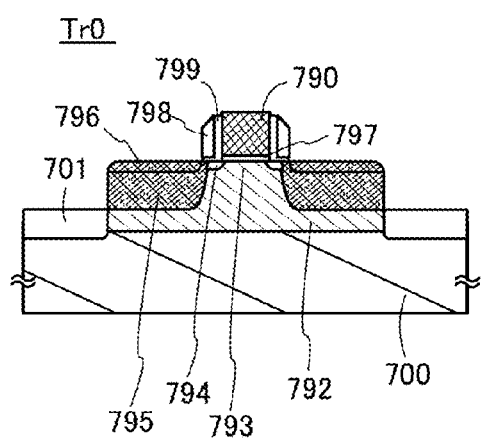
FIGS. 30A and 30B are cross-sectional views showing a structure example of a transistor.
Figure 30B:
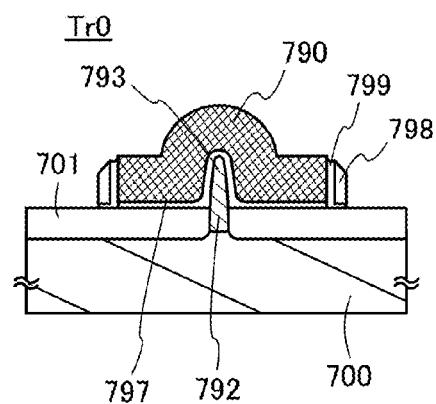

The transistor Tr0 is described in detail with reference to FIGS. 30A and 30B. FIG. 30A is a cross-sectional view of the transistor Tr0 in the channel length direction and FIG. 30B is a cross-sectional view of the transistor Tr0 in the channel width direction. The transistor Tr0 includes a channel formation region 793 formed in a well 792, low concentration impurity regions 794 and high concentration impurity regions 795 (also collectively referred to as an impurity region simply), conductive regions 796 provided in contact with the impurity region, a gate insulating film 797 provided over the channel formation region 793, a gate electrode 790 provided over the gate insulating film 797, and sidewall insulating layers 798 and 799 provided on side surfaces of the gate electrode 790. Note that the conductive regions 796 can be formed using metal silicide or the like.

In the transistor Tr0 in FIG. 30B, the channel formation region 793 has a projecting portion, and the gate insulating film 797 and the gate electrode 790 are provided along side and top surfaces of the channel formation region 793. The transistor with such a shape is referred to as a FIN-type transistor. Although the projecting portion is formed by processing part of the semiconductor substrate in this embodiment, a semiconductor layer with a projecting portion may be formed by processing an SOI substrate.

Note that the transistor Tr0 is not limited to the FIN-type transistor, and may be a planar-type transistor shown in FIGS. 31A and 31B. FIG. 31A is a cross-sectional view of the transistor Tr0 in the channel length direction and FIG. 31B is a cross-sectional view of the transistor Tr0 in the channel width direction. The reference numerals in FIGS. 31A and 31B are the same as those shown in FIGS. 30A and 30B.

In FIGS. 28A and 28B, the insulating films 702 to 706 preferably have a blocking effect against hydrogen, water, and the like. Water, hydrogen, and the like are factors that generate carriers in an oxide semiconductor; thus, providing such a blocking layer against hydrogen, water, and the like can improve the reliability of the transistors M1 to Mn. Examples of the insulator having a blocking effect against hydrogen, water, and the like include aluminum oxide, aluminum oxynitride, gallium oxide, gallium oxynitride, yttrium oxide, yttrium oxynitride, hafnium oxide, hafnium oxynitride, and yttria-stabilized zirconia (YSZ).

The wirings 730 to 737 and the plugs 710 to 719 each preferably have a single-layer structure or a layered structure of a conductive film containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), and cobalt (Co), an alloy of such a low-resistance material, or a compound containing such a material as its main component. It is particularly preferable to use a high-melting-point material which has both heat resistance and conductivity, such as tungsten or molybdenum. It is also preferable to use a low-resistance conductive material such as aluminum or copper. The use of a Cu—Mn alloy is further preferable, in which case manganese oxide formed at the interface with an insulator containing oxygen has a function of preventing Cu diffusion.

In FIGS. 28A and 28B, regions without reference numerals and hatch patterns represent regions formed of an insulator. As the insulator, an insulator containing at least one of aluminum oxide, aluminum nitride oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, and the like can be used. Alternatively, in the regions, an organic resin such as a polyimide resin, a polyamide resin, an acrylic resin, a siloxane resin, an epoxy resin, or a phenol resin can be used. Note that in this specification, an oxynitride refers to a compound that contains more oxygen than nitrogen, and a nitride oxide refers to a compound that contains more nitrogen than oxygen.

In the case where an OS transistor is used as the transistors M1 to Mn shown Embodiment 1 or 2, the transistors M1 to Mn are preferably formed in the layer L4 or the layer L7.

In the case where a Si transistor is used as the transistor M0 shown in Embodiment 1 or 2, the transistor M0 is preferably formed in the layer L1.

In the case where an OS transistor is used as the transistor M0 shown in Embodiment 1 or 2, the transistor M0 is preferably formed in the layer L4 or L7.

In the case where a driver circuit around the memory cell 100 is formed using an OS transistor, the OS transistor may be formed in the layer L4 or L7.

In the case where a driver circuit around the memory cell 100 is formed using a Si transistor, the Si transistor may be formed in the layer L1.

With the structure shown in FIGS. 28A and 28B, the area occupied by the memory cell 100 can be reduced, leading to higher integration of the memory cell.

<<Chip Configuration Example 2>>

All the OS transistors in the memory cell 100 may be formed in the same layer. An example of such a case is shown in FIGS. 29A and 29B. Similarly to FIGS. 28A and 28B, FIG. 29A shows a cross section in a channel length direction of a transistor included in the memory cell 100, and FIG. 29B shows a cross section in a channel width direction of the transistor included in the memory cell 100.

The cross-sectional views of FIGS. 29A and 29B are different from those of FIGS. 28A and 28B in that the layers L6 to L8 are omitted and the layer L9 is formed on the layer L5. For the other details in FIGS. 29A and 29B, the description of FIGS. 28A and 28B is referred to.

In the case where an OS transistor is used as the transistors M1 to Mn shown in Embodiment 1 or 2, the transistors M1 to Mn are preferably formed in the layer L4.

In the case where a Si transistor is used as the transistor M0 shown in Embodiment 1 or 2, the transistor M0 is preferably formed in the layer L1.

In the case where an OS transistor is used as the transistor M0 shown in Embodiment 1 or 2, the transistor M0 is preferably formed in the layer L4.

In the case where a driver circuit around the memory cell 100 is formed using an OS transistor, the OS transistor may be formed in the layer L4.

In the case where a driver circuit around the memory cell 100 is formed using a Si transistor, the Si transistor may be formed in the layer L1.

With the structure shown in FIGS. 29A and 29B, the production process of the memory cell 100 can be simplified.

Embodiment 5

Described in this embodiment is a CPU in which the memory cell and the memory device described in the above embodiments can be used.

Figure 32:
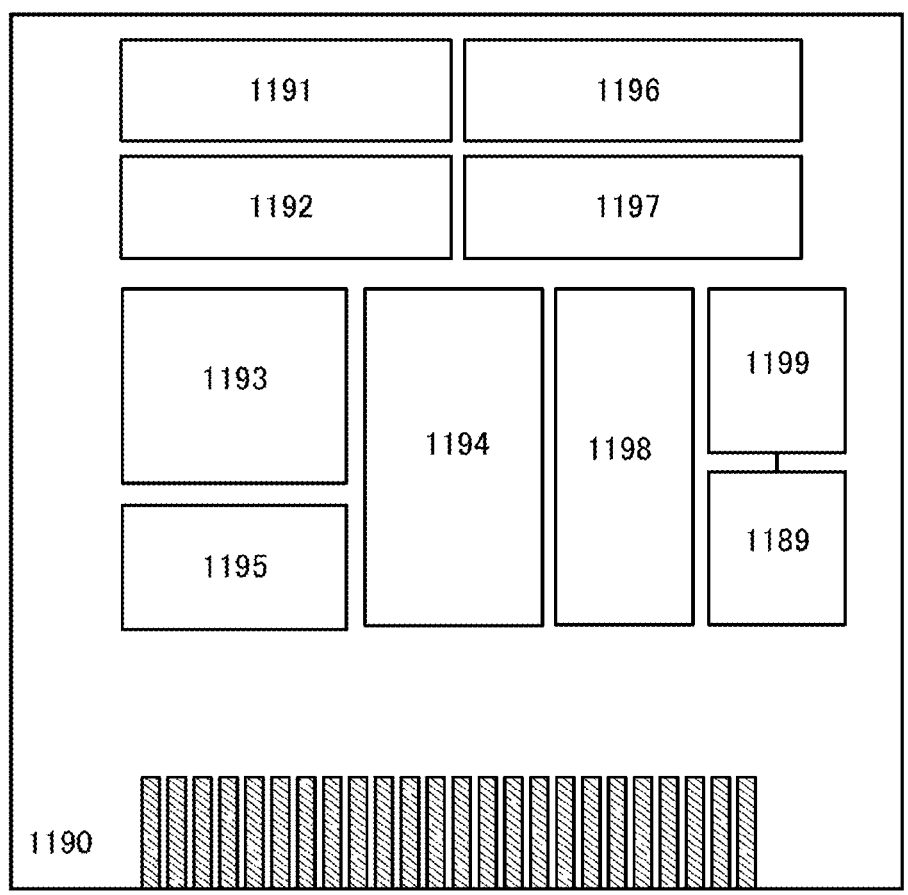
FIG. 32 is a block diagram showing a configuration example of a CPU.

FIG. 32 is a block diagram illustrating a configuration example of a CPU.

The CPU shown in FIG. 32 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198 (BUS I/F), a rewritable ROM 1199, and a ROM interface (ROM I/F) 1189. A semiconductor substrate, an SOI substrate, a glass substrate, or the like is used as the substrate 1190. The ROM 1199 and the ROM interface 1189 may be provided over a separate chip. Needless to say, the CPU in FIG. 32 is just an example with a simplified configuration, and an actual CPU may have a variety of configurations depending on the application. For example, a CPU may include a plurality of cores each of which includes the CPU shown in FIG. 32 or an arithmetic circuit and which operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal based on a reference clock signal, and supplies the internal clock signal to the above circuits.

The memory cell described in the above embodiments can be used for the register 1196 in the CPU shown in FIG. 32.

Embodiment 6

The memory device of one embodiment of the present invention can be used for display devices, personal computers, and image reproducing devices provided with recording media (typically, devices that reproduce the content of recording media such as digital versatile discs (DVDs) and have displays for displaying the reproduced images). Other examples of electronic devices that can include the memory device of one embodiment of the present invention are mobile phones, game machines including portable game machines, portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. Specific examples of these electronic devices are illustrated in FIGS. 33A to 33F.

Figure 33A:
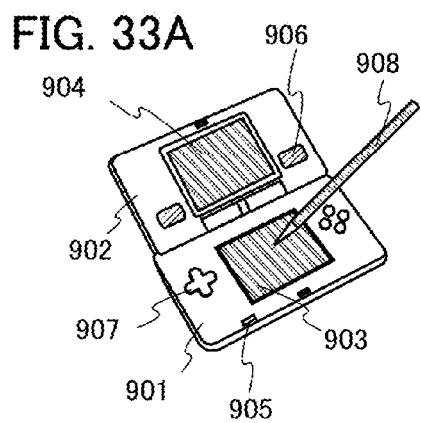
FIGS. 33A to 33F are perspective views showing examples of electronic devices.

FIG. 33A illustrates a portable game machine, which includes a housing 901, a housing 902, a display portion 903, a display portion 904, a microphone 905, speakers 906, a control key 907, a stylus 908, and the like. Note that although the portable game machine in FIG. 33A has the two display portions 903 and 904, the number of display portions included in the portable game machine is not limited thereto.

Figure 33B:
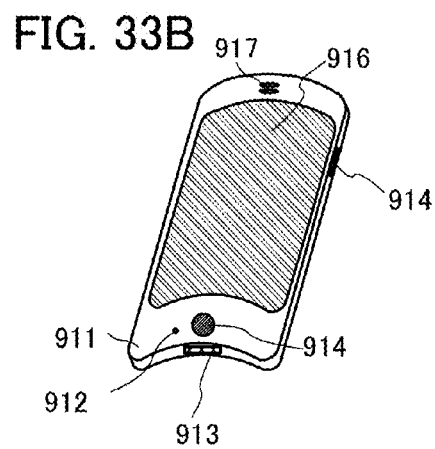

FIG. 33B illustrates a cellular phone, which includes a housing 911, a display portion 916, operation buttons 914, an external connection port 913, a speaker 917, a microphone 912, and the like. When the display portion 916 of the cellular phone illustrated in FIG. 33B is touched with a finger or the like, data can be input. Furthermore, operations such as making a call and inputting a character can be performed by touch on the display portion 916 with a finger or the like. The power can be turned on or off with the operation button 914. In addition, types of images displayed on the display portion 916 can be switched; for example, switching images from a mail creation screen to a main menu screen is performed with the operation button 914.

Figure 33C:
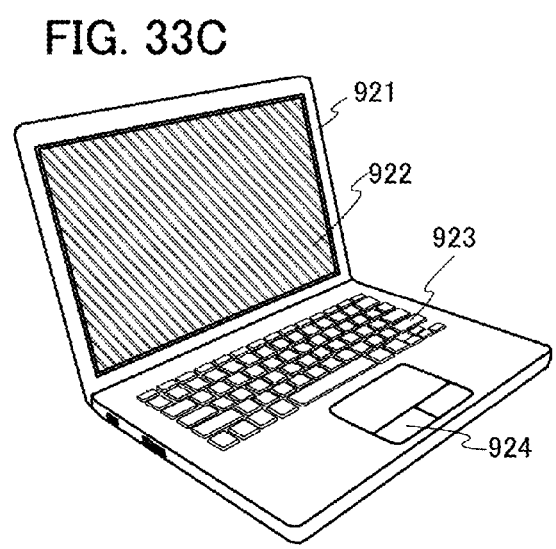

FIG. 33C illustrates a notebook personal computer, which includes a housing 921, a display portion 922, a keyboard 923, a pointing device 924, and the like.

Figure 33D:
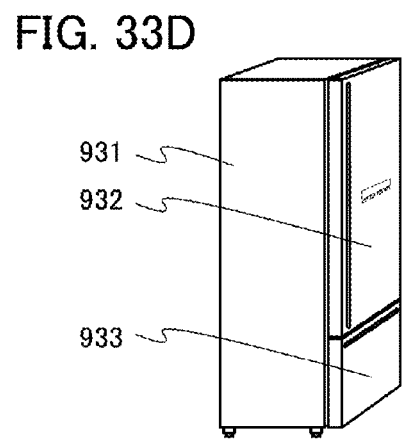

FIG. 33D illustrates an electric refrigerator-freezer, which includes a housing 931, a refrigerator door 932, a freezer door 933, and the like.

Figure 33E:
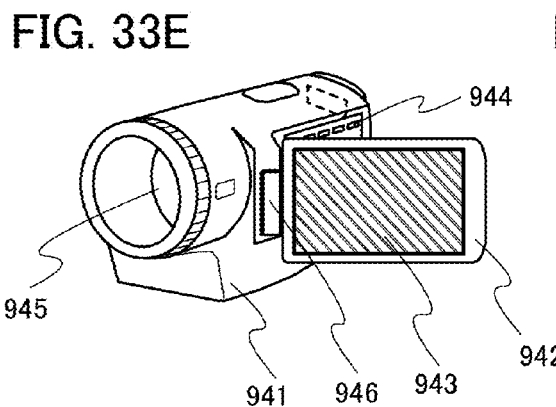

FIG. 33E illustrates a video camera, which includes a first housing 941, a second housing 942, a display portion 943, operation keys 944, a lens 945, a joint 946, and the like. The operation keys 944 and the lens 945 are provided in the first housing 941, and the display portion 943 is provided in the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942.

Figure 33F:
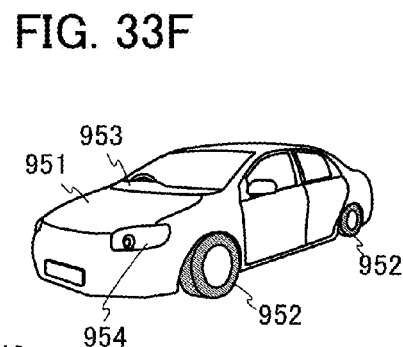
Figure 34A:
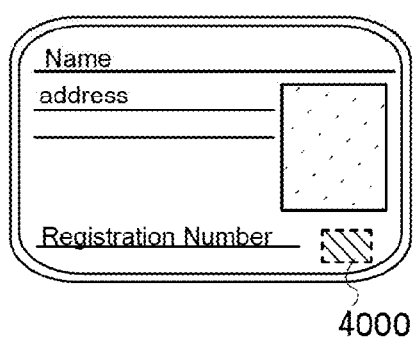
FIGS. 34A to 34F are perspective views showing application examples of RF tags.
Figure 34B:
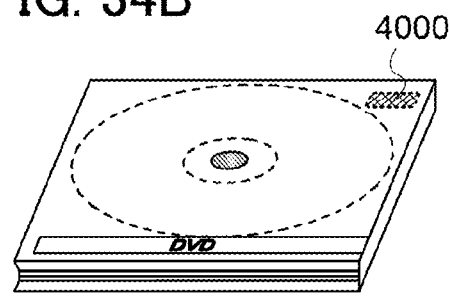
Figure 34C:
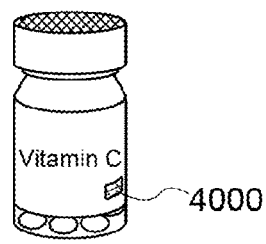
Figure 34D:
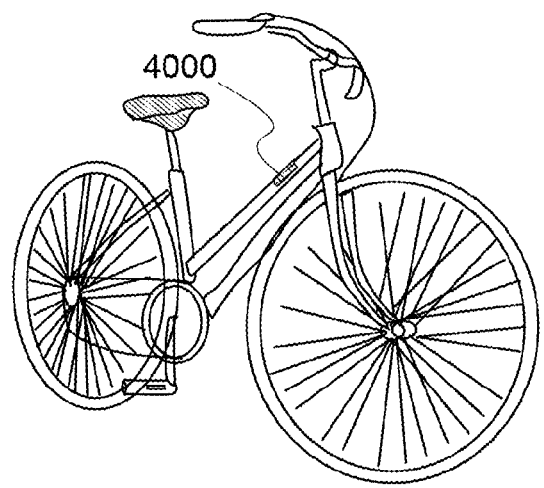
Figure 34E:
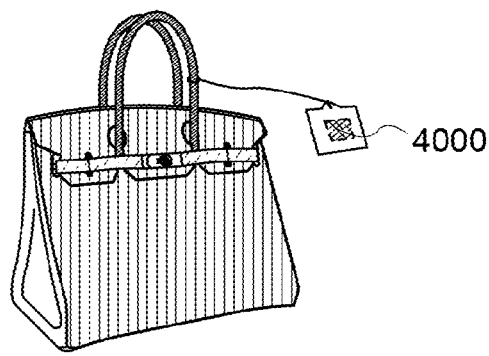
Figure 34F:
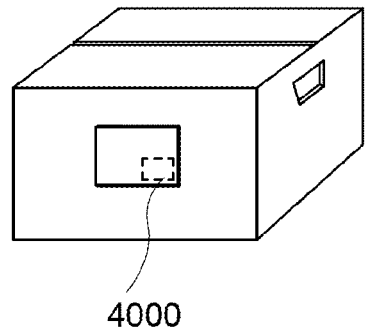

FIG. 33F illustrates a car, which includes a car body 951, wheels 952, a dashboard 953, lights 954, and the like.

Next, an application example of a display device that can include the semiconductor device or memory device of one embodiment of the present invention is described. In one example, a display device includes a pixel. The pixel includes a transistor and a display element, for example. Alternatively, the display device includes a driver circuit for driving the pixel. The driver circuit includes a transistor, for example. As these transistors, any of the transistors described in the other embodiments can be used, for example.

For example, in this specification and the like, a display element, a display device which is a device including a display element, a light-emitting element, and a light-emitting device which is a device including a light-emitting element can employ a variety of modes or can include a variety of elements. The display element, the display device, the light-emitting element, or the light-emitting device includes at least one of an electroluminescent (EL) element (e.g., an EL element including organic and inorganic materials, an organic EL element, or an inorganic EL element), an LED chip (e.g., a white LED chip, a red LED chip, a green LED chip, or a blue LED chip), a transistor (a transistor that emits light depending on a current), a plasma display panel (PDP), an electron emitter, a display element including a carbon nanotube, a liquid crystal element, electronic ink, an electrowetting element, an electrophoretic element, a display element using micro electro mechanical systems (MEMS), (e.g., a grating light valve (GLV), a digital micromirror device (DMD), a digital micro shutter (DMS), MIRASOL (registered trademark), an interferometric modulator display (IMOD) element, a MEMS shutter display element, an optical-interference-type MEMS display element, or a piezoelectric ceramic display), quantum dots, and the like. Other than the above, a display medium whose contrast, luminance, reflectance, transmittance, or the like is changed by an electric or magnetic effect may be included. Examples of a display device using an EL element include an EL display. Examples of a display device using electron emitters include a field emission display (FED), and an SED-type flat panel display (SED: surface-conduction electron-emitter display). Examples of a display device including a liquid crystal element include a liquid crystal display (e.g., a transmissive liquid crystal display, a transflective liquid crystal display, a reflective liquid crystal display, a direct-view liquid crystal display, or a projection liquid crystal display). Examples of a display device including electronic ink, Electronic Liquid Powder (registered trademark), or electrophoretic elements include electronic paper. Examples of a display device including a quantum dot in each pixel include a quantum dot display. Note that the quantum dots may be provided in part of a backlight, instead of being used in display element. With the use of the quantum dots, an image with high color purity can be displayed. In the case of a transflective liquid crystal display or a reflective liquid crystal display, some or all of pixel electrodes function as reflective electrodes. For example, some or all of pixel electrodes are formed to contain aluminum, silver, or the like. In such a case, a memory circuit such as an SRAM can be provided under the reflective electrodes, leading to lower power consumption. Note that in the case of using an LED chip, graphene or graphite may be provided under an electrode or a nitride semiconductor of the LED chip. Graphene or graphite may be a multilayer film in which a plurality of layers are stacked. The provision of graphene or graphite enables a nitride semiconductor such as an n-type GaN semiconductor layer including crystals to be easily formed thereover. Furthermore, a p-type GaN semiconductor layer including crystals, or the like can be provided thereover, and thus the LED chip can be formed. Note that an AlN layer may be provided between the n-type GaN semiconductor layer including crystals and graphene or graphite. The GaN semiconductor layers included in the LED chip may be formed by MOCVD. Note that when the graphene is provided, the GaN semiconductor layers included in the LED chip can also be formed by a sputtering method. In a display device including MEMS, a dry agent may be provided in a space where a display element is sealed (or between an element substrate over which the display element is placed and a counter substrate opposed to the element substrate, for example). With the dry agent, malfunction or degradation of the MEMS or the like due to moisture can be prevented.

Embodiment 7

In this embodiment, application examples of an RF tag that can include the memory device of one embodiment of the present invention will be described with reference to FIGS. 34A to 34F. The RF tag is widely used and can be provided for, for example, products such as bills, coins, securities, bearer bonds, documents (e.g., driver's licenses or resident's cards, see FIG. 34A), recording media (e.g., DVD or video tapes, see FIG. 34B), packaging containers (e.g., wrapping paper or bottles, see FIG. 34C), vehicles (e.g., bicycles, see FIG. 34D), personal belongings (e.g., bags or glasses), foods, plants, animals, human bodies, clothing, household goods, medical supplies such as medicine and chemicals, and electronic devices (e.g., liquid crystal display devices, EL display devices, television sets, or cellular phones), or tags on products (see FIGS. 34E and 34F).

An RF tag 4000 of one embodiment of the present invention is fixed to a product by being attached to a surface thereof or embedded therein. For example, the RF tag 4000 is fixed to each product by being embedded in paper of a book, or embedded in an organic resin of a package. Since the RF tag 4000 of one embodiment of the present invention can be reduced in size, thickness, and weight, it can be fixed to a product without spoiling the design of the product. Furthermore, bills, coins, securities, bearer bonds, documents, or the like can have an identification function by being provided with the RF tag 4000 of one embodiment of the present invention, and the identification function can be utilized to prevent counterfeiting. Moreover, the efficiency of a system such as an inspection system can be improved by providing the RF tag of one embodiment of the present invention for packaging containers, recording media, personal belongings, foods, clothing, household goods, electronic devices, or the like. Vehicles can also have higher security against theft or the like by being provided with the RF tag of one embodiment of the present invention.

As described above, by using the RF tag of one embodiment of the present invention for each application described in this embodiment, power for operation such as writing or reading of data can be reduced, which results in an increase in the maximum communication distance. Moreover, data can be held for an extremely long period even in the state where power is not supplied; thus, the RF tag can be preferably used for application in which data is not frequently written or read.

Embodiment 8

Described in this embodiment are structures of an oxide semiconductor film capable of being used for the OS transistors described in the above embodiments.

In this specification, the term "parallel" indicates that the angle formed between two straight lines is greater than or equal to −10° and less than or equal to 10°, and accordingly also includes the case where the angle is greater than or equal to −5° and less than or equal to 5°. In addition, the term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly also includes the case where the angle is greater than or equal to 85° and less than or equal to 95°. In addition, the term "substantially perpendicular" indicates that the angle formed between two straight lines is greater than or equal to 60° and less than or equal to 120°.

In this specification, trigonal and rhombohedral crystal systems are included in a hexagonal crystal system.

<<Structure of Oxide Semiconductor>>

Structures of an oxide semiconductor will be described below.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

It is known that an amorphous structure is generally defined as being metastable and unfixed, and being isotropic and having no non-uniform structure. In other words, an amorphous structure has a flexible bond angle and a short-range order but does not have a long-range order.

This means that an inherently stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. Note that an a-like OS has a periodic structure in a microscopic region, but at the same time has a void and has an unstable structure. For this reason, an a-like OS has physical properties similar to those of an amorphous oxide semiconductor.

<CAAC-OS>

First, a CAAC-OS is described.

A CAAC-OS is one of oxide semiconductors having a plurality of c-axis aligned crystal parts (also referred to as pellets).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

Figure 35A:
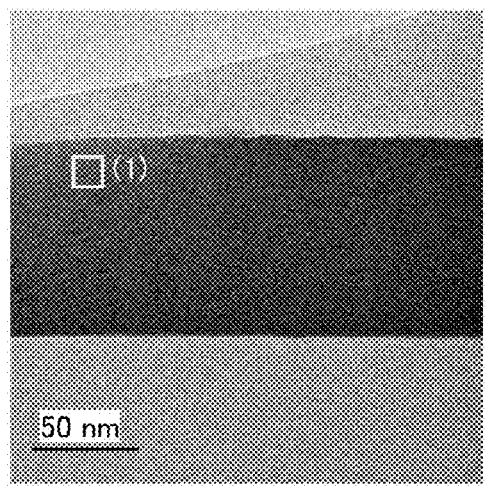
FIGS. 35A to 35D are Cs-corrected high-resolution TEM images of a cross section of a CAAC-OS and a cross-sectional schematic view of a CAAC-OS.

The CAAC-OS observed with a TEM is described below. FIG. 35A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 35B:
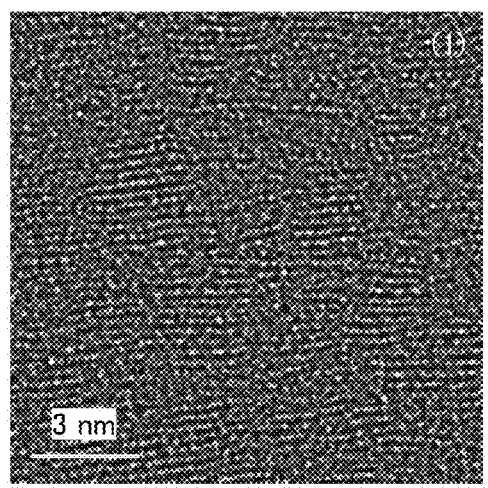

FIG. 35B is an enlarged Cs-corrected high-resolution TEM image of a region (1) in FIG. 35A. FIG. 35B shows that metal atoms are arranged in a layered manner in a pellet. Each metal atom layer has a configuration reflecting unevenness of a surface over which the CAAC-OS is formed (hereinafter, the surface is referred to as a formation surface) or a top surface of the CAAC-OS, and is arranged parallel to the formation surface or the top surface of the CAAC-OS.

Figure 35C:
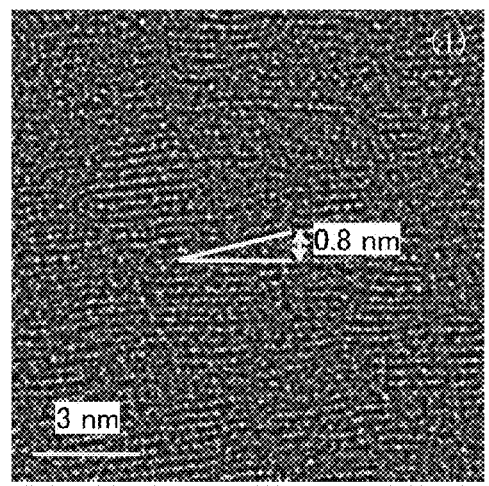

As shown in FIG. 35B, the CAAC-OS has a characteristic atomic arrangement. The characteristic atomic arrangement is denoted by an auxiliary line in FIG. 35C. FIGS. 35B and 35C prove that the size of a pellet is greater than or equal to 1 nm or greater than or equal to 3 nm, and the size of a space caused by tilt of the pellets is approximately 0.8 nm. Therefore, the pellet can also be referred to as a nanocrystal (nc). Furthermore, the CAAC-OS can also be referred to as an oxide semiconductor including c-axis aligned nanocrystals (CANC).

Figure 35D:
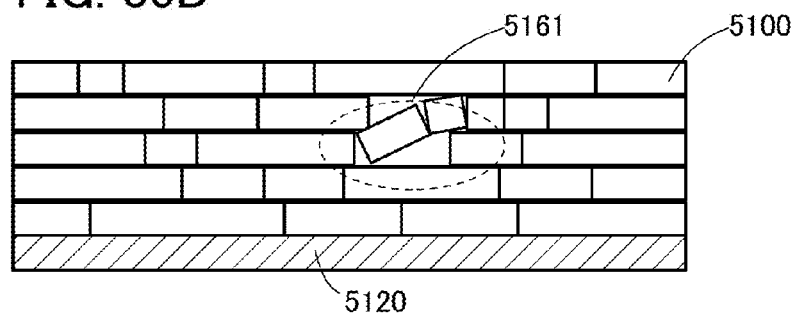

Here, according to the Cs-corrected high-resolution TEM images, the schematic arrangement of pellets 5100 of a CAAC-OS over a substrate 5120 is illustrated by such a structure in which bricks or blocks are stacked (see FIG. 35D). The part in which the pellets are tilted as observed in FIG. 35C corresponds to a region 5161 shown in FIG. 35D.

FIG. 36A shows a Cs-corrected high-resolution TEM image of a plane of the CAAC-OS observed from a direction substantially perpendicular to the sample surface. FIGS. 36B, 36C, and 36D are enlarged Cs-corrected high-resolution TEM images of regions (1), (2), and (3) in FIG. 36A, respectively. FIGS. 36B, 36C, and 36D indicate that metal atoms are arranged in a triangular, quadrangular, or hexagonal configuration in a pellet. However, there is no regularity of arrangement of metal atoms between different pellets.

Figure 37A:
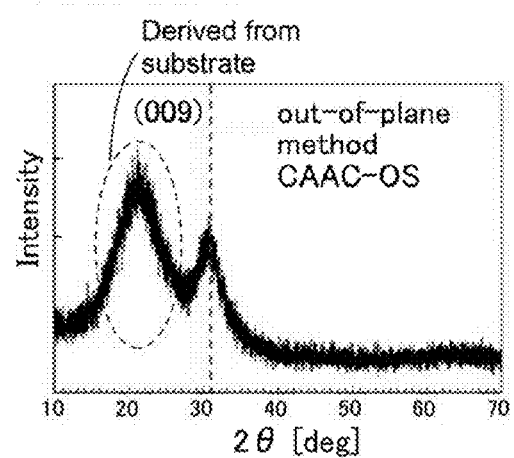
FIGS. 37A to 37C show structural analysis of a CAAC-OS and a single crystal oxide semiconductor by XRD.

Next, a CAAC-OS analyzed by X-ray diffraction (XRD) is described. For example, when the structure of a CAAC-OS including an InGaZnO$_4$ crystal is analyzed by an out-of-plane method, a peak appears at a diffraction angle (2θ) of around 31° as shown in FIG. 37A. This peak is derived from the (009) plane of the InGaZnO$_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS by an out-of-plane method, another peak may appear when 2θ is around 36°, in addition to the peak at 2θ of around 31°. The peak of 2θ at around 36° indicates that a crystal having no c-axis alignment is included in part of the CAAC-OS. It is preferable that in the CAAC-OS analyzed by an out-of-plane method, a peak appear when 2θ is around 31° and that a peak not appear when 2θ is around 36°.

Figure 37B:
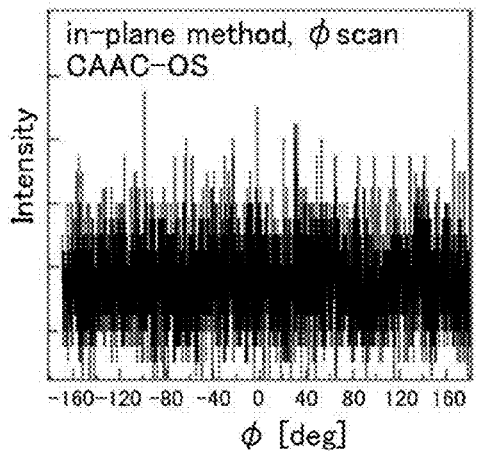
Figure 37C:
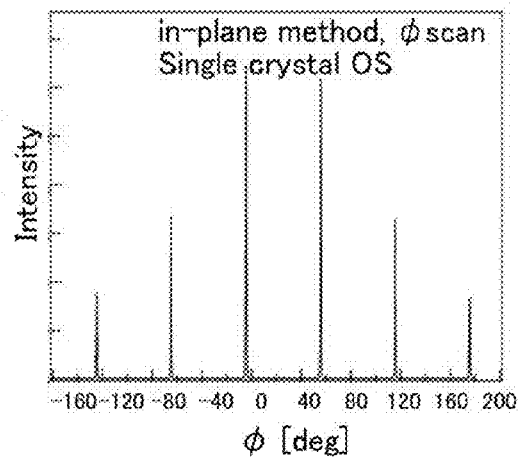

On the other hand, in structural analysis of the CAAC-OS by an in-plane method in which an X-ray is incident on a sample in a direction substantially perpendicular to the c-axis, a peak appears when 2θ is around 56°. This peak is derived from the (110) plane of the InGaZnO$_4$ crystal. In the case of the CAAC-OS, when analysis (φ scan) is performed with 2θ fixed at around 56° and with the sample rotated using a normal vector of the sample surface as an axis (φ axis), as shown in FIG. 37B, a peak is not clearly observed. In contrast, in the case of a single crystal oxide semiconductor of InGaZnO$_4$, when φ scan is performed with 2θ fixed at around 56°, as shown in FIG. 37C, six peaks which are derived from crystal planes equivalent to the (110) plane are observed. Accordingly, the structural analysis using XRD shows that the directions of a-axes and b-axes are irregularly oriented in the CAAC-OS.

Figure 38A:
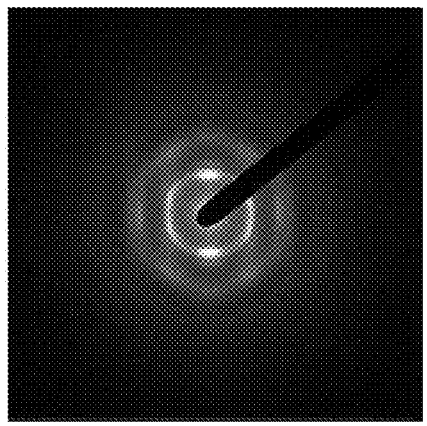
FIGS. 38A and 38B show electron diffraction patterns of a CAAC-OS.
Figure 38B:
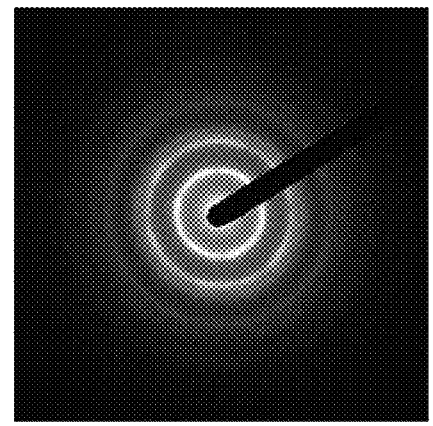

Next, a CAAC-OS analyzed by electron diffraction is described. For example, when an electron beam with a probe diameter of 300 nm is incident on a CAAC-OS including an InGaZnO$_4$ crystal in a direction parallel to the sample surface, a diffraction pattern (also referred to as a selected-area transmission electron diffraction pattern) shown in FIG. 38A can be obtained. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 38B shows a diffraction pattern obtained in such a manner that an electron beam with a probe diameter of 300 nm is incident on the same sample in a direction perpendicular to the sample surface. As shown in FIG. 38B, a ring-like diffraction pattern is observed. Thus, the electron diffraction also indicates that the a-axes and b-axes of the pellets included in the CAAC-OS do not have regular alignment. The first ring in FIG. 38B is considered to be derived from the (010) plane, the (100) plane, and the like of the InGaZnO$_4$ crystal. The second ring in FIG. 38B is considered to be derived from the (110) plane and the like.

As described above, the CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities contained in the oxide semiconductor might serve as carrier traps or carrier generation sources, for example. Furthermore, oxygen vacancies in the oxide semiconductor serve as carrier traps or serve as carrier generation sources when hydrogen is captured therein.

The CAAC-OS having small amounts of impurities and oxygen vacancies is an oxide semiconductor with low carrier density (specifically, lower than $8\times10^{11}/cm^3$, preferably lower than $1\times10^{11}/cm^3$, further preferably lower than $1\times10^{10}/cm^3$, and higher than or equal to $1\times10^{-9}/cm^3$). Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<nc-OS>

Next, an nc-OS is described.

An nc-OS has a region in which a crystal part is observed and a region in which a crystal part is not clearly observed in a high-resolution TEM image. In most cases, the size of a crystal part included in the nc-OS film is greater than or equal to 1 nm and less than or equal to 10 nm, or greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not observed. Accordingly, the nc-OS cannot be distinguished from an a-like OS or an amorphous oxide semiconductor, depending on an analysis method. For example, when the nc-OS is analyzed by an out-of-plane method using an X-ray beam having a diameter larger than the size of a pellet, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet. Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, regions with high luminance in a circular (ring) pattern are shown in some cases. Also in a nanobeam electron diffraction pattern of the nc-OS, a plurality of spots are shown in a ring-like region in some cases.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared to an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<a-like OS>

An a-like OS has a structure between those of the nc-OS and the amorphous oxide semiconductor.

In a high-resolution TEM image of the a-like OS film, a void may be observed. Furthermore, in the high-resolution TEM image, there are a region where a crystal part is clearly observed and a region where a crystal part is not observed.

The a-like OS has an unstable structure because it contains a void. To verify that an a-like OS has an unstable structure as compared with a CAAC-OS and an nc-OS, a change in structure caused by electron irradiation is described below.

An a-like OS (referred to as a sample A), an nc-OS (referred to as a sample B), and a CAAC-OS (referred to as a sample C) are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Note that which part is regarded as a crystal part is determined as follows. It is known that a unit cell of the InGaZnO$_4$ crystal has a structure in which nine layers including three In—O layers and six Ga—Zn—O layers are layered in the c-axis direction. Accordingly, the distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of InGaZnO$_4$. Each of lattice fringes corresponds to the a-b plane of the InGaZnO$_4$ crystal.

FIG. 39 shows change in the average size of crystal parts (at 22 points to 45 points) in each sample. Note that the crystal part size corresponds to the length of a lattice fringe. FIG. 39 indicates that the crystal part size in the a-like OS increases with an increase in the cumulative electron dose. Specifically, as shown by (1) in FIG. 39, a crystal part of approximately 1.2 nm (also referred to as an initial nucleus) at the start of TEM observation grows to a size of approximately 2.6 nm at a cumulative electron dose of $4.2 \times 10^8$ e$^-$/nm$^2$. In contrast, the crystal part size in the nc-OS and the CAAC-OS shows little change from the start of electron irradiation to a cumulative electron dose of $4.2 \times 10^8$ e$^-$/nm$^2$. Specifically, as shown by (2) and (3) in FIG. 39, the average crystal sizes in an nc-OS and a CAAC-OS are approximately 1.4 nm and approximately 2.1 nm, respectively, regardless of the cumulative electron dose.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:GaZn=1:1:1, the density of each of the nc-OS and the CAAC-OS is higher than or equal to 5.9 g/cm$^3$ and lower than 6.3 g/cm$^3$.

Note that single crystals with the same composition do not exist in some cases. In that case, single crystal oxide semiconductors with different compositions are combined at an adequate ratio, which makes it possible to calculate the density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more of an amorphous oxide semiconductor, an a-like OS, an nc-OS, and a CAAC-OS, for example.

Note that in this specification and the like, terms for describing arrangement, such as "over" and "under", are used for convenience to indicate a positional relation between components with reference to drawings. The positional relation between components is changed as appropriate in accordance with the direction in which each component is described. Therefore, terms for describing arrangement are not limited to the terms used in the description in the specification, and can be appropriately reworded depending on situations.

In a block diagram in this specification and the like, components are functionally classified and shown by blocks that are independent from each other. However, in an actual circuit and the like, such components are sometimes hard to classify functionally, and there is a case in which one circuit is associated with a plurality of functions or a case in which a plurality of circuits are associated with one function. Therefore, the segmentation of blocks in a block diagram is not limited by any of the components described in the specification and can be differently determined as appropriate depending on situations.

In this specification and the like, the connection relationship of a transistor is described with the terms "one of a source and a drain" (or a first electrode or a first terminal), and "the other of the source and the drain" (or a second electrode or a second terminal). This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

In this specification and the like, the terms "electrode" and "wiring" do not limit the function of a component. For example, an "electrode" is used as part of a "wiring" in some cases, and vice versa. Furthermore the term "electrode" or "wiring" can also mean a combination of a plurality of "electrodes" or "wirings" formed in an integrated manner.

In this specification and the like, voltage and potential can be replaced with each other. The voltage refers to a potential difference from a reference potential. When the reference potential is a ground potential, for example, a voltage can be replaced with a potential. The ground potential does not necessarily mean 0 V. Potentials are relative values, and a potential supplied to a wiring or the like is sometimes changed depending on the reference potential.

In this specification and the like, the terms "film" and "layer" can be interchanged with each other depending on the case or circumstances. For example, the term "conductive layer" can be changed into the term "conductive film" in some cases. Moreover, the term "insulating film" can be changed into the term "insulating layer" in some cases.

In this specification and the like, a switch is in a conductive state (on state) or in a non-conductive state (off state) to determine whether current flows therethrough or not. Alternatively, a switch has a function of selecting and changing a current path.

Examples of the switch include an electrical switch and a mechanical switch. That is, the switch is not limited to a certain element and any element can be used as long as it can control current.

Examples of the electrical switch include a transistor (e.g., a bipolar transistor or a MOS transistor), a diode (e.g., a PN diode, a PIN diode, a Schottky diode, a metal-insulator-metal (MIM) diode, a metal-insulator-semiconductor (MIS) diode, or a diode-connected transistor), and a logic circuit in which such elements are combined.

In the case of using a transistor as a switch, an "on state" of the transistor refers to a state in which a source and a drain of the transistor are electrically short-circuited. Furthermore, an "off state" of the transistor refers to a state in which the source and the drain of the transistor are electrically disconnected. In the case where a transistor operates just as a switch, the polarity (conductivity type) of the transistor is not particularly limited to a certain type.

An example of the mechanical switch is a switch formed using a micro electro mechanical system (MEMS) technology, such as a digital micromirror device (DMD). Such a switch includes an electrode which can be moved mechanically, and operates by controlling conduction and non-conduction in accordance with movement of the electrode.

In this specification and the like, for example, when it is explicitly described that X and Y are connected, the case where X and Y are electrically connected, the case where X and Y are functionally connected, and the case where X and Y are directly connected are included therein. Accordingly, another element may be interposed between elements having a connection relation shown in drawings and texts, without limiting to a predetermined connection relation, for example, the connection relation shown in the drawings and the texts.

Here, X and Y each denote an object (e.g., a device, an element, a circuit, a line, an electrode, a terminal, a conductive film, or a layer).

For example, in the case where X and Y are directly connected, an element that enables electrical connection between X and Y (e.g., a switch, a transistor, a capacitor, an inductor, a resistor, a diode, a display element, a light-emitting element, or a load) is not connected between X and Y, and X and Y are connected without the element that enables electrical connection between X and Y (e.g., a switch, a transistor, a capacitor, an inductor, a resistor, a diode, a display element, a light-emitting element, or a load) provided therebetween.

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. A switch is controlled to be on or off. That is, a switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power source circuit (e.g., a step-up converter or a step-down converter) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; and/or a control circuit) can be connected between X and Y. Note that for example, in the case where a signal output from X is transmitted to Y even when another circuit is interposed between X and Y, X and Y are functionally connected. Note that the case where X and Y are functionally connected includes the case where X and Y are directly connected and the case where X and Y are electrically connected.

Note that when it is explicitly described that X and Y are electrically connected, the case where X and Y are electrically connected (i.e., the case where X and Y are connected with another element or another circuit provided therebetween), the case where X and Y are functionally connected (i.e., the case where X and Y are functionally connected with another circuit provided therebetween), and the case where X and Y are directly connected (i.e., the case where X and Y are connected without another element or another circuit provided therebetween) are included therein. That is, in this specification and the like, the explicit description "X and Y are electrically connected" is the same as the description "X and Y are connected".

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit structure is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path". Another example of the expression is "a source (or a first terminal or the like) of a transistor is electrically connected to X at least with a first connection path through Z1, the first connection path does not include a second connection path, the second connection path includes a connection path through which the transistor is provided, a drain (or a second terminal or the like) of the transistor is electrically connected to Y at least with a third connection path through Z2, and the third connection path does not include the second connection path". Still another example of the expression is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit structure is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

This application is based on Japanese Patent Application serial No. 2015-031747 filed with Japan Patent Office on Feb. 20, 2015, the entire contents of which are hereby incorporated by reference.

What is claimed is:

1. A memory device comprising:
    first to fifth transistors;
    first to fourth capacitors;
    first to fourth nodes; and
    first and second wirings,
    wherein the first node is electrically connected to a first terminal of the first capacitor and a gate of the first transistor,
    wherein the second node is electrically connected to a first terminal of the second capacitor and a gate of the second transistor,
    wherein the third node is electrically connected to a first terminal of the third capacitor and a gate of the third transistor,
    wherein the fourth node is electrically connected to a first terminal of the fourth capacitor and a gate of the fourth transistor,
    wherein the first transistor is configured to control conduction or non-conduction between the first wiring and the second wiring,
    wherein the second transistor is configured to control conduction or non-conduction between the first node and the second wiring,
    wherein the third transistor is configured to control conduction or non-conduction between the second node and the second wiring,
    wherein the fourth transistor is configured to control conduction or non-conduction between the third node and the second wiring,
    wherein the fifth transistor is configured to control conduction or non-conduction between the fourth node and the second wiring,

49 wherein the first node is configured to retain J-bit (J is an integer of 1 or more) data, wherein the second node is configured to retain K-bit (K is an integer of 1 or more) data, wherein the third node is configured to retain L-bit (L is an integer of 1 or more) data, wherein the fourth node is configured to retain M-bit (M is an integer of 1 or more) data, and wherein the second to fifth transistors each include an oxide semiconductor in a channel formation region.

2. The memory device according to claim 1, further comprising a first layer, a second layer over the first layer, a third layer over the second layer, and a fourth layer over the third layer, wherein the first transistor is provided in the first layer, wherein the second to fifth transistors are provided in the second or third layer, wherein the first to fourth capacitors are provided in the fourth layer, and wherein the first transistor includes silicon in a channel formation region.

3. An electronic device comprising:

the memory device according to claim 1; and at least one of a microphone, a speaker, a display portion, and an operation key.

4. A memory device comprising:

a memory cell;

first to fourth memory circuits; and first and second wirings, wherein the memory cell includes first to fifth transistors, first to fourth capacitors, and first to fourth nodes, wherein the first node is electrically connected to a first terminal of the first capacitor and a gate of the first transistor, wherein the second node is electrically connected to a first terminal of the second capacitor and a gate of the second transistor, wherein the third node is electrically connected to a first terminal of the third capacitor and a gate of the third transistor, wherein the fourth node is electrically connected to a first terminal of the fourth capacitor and a gate of the fourth transistor, wherein the first transistor is configured to control conduction or non-conduction between the first wiring and the second wiring, wherein the second transistor is configured to control conduction or non-conduction between the first node and the second wiring, wherein the third transistor is configured to control conduction or non-conduction between the second node and the second wiring, wherein the fourth transistor is configured to control conduction or non-conduction between the third node and the second wiring, wherein the fifth transistor is configured to control conduction or non-conduction between the fourth node and the second wiring, wherein the first node is configured to retain J-bit (J is an integer of 1 or more) first data, wherein the second node is configured to retain K-bit (K is an integer of 1 or more) second data, wherein the third node is configured to retain L-bit (L is an integer of 1 or more) third data, wherein the fourth node is configured to retain M-bit (M is an integer of 1 or more) fourth data,

50 wherein the second to fifth transistors each include an oxide semiconductor in a channel formation region, wherein the first to fourth memory circuits are electrically connected to the first wiring, wherein the first to fourth memory circuits are electrically connected to the second wiring, wherein the first memory circuit is configured to store the first data, wherein the second memory circuit is configured to store the second data, wherein the third memory circuit is configured to store the third data, and wherein the fourth memory circuit is configured to store the fourth data.

5. The memory device according to claim 4, wherein any one of the first to fourth memory circuits comprises sixth and seventh transistors, a fifth capacitor, and a fifth node, wherein the fifth node is electrically connected to a first terminal of the fifth capacitor and a gate of the sixth transistor, wherein the sixth transistor is configured to control conduction or non-conduction between the first wiring and the second wiring, wherein the seventh transistor is configured to control conduction or non-conduction between the fifth node and the second wiring, wherein the fifth node is configured to retain any of the first to fourth data, and wherein the seventh transistor includes an oxide semiconductor in a channel formation region.

6. The memory device according to claim 4, further comprising a first layer, a second layer over the first layer, a third layer over the second layer, and a fourth layer over the third layer, wherein the first transistor is provided in the first layer, wherein the second to fifth transistors are provided in the second or third layer, wherein the first to fourth capacitors are provided in the fourth layer, and wherein the first transistor includes silicon in a channel formation region.

7. An electronic device comprising:

the memory device according to claim 4; and at least one of a microphone, a speaker, a display portion, and an operation key.

8. A memory device comprising:

first to fourth transistors;

first to third capacitors;

first to third nodes; and first and second wirings, wherein the first node is electrically connected to a first terminal of the first capacitor and a gate of the first transistor, wherein the second node is electrically connected to a first terminal of the second capacitor and a gate of the second transistor, wherein the third node is electrically connected to a first terminal of the third capacitor and a gate of the third transistor, wherein the first transistor is configured to control conduction or non-conduction between the first wiring and the second wiring, wherein the second transistor is configured to control conduction or non-conduction between the first node and the second wiring, wherein the third transistor is configured to control conduction or non-conduction between the second node and the second wiring, wherein the fourth transistor is configured to control conduction or non-conduction between the third node and the second wiring, wherein the first node is configured to retain J-bit is an integer of 1 or more) data, wherein the second node is configured to retain K-bit (K is an integer of 1 or more) data, wherein the third node is configured to retain L-bit (L is an integer of 1 or more) data, and wherein the second to fourth transistors each include an oxide semiconductor in a channel formation region.

9. The memory device according to claim 8, further comprising a first layer, a second layer over the first layer, a third layer over the second layer, and a fourth layer over the third layer, wherein the first transistor is provided in the first layer, wherein the second to fourth transistors are provided in the second or third layer, wherein the first to third capacitors are provided in the fourth layer, and wherein the first transistor includes silicon in a channel formation region.

10. An electronic device comprising:
the memory device according to claim 8; and
at least one of a microphone, a speaker, a display portion, and an operation key.

11. A memory device comprising:
a memory cell;
first to third memory circuits; and
first and second wirings,
wherein the memory cell includes first to fourth transistors, first to third capacitors, and first to third nodes,
wherein the first node is electrically connected to a first terminal of the first capacitor and a gate of the first transistor,
wherein the second node is electrically connected to a first terminal of the second capacitor and a gate of the second transistor,
wherein the third node is electrically connected to a first terminal of the third capacitor and a gate of the third transistor,
wherein the first transistor is configured to control conduction or non-conduction between the first wiring and the second wiring,
wherein the second transistor is configured to control conduction or non-conduction between the first node and the second wiring,
wherein the third transistor is configured to control conduction or non-conduction between the second node and the second wiring,
wherein the fourth transistor is configured to control conduction or non-conduction between the third node and the second wiring,
wherein the first node is configured to retain J-bit (J is an integer of 1 or more) first data,
wherein the second node is configured to retain K-bit (K is an integer of 1 or more) second data,
wherein the third node is configured to retain L-bit (L is an integer of 1 or more) third data,
wherein the second to fourth transistors each include an oxide semiconductor in a channel formation region,
wherein the first to third memory circuits are electrically connected to the first wiring,
wherein the first to third memory circuits are electrically connected to the second wiring,
wherein the first memory circuit is configured to store the first data,
wherein the second memory circuit is configured to store the second data, and
wherein the third memory circuit is configured to store the third data.

12. The memory device according to claim 11,
wherein any one of the first to third memory circuits comprises fifth and sixth transistors, a fourth capacitor, and a fourth node,
wherein the fourth node is electrically connected to a first terminal of the fourth capacitor and a gate of the fifth transistor,
wherein the fifth transistor is configured to control conduction or non-conduction between the first wiring and the second wiring,
wherein the sixth transistor is configured to control conduction or non-conduction between the fourth node and the second wiring,
wherein the fourth node is configured to retain any of the first to third data, and
wherein the fifth transistor includes an oxide semiconductor in a channel formation region.

13. The memory device according to claim 11, further comprising a first layer, a second layer over the first layer, a third layer over the second layer, and a fourth layer over the third layer,
wherein the first transistor is provided in the first layer,
wherein the second to fourth transistors are provided in the second or third layer,
wherein the first to third capacitors are provided in the fourth layer, and
wherein the first transistor includes silicon in a channel formation region.

14. An electronic device comprising:
the memory device according to claim 11; and
at least one of a microphone, a speaker, a display portion, and an operation key.

15. A memory device comprising:
first to third transistors;
first and second capacitors;
first and second nodes; and
first and second wirings,
wherein the first node is electrically connected to a first terminal of the first capacitor and a gate of the first transistor,
wherein the second node is electrically connected to a first terminal of the second capacitor and a gate of the second transistor,
wherein the first transistor is configured to control conduction or non-conduction between the first wiring and the second wiring,
wherein the second transistor is configured to control conduction or non-conduction between the first node and the second wiring,
wherein the third transistor is configured to control conduction or non-conduction between the second node and the second wiring,
wherein the first node is configured to retain J-bit is an integer of 1 or more) data,
wherein the second node is configured to retain K-bit (K is an integer of 1 or more) data, and
wherein the second and third transistors each include an oxide semiconductor in a channel formation region.

16. The memory device according to claim 15, further comprising a first layer, a second layer over the first layer, a third layer over the second layer, and a fourth layer over the third layer,
   wherein the first transistor is provided in the first layer,
   wherein one of the second and third transistors is provided in the second layer,
   wherein the other of the second and third transistors is provided in the third layer,
   wherein the first and second capacitors are provided in the fourth layer, and
   wherein the first transistor includes silicon in a channel formation region.

17. An electronic device comprising:
   the memory device according to claim 15; and
   at least one of a microphone, a speaker, a display portion, and an operation key.

18. A memory device comprising:
   a memory cell;
   first and second memory circuits; and
   first and second wirings,
   wherein the memory cell includes first to third transistors, first and second capacitors, and first and second nodes,
   wherein the first node is electrically connected to a first terminal of the first capacitor and a gate of the first transistor,
   wherein the second node is electrically connected to a first terminal of the second capacitor and a gate of the second transistor,
   wherein the first transistor is configured to control conduction or non-conduction between the first wiring and the second wiring,
   wherein the second transistor is configured to control conduction or non-conduction between the first node and the second wiring,
   wherein the third transistor is configured to control conduction or non-conduction between the second node and the second wiring,
   wherein the first node is configured to retain J-bit is an integer of 1 or more) first data,
   wherein the second node is configured to retain K-bit (K is an integer of 1 or more) second data,
   wherein the second and third transistors each include an oxide semiconductor in a channel formation region,
   wherein the first and second memory circuits are electrically connected to the first wiring,
   wherein the first and second memory circuits are electrically connected to the second wiring,
   wherein the first memory circuit is configured to store the first data, and
   wherein the second memory circuit is configured to store the second data.

19. The memory device according to claim 18,
   wherein any one of the first and second memory circuits comprises fourth and fifth transistors, a third capacitor, and a third node,
   wherein the third node is electrically connected to a first terminal of the third capacitor and a gate of the fourth transistor,
   wherein the fourth transistor is configured to control conduction or non-conduction between the first wiring and the second wiring,
   wherein the fifth transistor is configured to control conduction or non-conduction between the third node and the second wiring,
   wherein the third node is configured to retain any of the first and second data, and
   wherein the fifth transistor includes an oxide semiconductor in a channel formation region.

20. The memory device according to claim 18, further comprising a first layer, a second layer over the first layer, a third layer over the second layer, and a fourth layer over the third layer,
   wherein the first transistor is provided in the first layer,
   wherein one of the second and third transistors is provided in the second layer,
   wherein the other of the second and third transistors is provided in the third layer,
   wherein the first and second capacitors are provided in the fourth layer, and
   wherein the first transistor includes silicon in a channel formation region.

21. An electronic device comprising:
   the memory device according to claim 18; and
   at least one of a microphone, a speaker, a display portion, and an operation key.

* * * * *

UNITED STATES PATENT AND TRADEMARK OFFICE
CERTIFICATE OF CORRECTION

PATENT NO.       : 9,489,988 B2
APPLICATION NO.  : 15/041435
DATED            : November 8, 2016
INVENTOR(S)      : Yamazaki et al.

It is certified that error appears in the above-identified patent and that said Letters Patent is hereby corrected as shown below:

In the Specification

Column 2, Line 56, after "J-bit", insert --(J--;

Column 3, Line 41, after "J-bit", insert --(J--;

Column 3, Line 67, after "J-bit", insert --(J--;

Column 4, Line 45, after "J-bit", insert --(J--;

Column 4, Line 65, after "J-bit", insert --(J--;

Column 44, Line 42, replace "In:GaZn" with --In:Ga:Zn--;

In the Claims

Column 51, Line 7, Claim 8, after "J-bit", insert --(J--;

Column 52, Line 62, Claim 15, after "J-bit", insert --(J--; and

Column 53, Line 39, Claim 18, after "J-bit", insert --(J--.

Signed and Sealed this
Eighteenth Day of April, 2017

Michelle K. Lee
*Director of the United States Patent and Trademark Office*